United States Patent
Onishi et al.

(10) Patent No.: US 8,148,876 B2
(45) Date of Patent: Apr. 3, 2012

(54) PIEZOELECTRIC ACTUATOR AND ELECTRONIC APPARATUS

(75) Inventors: Yasuharu Onishi, Tokyo (JP); Yasuhiro Sasaki, Tokyo (JP); Masatake Takahashi, Tokyo (JP); Ukyo Mori, Tokyo (JP); Yukio Murata, Tokyo (JP); Nozomi Toki, Saitama (JP); Yukio Yokoyama, Saitama (JP)

(73) Assignee: NEC Corporation, Tokyo (JP)

( * ) Notice: Subject to any disclaimer, the term of this patent is extended or adjusted under 35 U.S.C. 154(b) by 116 days.

(21) Appl. No.: 12/522,850

(22) PCT Filed: Jan. 9, 2008

(86) PCT No.: PCT/JP2008/050129
§ 371 (c)(1), (2), (4) Date: Jul. 10, 2009

(87) PCT Pub. No.: WO2008/084806
PCT Pub. Date: Jul. 17, 2008

(65) Prior Publication Data
US 2010/0038998 A1    Feb. 18, 2010

(30) Foreign Application Priority Data
Jan. 12, 2007  (JP) ................. 2007-004469

(51) Int. Cl.
*H01L 41/09* (2006.01)
(52) U.S. Cl. ........................ 310/324; 310/328
(58) Field of Classification Search .................. 310/324, 310/328
See application file for complete search history.

(56) References Cited

U.S. PATENT DOCUMENTS

| | | | | |
|---|---|---|---|---|
| 4,439,640 A * | 3/1984 | Takaya | ............................ | 381/190 |
| 4,626,729 A * | 12/1986 | Lewiner et al. | ................ | 310/324 |
| 5,105,117 A * | 4/1992 | Yamaguchi | ............... | 310/323.16 |
| 5,670,932 A * | 9/1997 | Kizima | ........................ | 340/384.6 |
| 6,747,395 B1 * | 6/2004 | Satoh et al. | .................... | 310/324 |
| 7,265,481 B2 * | 9/2007 | Chang et al. | ................... | 310/330 |
| 7,626,319 B2 * | 12/2009 | Heim | ............................ | 310/311 |
| 2003/0048914 A1 * | 3/2003 | Yi et al. | ......................... | 381/190 |
| 2003/0141783 A1 * | 7/2003 | Klee et al. | ...................... | 310/324 |
| 2005/0168108 A1 * | 8/2005 | Face | ............................. | 310/330 |

FOREIGN PATENT DOCUMENTS

| | | |
|---|---|---|
| JP | 1982079799 A | 5/1982 |
| JP | 1982081799 A | 5/1982 |
| JP | 1982083998 A | 5/1982 |
| JP | 1986159899 A | 7/1986 |

(Continued)

OTHER PUBLICATIONS

International Search Report for PCT/JP2008/050129 mailed Mar. 11, 2008.

*Primary Examiner* — Thomas Dougherty

(57) ABSTRACT

Piezoelectric actuator (51) includes a piezoelectric element (11) that performs expansion/contraction movement in accordance with the state of an electrical field, a base (21) with the piezoelectric element (11) adhered to one surface thereof, and a support member (46) for supporting the piezoelectric element (11) and the base (21), the piezoelectric element (11) and base (21) vibrating up and down in accordance with the expansion/contraction movement of the piezoelectric element (11). The base (21) is connected to the support member (46) by way of a vibration film (31) having less rigidity than the base (21). In addition, the piezoelectric element (11) and support member (46) have different outline shapes.

7 Claims, 25 Drawing Sheets

FOREIGN PATENT DOCUMENTS

| | | | |
|---|---|---|---|
| JP | 1986168971 A | | 7/1986 |
| JP | 1991075698 A | | 7/1991 |
| JP | 1997271096 A | | 10/1997 |
| JP | 2000140759 A | | 5/2000 |
| JP | 2000-196404 | * | 7/2000 |
| JP | 2000217195 A | | 8/2000 |
| JP | 2001017917 A | | 1/2001 |
| JP | 2001339791 A | | 12/2001 |
| JP | 2002152888 A | | 5/2002 |
| JP | 2007-037006 | * | 8/2007 |
| WO | 2007026736 A | | 3/2007 |
| WO | 2007083497 A | | 7/2007 |

* cited by examiner

Fig.10B
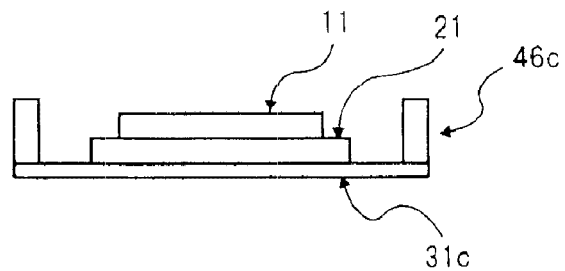
Fig.11A
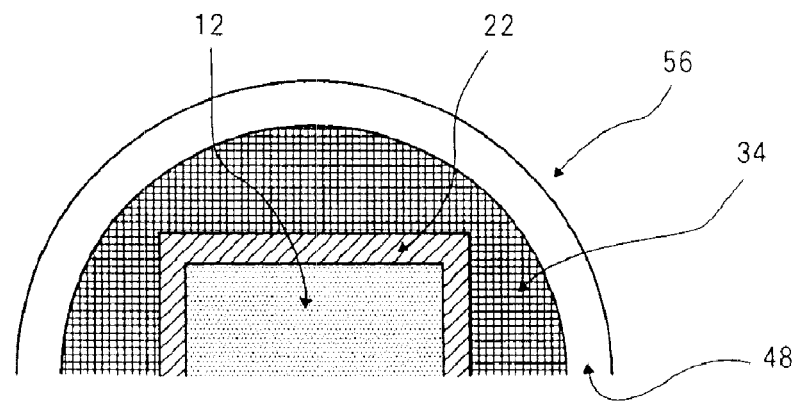
Fig.11B
Fig.12A
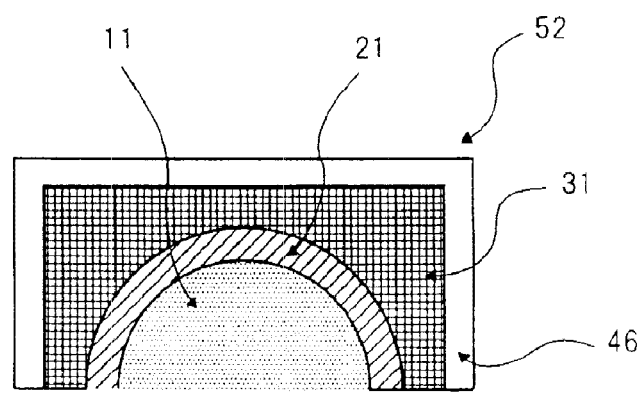

PIEZOELECTRIC ACTUATOR AND ELECTRONIC APPARATUS

This application is the National Phase of PCT/JP2008/050129, filed Jan. 9, 2008, which claims priority to Japanese Patent Application No. 2007-004469, filed on Jan. 12, 2007.

TECHNICAL FIELD

The present invention relates to a piezoelectric actuator that uses a piezoelectric element to generate vibration and an electronic apparatus that uses this piezoelectric actuator.

BACKGROUND ART

Conventionally, electromagnetic actuators have been used as the drive source of acoustic elements such as speakers due to their ease of handling. An electromagnetic actuator is a component composed of a permanent magnet and a voice coil and that generates vibration due to the action of a magnetic circuit of a stator that uses the magnet. An electromagnetic speaker generates sound by means of vibration by a semi-rigid diaphragm such as organic film that is secured to the vibration part of the electromagnetic actuator. In recent years, the demand for compact and power-conserving electromagnetic actuators has increased with the increase in demand for portable telephones and notebook personal computers. In this regard, electromagnetic actuators are not only subject to problems regarding power conservation due to the need for the flow of a high current to the voice coil during operation, but are also not suited to more compact or slimmer construction due to their configuration. In addition, electromagnetic actuators require the application of an electromagnetic shield when applied to an electronic apparatus to prevent the adverse effects of magnetic flux leakage from the voice coil and, due to this factor as well, are not suited for use in a compact electronic apparatus such as a portable telephone. Still further, miniaturization brings about a reduction of the thickness of the wires of the voice coil, and the resulting increase of the resistance in the wire material raises the potential of burnout for the voice coil.

In view of the above-described problems, piezoelectric actuators have been developed as a thin vibration part to replace electromagnetic actuators, that take as a drive source a piezoelectric element such as a piezoelectric ceramic, and that have the characteristics of smaller size, light weight, power-saving capability, and the absence of magnetic flux leakage. A piezoelectric actuator is a component for generating mechanical vibration from the movement of a piezoelectric element, and has a configuration in which, for example, a piezoelectric ceramic element (also referred to as simply "piezoelectric element") and a base are joined.

The basic configuration of a piezoelectric actuator is next described with reference to FIGS. 1 and 2. FIG. 1 is a perspective view showing the configuration of a piezoelectric actuator that relates to the present invention, and FIG. 2 is a sectional view giving a schematic representation of the state of the vibration of a piezoelectric actuator.

As shown in FIG. 1, piezoelectric actuator 550 includes: piezoelectric element 510 composed of a piezoelectric ceramic; base 524 to which piezoelectric element 510 is secured; and support member 527 having a frame shape for supporting the outer circumference of base 524. When an ac voltage is applied to piezoelectric element 510, piezoelectric element 510 moves by expanding and contracting. As shown in FIG. 2, base 524 changes to a convex mode (shown by the solid line) and to a concave mode (shown by the broken line) in accordance with the expanding and contracting movement. In this way, base 524 vibrates in the upward and downward directions of the figure with the base center as a diaphragm and junction part 524*a* as a fixed edge.

Although advantageous for helping to reduce the size of device, a piezoelectric actuator offers poorer acoustic performance as an acoustic element than an electromagnetic actuator. This degraded performance occurs because the high rigidity of the piezoelectric element itself results in a high mechanical Q value, whereby a vibration amplitude higher than an electromagnetic actuator can be obtained in the vicinity of the resonant frequency, but the vibration amplitude is smaller than an electromagnetic actuator in the band outside the resonant frequency. If the vibration amplitude of an actuator is low, the sound pressure is also low, which means that sufficient sound pressure cannot be obtained over the broad frequency band that is required for, for example, the reproduction of music. In response to this problem, JP-A S61-168971 and JP-A-2000-140759 disclose configurations in which the outer circumference of the base is supported by beams that are comparatively easy to deform to increase the vibration amplitude of the actuator.

In addition, JP-A-2001-17917 discloses a technique for obtaining large vibration amplitude in which, for a similar purpose, a leaf spring is formed in which slits are introduced along the circumference of the periphery of the base. Still further, JP-A-2001-339791 discloses a technique in which the base circumference and support member are joined by way of a curved support to broaden the frequency characteristic.

DISCLOSURE OF THE INVENTION

However, the piezoelectric actuators disclosed in JP-A-S61-168971, JP-A-2000-140759, and JP-A-2001-17917 are configurations that are principally used as vibrators that are mounted in, for example, portable telephones, and their use as speakers for reproducing music or voice is not at all taken into consideration. In other words, when used as a vibrator, the amplitude may be expanded by limiting it to a specific frequency, but in the case of use as a speaker, the frequency characteristics must be taken into consideration. Essentially, a configuration is necessary by which sound pressure of at least a predetermined level is obtained within a range of frequencies, for example, the frequency band of 200 Hz-10 kHz, which is necessary in the reproduction of music. JP-A-2001-339791 is of a configuration in which a base that constrains a piezoelectric ceramic is jointed with a curved support member and is directed to generating displacement in both directions of the radial direction and the direction of thickness of the piezoelectric ceramic. This curved support member enables a reduction of the Q value and the stress distribution of characteristic sites and thus enables a reduction of distortion and a decrease of the fundamental resonant frequency, but because vibration is generated in both the direction of the outer diameter and the direction of thickness, the vibration energy is distributed and the amount of vibration in the direction of acoustic radiation is attenuated. As a result, a configuration must be adopted that can obtain a predetermined sound pressure level.

When considering the frequency characteristics that are required as an acoustic element, not only increasing the amplitude in limited frequencies but also the manner in which the amplitude amount is increased across the board within a desired frequency range is of utmost importance. A piezoelectric actuator has high rigidity and a high mechanical Q value and therefore features a high amplitude amount in the vicinity of the resonant frequency, but because the amplitude amount is attenuated in the band outside the resonant frequency, a piezoelectric actuator suffers from the drawback of obtaining sufficient sound pressure levels only in the vicinity of the resonant frequency (particularly the fundamental resonant frequency). As a result, methods that can be offered for realizing satisfactory acoustic characteristics include increasing the sound pressure levels for 3-7 kHz (the frequency band to which the ear has high sensitivity) to raise the perceived sound volume or increasing sound pressure in a low-frequency band of 1 kHz or less to raise the perceived weight of sound, and the realizing these aims calls for: 1. Reducing the fundamental resonant frequency of the piezoelectric actuator itself; 2. Increasing the amplitude amount in the high-frequency band that succeeds the fundamental resonant frequency; and 3. Adjusting the vibration figure of a higher-order vibration mode to improve the acoustic radiation efficiency within the radiation plane.

The present invention was achieved in view of the above-described problems and has as an object the provision of a superior auditory piezoelectric actuator and electronic apparatus capable of obtaining large vibration amplitude, and further, reproducing sound over a broad frequency band.

To solve the above-described problems, the piezoelectric actuator of the present invention includes: a piezoelectric element that performs an expansion/contraction movement in accordance with the state of an electrical field, a base having the piezoelectric element that adheres to at least one surface thereof, and a support member for supporting the piezoelectric element and base; and in a piezoelectric actuator in which the piezoelectric element and base vibrate in the direction of thickness of the piezoelectric element in accordance with the expansion/contraction movement of the piezoelectric element, the base is connected to the support member by way of a vibration film having less rigidity than the base, and moreover, includes a support member having an outline shape that differs from that of the piezoelectric element.

In the piezoelectric actuator of the present invention that is configured as described above, the base is connected to the support member by way of a vibration film having less rigidity than the base and the connection portion (the vibration film portion) between the base and the support member is relatively easy to deform compared to the base portion, whereby an improvement of the vibration amplitude is achieved. This ease of deformation of the connection portion (the vibration film portion) means that the vibration is great in this portion, whereby the mode of vibration can be caused to more closely approach the piston type (the vibration mode similar to that of an electromagnetic actuator) than the configuration relating to the present invention. Still further, shocks that occur from falls are absorbed by the vibration film interposed between the base and the support member, meaning that the component exhibits superior stability in falls and is therefore applicable to, for example, portable telephones.

In a piezoelectric actuator that is configured in this way, the difference in the outline shapes of the support member and piezoelectric element result in improved sound pressure levels (in particular, in the high-frequency band) and improved resistance to falls. For example, combining a round piezoelectric element with a square support member results in a vibration figure of a higher-order vibration mode that is more asymmetric than in a conventional piezoelectric actuator in which the piezoelectric element and support member are both round, whereby dips, distortion noise, and attenuation of sound pressure that arise from divided vibration can be limited and acoustic characteristics improved. In addition, the square shape of the support member results in an increase of the proportion of the vibration film area (a semi-rigid material) with respect to piezoelectricity when compared with a round support member (under the condition that the maximum outer dimensions within the outline are identical) and thus improves stability in falls. Still further, compared to a round support member, a rectangular support member that includes a square shape facilitates cutting processes and mounting to an apparatus or casing and thus improves fabrication stability.

In addition, the piezoelectric actuator of the present invention is provided with a vibration film as described hereinabove, and causing vibration of this vibration film can generate sound. In other words, the piezoelectric actuator of the present invention is a component that can function as an acoustic element as is without using, for example, an additional vibration film.

According to the piezoelectric actuator of the present invention, a base to which a piezoelectric element is adhered and a support member are joined by way of a vibration film having lower rigidity than the base, and moreover, the outline shapes of the piezoelectric element and the support member are different, whereby vibration of greater amplitude can be obtained, and moreover, sounds can be reproduced over a broader frequency band when the piezoelectric actuator is used as an acoustic element.

BRIEF DESCRIPTION OF THE DRAWINGS

FIG. 11A is a partial top view showing the configuration of the piezoelectric actuator of the third embodiment;

FIG. 11B is a side sectional view showing the configuration of the piezoelectric actuator of the third embodiment;

FIG. 12A is a partial top view showing the configuration of the piezoelectric actuator of the fourth embodiment;

FIG. 30A is a top view showing the configuration of the piezoelectric actuator of Working Example 2a;

FIG. 30B is a vertical sectional view showing the configuration of the piezoelectric actuator of Working Example 2a;

BEST MODE FOR CARRYING OUT THE INVENTION

Embodiments of the present invention are next explained with reference to the accompanying figures. In the configuration of each embodiment that is described hereinbelow, identical constituent parts are indicated by the same reference numbers and redundant explanation is omitted.

First Embodiment

Figure 3:
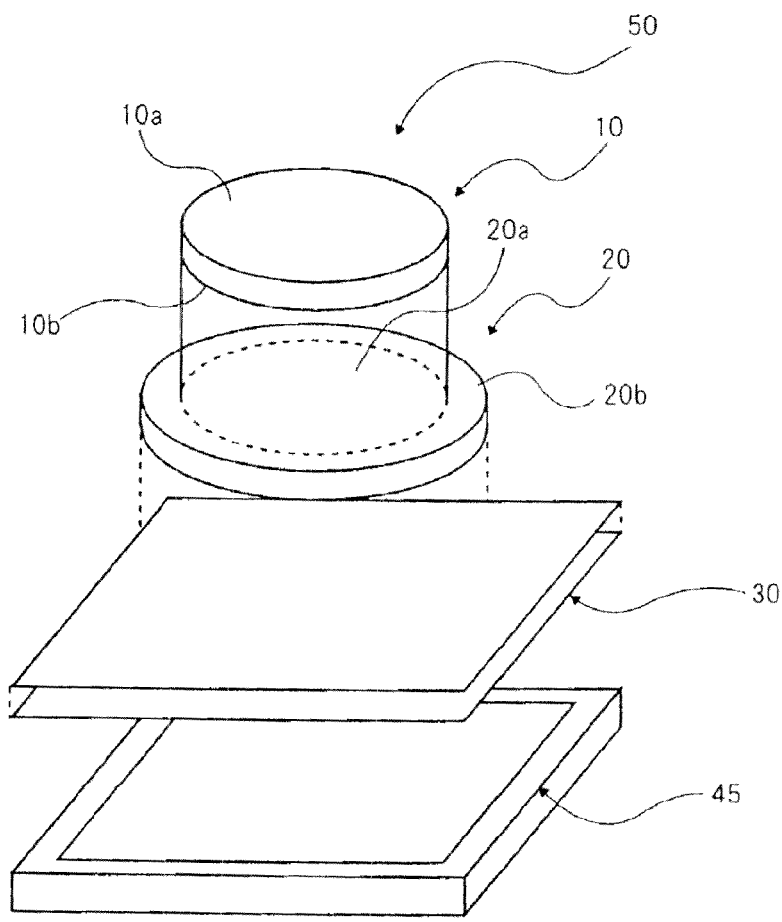
FIG. 3 is an exploded perspective view showing the configuration of the piezoelectric actuator of the first embodiment.
Figure 4:
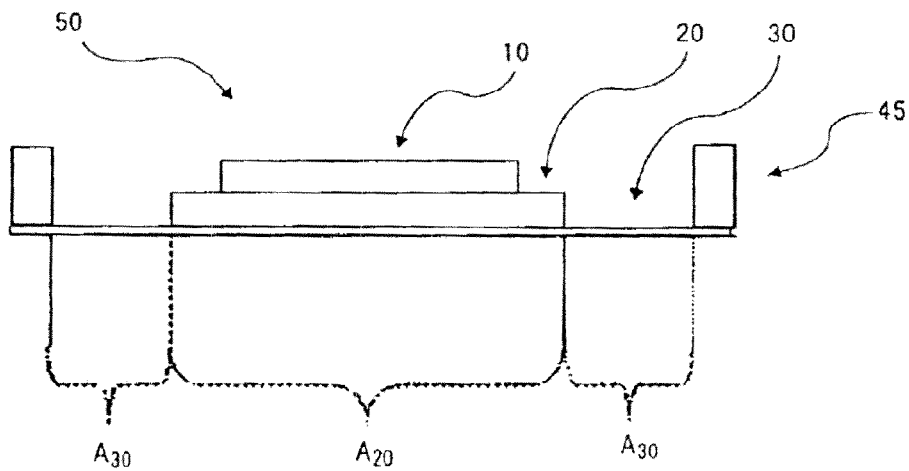
FIG. 4 is a vertical sectional view of the piezoelectric actuator of FIG. 3.

FIG. 3 is an exploded perspective view showing the configuration of the piezoelectric actuator of the present embodiment, and FIG. 4 is a vertical sectional view of the piezoelectric actuator of FIG. 3.

As shown in FIGS. 3 and 4, piezoelectric actuator 50 of the present embodiment has a configuration that includes round piezoelectric element 10 that is the drive source of vibration, base 20 for supporting piezoelectric element 10, and vibration film 30 for supporting base 20, these parts being stacked in order. Piezoelectric element 10 and base 20 are both round, vibration film 30 is square, and these three parts are arranged to have the same center (in concentric form). In addition, the outer circumference of vibration film 30 is connected to support member 45 that is formed in a square frame shape and is thus supported.

To state in greater detail, piezoelectric element 10 is composed of a piezoelectric plate (piezoelectric ceramic) having two parallel and opposite main surfaces 10a and 10b, upper electrode layer and lower electrode layer (neither shown in the figures) being formed on main surfaces 10a and 10b, respectively, of the piezoelectric plate. Although no particular limits apply to the polarization direction, in the present embodiment the polarization direction is in the upward direction of the figure (the direction of thickness of piezoelectric element). When an ac voltage is applied to the upper electrode layer and lower electrode layer and an electrical field alternately applied, piezoelectric element 10 that is configured in this way performs an expansion/contraction movement (diameter-enlarging movement) in the radial direction such that the two main surfaces 10a and 10b simultaneously expand or contract. In other words, piezoelectric element 10 performs movement in which a first displacement mode in which the main surfaces expand and a second displacement mode in which the main surfaces contract are repeated.

Base 20 has the function of converting the above-described expansion/contraction movement of piezoelectric element 10 to vibration in the upward and downward directions shown in the figure. Base 20 is composed of an elastic body (a material having elasticity), materials that can be used as base 20 include a wide variety of materials of lower rigidity than the ceramic material that makes up the piezoelectric element, such as metal materials (such as aluminum alloy, phosphor bronze, titanium, or titanium alloy, iron-nickel alloy), and resin materials (such as epoxy, acryl, polyimide, or polycarbonate and polyethyleneterephthalate).

Main surface 10b (lower electrode layer) of piezoelectric element 10 is secured to the upper surface of base 20, whereby base 20 restrains piezoelectric element 10. In FIG. 3, the area of base 20 to which piezoelectric element 10 adheres is indicated as bound portion 20a, and the remaining area (the area surrounding bound portion 20a) is indicated as unbound portion 20b.

Vibration film 30 is a film member for increasing the vibration amplitude of the piezoelectric actuator and has lower rigidity than base 20. In addition, vibration film 30 is composed of a material having a lower modulus of elasticity than base 20. Regarding the combination of materials of base 20 and vibration film 30, base 20 may be a metal material and vibration film 30 may be a resin material (for example, urethane, PET, or polyethylene). Alternatively, base 20 and vibration film 30 may be the same material and vibration film 30 is made to have a relatively lower rigidity by making the film thickness of vibration film 30 relatively thinner. In addition to the materials described above, vibration film 30 may also be paper or polyethyleneterephthalate.

The thickness of vibration film 30 may be, for example, at least 5 μm but not greater than 500 μm in the case of a resin material. In particular, when vibration film 30 is a flat sheet material, the thickness may be preferably at least 5 μm but not greater than 180 μm.

However, when the piezoelectric actuator is used as an acoustic element, a configuration is often adopted in which, for example, an organic film is adhered to the vibration portion of the piezoelectric actuator (for example, base 20) to produce sound. In contrast, in the present embodiment, vibration film 30 that is provided to increase amplitude also functions, as is, as a vibration film. In other words, vibration film 30 functions not only as a vibration film in the acoustic element that relates to the present invention, but further has the additional function of magnifying the vibration amplitude of the actuator. A configuration related to the present invention that attempts to magnify amplitude by providing beams (for example, JP-A-S61-168971) differs from the configuration according to the present invention on this point, the configuration of the present invention obtaining greater sound pressure from the provision of the vibration film. Of course, in configuring an acoustic element, a common vibration film may be adhered to a plurality of piezoelectric actuators having mutually different resonant frequencies and taken as a single acoustic element. In this way, an acoustic element is realized that can mutually complement bands in which the sound pressure level was low and thus obtain high sound pressure over a broader range of frequencies.

Support member 45 is, for example, a support member that constitutes the case of the piezoelectric actuator and may be a resin material or a metal material, no particular limitations applying to the material. In addition, an adhesive such as an epoxy adhesive can be used in bonding piezoelectric element 10 and base 20 and bonding base 20 and vibration film 30. No particular limitations apply to the thickness of the adhesive layer, but a thickness no greater than 20 μm is preferable because excessive thickness increases the vibration energy that is absorbed by the adhesive layer and raises the possibility that sufficient vibration amplitude will not be obtained.

As shown in FIG. 4, piezoelectric actuator 50 has a configuration in which piezoelectric element 10 is secured to the upper surface of base 20 and base 20 is supported by support member 45 by way of vibration film 30. This point differs from the configuration relating to the present invention (see FIG. 1) in which the base is directly supported by the support member. According to the configuration of the present embodiment, a configuration is adopted in which base 20 is thus supported by way of vibration film 30, whereby greater vibration amplitude than the configuration relating to the present invention can be obtained, and moreover, the vibration mode approaches that of the piston type (to be explained later with reference to FIG. 8B). This point will be explained hereinbelow with reference to FIGS. 5A and 5B together with the mechanism for generating vibration of a piezoelectric actuator.

Figure 5A:
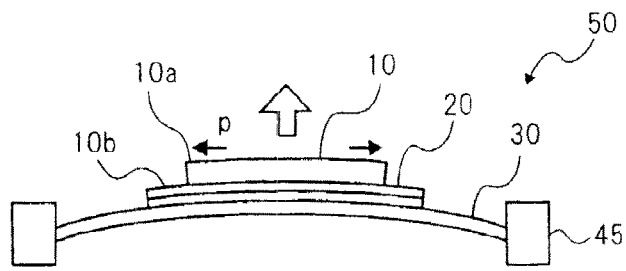
FIG. 5A is a view for explaining the principles of the operation of a piezoelectric actuator.

First, when a predetermined voltage (electrical field) is applied to the piezoelectric element from the neutral state in which voltage is not being applied to piezoelectric element 10 (see FIG. 4), piezoelectric element 10 is deformed in the direction of expansion of the area of piezoelectric element 10 as shown by arrow "p" of FIG. 5A. Here, the lower surface (main surface 10b) of piezoelectric element 10 is restrained by base 20, and this restraining effect causes a difference in the amount of displacement between the upper surface and the lower surface of piezoelectric element 10, thereby producing the convex displacement mode shown in the figure. In this displacement mode, piezoelectric element 10, base 20, and moreover, vibration film 30 that supports base 20 assume a curved state that is convex in the upward direction of the figure.

Figure 5B:
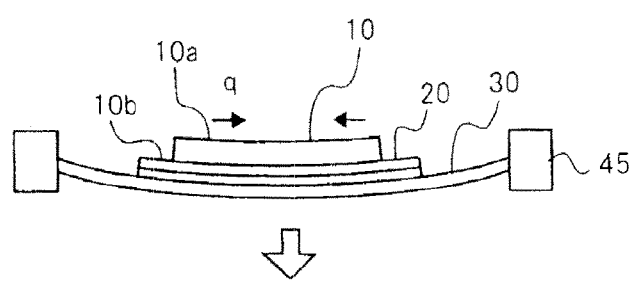
FIG. 5B is a view for explaining the principles of the operation of a piezoelectric actuator.

Next, when an electrical field that is the reverse of that described above is applied to the piezoelectric element, piezoelectric element 10 is then deformed in the direction of reduction of its area as shown by arrow "q" in FIG. 5B. The restraining effect of base 20 produces a difference in the amount of deformation between the upper surface and lower surface of piezoelectric element 10, and thus produces the concave displacement mode shown in the figure. In this displacement mode, as the reverse of the above, the piezoelectric element, the base, and the vibration film assume a curved state that is convex in the downward direction of the figure.

In piezoelectric actuator 50 of the present embodiment, piezoelectric element 10, restraining member 20, and vibration film 30 vibrate in an upward and downward direction by the repeated alternation of the convex displacement mode and concave displacement mode described hereinabove. When the actuator of the present embodiment and the actuator relating to the present invention (see FIG. 1) are compared, the two actuators share the point that the movement of piezoelectric element 10 is conveyed to base 20 and vibration is excited in the upward and downward directions. However, when viewed with regard to configuration, base 20 (and piezoelectric element 10) are supported by way of vibration film 30 in the actuator of the present embodiment, and the two actuators differ on this point, the following actions and effects being obtained by means of this difference. Specifically, vibration film 30 is composed of a material having relatively low rigidity compared to base 20 and is therefore easier to deform. Thus, greater vibration amplitude is obtained as a result of the present embodiment compared to a configuration relating to the present invention in which the circumference of base 20 is directly supported by support member 45. In addition, in the configuration of the present embodiment, vibration film 30 (see FIG. 4) is provided to extend in a horizontal direction (in other words, parallel to the main surfaces of piezoelectric element 10). Accordingly, the addition of vibration film 30 is unlikely to cause the problem of enlarging the actuator as a whole.

In the present embodiment, the outline shapes of the piezoelectric element and support member are different, a round piezoelectric element 10 and a square support member 45 being used. The energy efficiency when round piezoelectric element 10 performs a diameter-expanding movement is higher than for a rectangular element, and this configuration therefore obtains a greater drive force when the same voltage is applied. This large drive force is conveyed to the vibration film to increase the amount of vibration of the piezoelectric actuator. In addition, the configuration of a round piezoelectric element and a square support member results in asymmetry in the vibration figure at a higher-order vibration mode to enable a suppression of sound pressure peak attenuation or dips generated during divided vibration and an improvement of acoustic characteristics (to be explained in greater detail hereinbelow). Further, the use of a square support member according to the present embodiment enables higher sound pressure levels and greater stability when a fall occurs to be obtained compared to a case of using a round support member. In other words, when a piezoelectric actuator is incorporated in an electronic apparatus, a limiting condition is usually the maximum outer diameter within the outline and not the area or outline shape, and comparison of a circle and a square having the same maximum outer dimensions in accordance with this limitation reveals that the square, which can effectively utilize the corner portions, is superior in area and capable of obtaining higher sound pressure levels. In addition, a square shape also results in an increase in the area of the vibration film and therefore improves the stability against falls or shocks.

Figure 6:
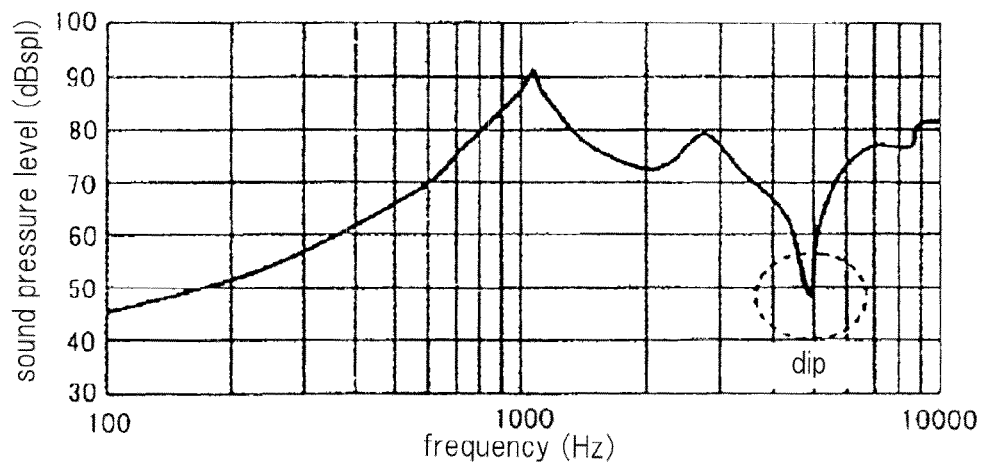
FIG. 6 shows the acoustic characteristics of a conventional piezoelectric actuator.
Figure 7:
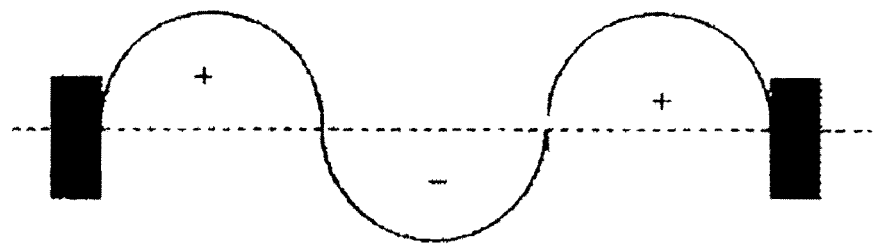
FIG. 7 shows the vibration state of divided vibration.

Explanation next regards the relation between divided vibration and acoustic characteristics. Divided vibration is produced by the mutual overlap of higher-order vibration modes that are generated after the fundamental resonant frequency, and that, because a multiplicity of vibration modes that perform the opposite upward or downward movement are mixed within the radiation surface, gives rise to dips or attenuation of sound pressure peaks. In other words, in-phase and anti-phase vibration modes undergo mutual phase inversion within the radiation surface at the time of acoustic radiation, cancel out radiated sound, and thus are the mechanism for generating dips or attenuation of sound (FIG. 6 shows the acoustic characteristics of a piezoelectric actuator). As a result, a piezoelectric actuator that combines a piezoelectric element and support member that are both round results in a vibration figure that is symmetrical with respect to any direction within the surface when the center is taken as the origin, whereby the in-phase and anti-phase figure overlap regularly during divided vibration and the piezoelectric actuator is therefore prone to the influence of this canceling (FIG. 7 shows the vibration figure of divided vibration). However, in the present embodiment, combining a round piezoelectric element with a square base results in an asymmetrical vibration figure and thus enables a suppression of the canceling of radiated sound during divided vibration, and thus, an improvement of the acoustic characteristics. In addition, because sound is radiated by this divided vibration in the high-frequency band that succeeds the fundamental resonant frequency, improvement of the sound pressure levels in the high-frequency band has required improvement of the acoustic radiation efficiency by improving the vibration figure of divided vibration.

Explanation next regards the relation of the vibration mode of a piezoelectric actuator and the frequency characteristics. The use of a piezoelectric actuator as an acoustic element is disclosed in the previously mentioned JP-A-S61-168971, JP-A-2000-140759, and JP-A-2001-17917. However, the acoustic element in these documents refers to a buzzer or a vibrator. If merely used as a vibrator, an improvement can be achieved by simply improving the sound pressure, but when used as a speaker, the vibration modes of the piezoelectric actuator must be considered by also considering the frequency characteristics.

Figure 1:
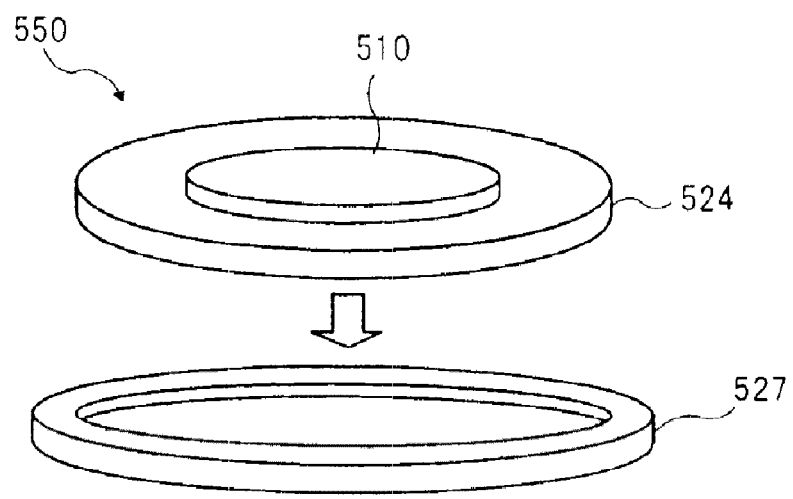
FIG. 1 is a perspective view showing the configuration of a piezoelectric actuator that relates to the present invention in which the outer circumference of a base is directly connected to a support member.
Figure 2:
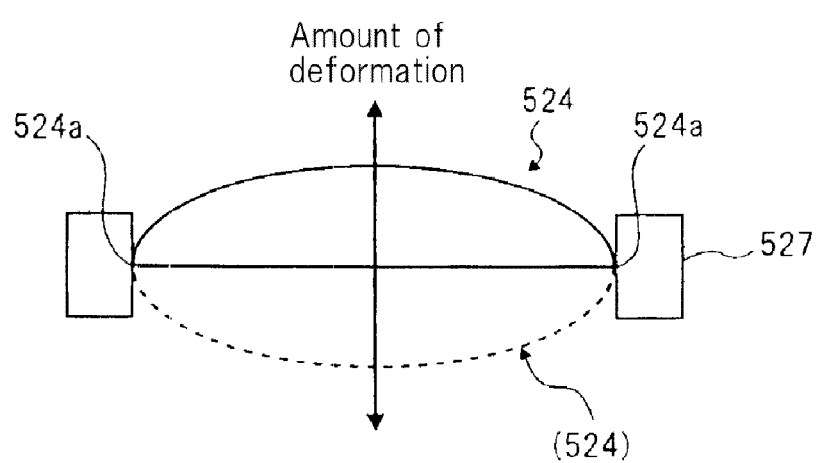
FIG. 2 is a vertical sectional view giving a schematic representation of the vibration mode of the piezoelectric actuator of FIG. 1.
Figure 8A:
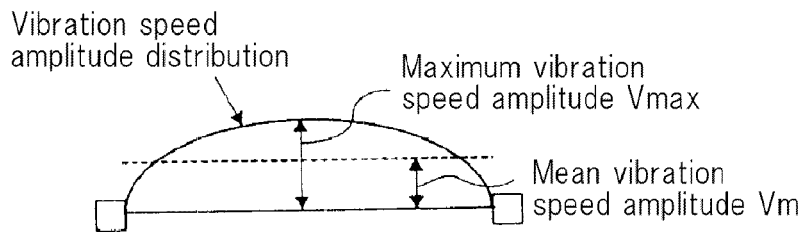
FIG. 8A is a schematic view for explaining the mode of vibration of a flexural-motion piezoelectric actuator.
Figure 8B:
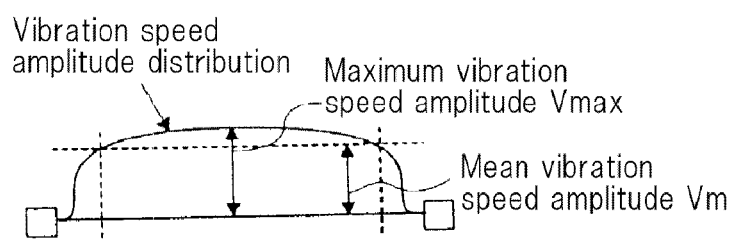
FIG. 8B is a schematic view for explaining the mode of vibration of a piston-type piezoelectric actuator.

FIG. 8A shows the vibration mode of a piezoelectric actuator that is related to the present invention such as shown in FIGS. 1 and 2, and FIG. 8B shows the vibration mode of an electromagnetic actuator (for example, see FIGS. 31A and 31B to be explained hereinbelow). As shown in FIG. 6A, the piezoelectric actuator that relates to the present invention has a flexural-motion vibration mode in which the center amplitude is a maximum. In contrast, in an electromagnetic actuator, the central area shown by reference number A20 maintains a substantially flat state, this central area A20 having a piston-type vibration mode of reciprocating movement in the upward and downward directions of the figure. It is known that the vibration mode should preferably be made as close to the piston form as possible in order to improve the frequency characteristics as an acoustic element.

Figure 9:
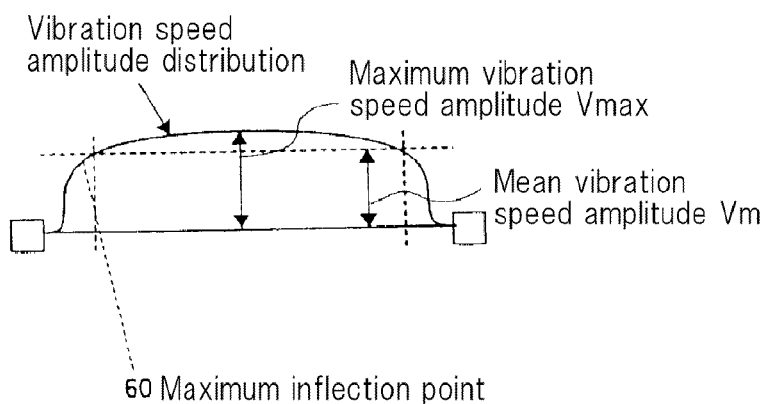
FIG. 9 is a schematic view for explaining the vibration mode of a piezoelectric actuator and shows the piston-type vibration mode.

Explanation next regards the characteristics of flexural movement and piston movement. The vibration mode of flexural movement that is generated in the piezoelectric actuator that relates to the present invention has a peak shape in which the central portion of the piezoelectric ceramic is the maximum displacement curvature point, and although high amplitude is obtained in the central portion, the closer it is to the fixed edge, the greater is the attenuation of the displacement relatively. In contrast, as shown in FIG. 9, the vibration mode of piston movement is a pedestal shape having maximum displacement curvature point (60) close to the fixed edges and has characteristics in which vibration rises markedly close to the fixed edges. When the amount of vibration displacement in these two vibration modes is compared, the maximum vibration amount within the acoustic radiation plane is greater for flexural movement than for the piston movement, but the mean vibration amount within acoustic radiation plane is greater for the piston movement in which the amount of displacement at the fixed edges is greater than for the flexural movement. In addition, because sound pressure is normally defined by the amount of volume discharged to the radiation plane, the method having the greater mean vibration amount has higher sound pressure, and the piston-type vibration mode is therefore preferably promoted for improving the sound pressure level. Piston-type vibration and flexural-motion vibration can be defined by the ratio of the mean displacement amount and the maximum displacement amount, and the piston-type figure is promoted to the degree that the formula represented by (mean vibration amount)/(maximum vibration amount) approaches "1" (details to be explained in Working Example evaluation 5).

As shown in FIG. 4, according to the configuration of the present embodiment, the area in which base 20 is adhered is the area that corresponds to A20, and the area outside this area is connection area A30 that is to outward appearance lower in rigidity than area A20 (i.e., easier to deform). As a result, this connection area A30 exhibits relatively large deformation, and as a whole, this vibration mode can be caused to approach the piston type. In addition, area A30, which is peripheral to the area in which the base is adhered, is made up by a member having low rigidity, which means that the resonant frequency of the vibration plate (which refers to the laminated body of the base and vibration film) is lower than the configuration that relates to the present invention in which base 20 is directly connected to the support member. The lowering of the resonant frequency leads to an improvement of the frequency characteristics of the acoustic element as explained hereinbelow.

In an acoustic element, a sufficiently large sound pressure is normally difficult to produce at frequencies equal to or lower than resonant frequency F0, and configurations are therefore often adopted that use only a frequency band that succeeds the resonant frequency F0 as sound that can be reproduced. More specifically, when the resonant frequency F0 of a piezoelectric actuator is in a high frequency band (for example, 2 kHz), the acoustic element can only produce sounds of a band equal to or greater than 2 kHz, when put in extreme terms.

On the other hand, the frequency band called for when music is reproduced on, for example, a portable telephone is preferably 1 k-10 kHz. As a result, a piezoelectric actuator having a resonant frequency F0 of 1 kHz or less is well-suited for a portable telephone, and in particular, has extremely high utility as an actuator that is useful in miniaturization such as in the present embodiment. However, because a highly rigid ceramic is used as the piezoelectric element in piezoelectric actuators, these actuators have characteristics such that the resonant frequency of the vibration portion is high and the production of low sounds therefore problematic. A scheme of increasing the element size to decrease the apparent rigidity of the piezoelectric element and lower the resonant frequency can be considered, but as already stated, piezoelectric actuators are frequently mounted in compact electronic apparatuses such as portable telephones, and from the viewpoint of preventing devices from becoming large-scale, a configuration is preferable that facilitates the production of low sounds without altering the element size.

To summarize the points described above, in order to reproduce music over a broader frequency band in a portable telephone, setting resonant frequency F0 of the piezoelectric actuator to a lower level, suppressing sound pressure peak attenuation and dips in a predetermined frequency band, and improving sound pressure levels over a broad frequency band outside the vicinity of the fundamental resonant frequency can be considered crucial. In order to lower resonant frequency f0, decreasing the rigidity of the vibration plate is effective. In addition, making the outline shapes of the piezoelectric element and the support member different is also effective for suppressing sound pressure peak attenuation and dips and improving sound pressure levels. According to the configuration of the present embodiment, the member for connecting base 20 and support member 45 is vibration film 30 that has lower rigidity than the base, and the shape of the support member is altered, whereby the area that is occupied by the less rigid vibration film can be increased and the fundamental resonant frequency can be easily reduced compared to the configuration that relates to the present invention. Still further, making the piezoelectric element and support member different in outline shape suppresses sound pressure peak attenuation or dips that are produced during divided vibration that follows the fundamental resonant frequency and thus enables an improvement of sound pressure levels. As a result, the piezoelectric actuator of the present embodiment is capable of obtaining sufficient vibration amplitude over a broad frequency band and can realize good frequency characteristics when used as an acoustic element.

The piezoelectric actuator of the present embodiment has the following advantages in addition to the advantages described above. First, the vibration characteristics of the piezoelectric actuator can be easily adjusted by appropriately altering the material characteristics and shape of base 20, the material characteristics of vibration film 30, and the shape of the support body. In particular, the shape of the base and the thickness of the vibration film can be adjusted without changing the size of the case (the size of the support member), whereby the support member can be used as a common part, a factor that is advantageous for reducing manufacturing costs.

Conventionally, reducing the resonant frequency of a piezoelectric actuator involved reducing the thickness of the piezoelectric element, but according to the present invention, the resonant frequency can be reduced by merely adjusting the material of the vibration film and the space between the restraining member and the support member, even when using a comparatively thick piezoelectric element. Typically, fabrication of thin piezoelectric elements involved relatively high costs due to the occurrence of cracking at the time of sintering. In contrast, such thin piezoelectric elements need not be prepared according to the present invention, and fabrication costs can therefore be limited.

The piezoelectric actuator according to the present invention can be used as the sound source of an electronic apparatus (such as a portable telephone, notebook personal computer, or compact game apparatus). Conventionally, a piezoelectric actuator that uses a ceramic as the piezoelectric element has the drawback that the piezoelectric element is prone to damage in the event of falls. On the other hand, portable electronic apparatuses such as those described above are subject to frequent accidental falls during use by users, and as a result, piezoelectric actuators were until now considered unsuitable for portable apparatuses. In the piezoelectric actuator of the present invention, however, support member 45 and base 20 to which the piezoelectric element is secured are supported by way of vibration film 30 that has low rigidity, and damage to the piezoelectric element is impeded because, in the event of a fall, shock is absorbed by attenuation of vibration film 30. Accordingly, the piezoelectric actuator of the present invention can also be suitably used for a portable electronic apparatuses.

Second Embodiment

Figure 10:
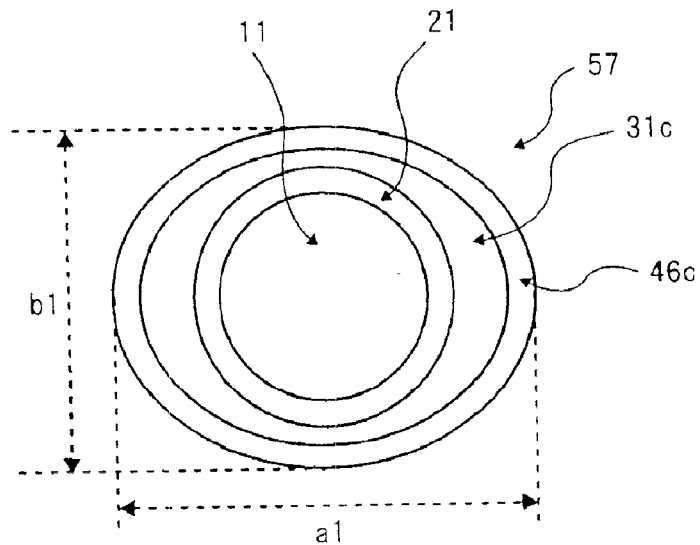
FIG. 10A is a perspective view showing the configuration of the piezoelectric actuator of the second embodiment.
FIG. 10B is a vertical sectional view showing the configuration of the piezoelectric actuator of the second embodiment.

The piezoelectric actuator of the present invention is not limited to the form shown in the above-described embodiment and may have the configuration shown in FIGS. 10A and 10B. FIG. 10A is a top view showing the configuration of the piezoelectric actuator of the second embodiment, and FIG. 10B is a vertical sectional view of the actuator. Oval-shaped support member 46c and vibration film 31c are used in piezoelectric actuator 57 of FIGS. 10A and 10B. The configuration is otherwise the same as the first embodiment. In this way, the outline shape of the support member in the present invention may be round or rectangular without any particular limitations as long as the outline shape of the piezoelectric element is different. The support member may further be a polygonal shape. In particular, when an oval support member is used, not only can sufficient vibration amplitude be obtained, but also limitations on size and shape when mounting the apparatus are relaxed by adjusting the balance of the direction of the major axis and the direction of the minor axis. In addition, this form has high utility as a compact actuator due to the ease of mounting to a gap space.

Third Embodiment

The piezoelectric actuator of the present invention is not limited to the form shown in the above-described embodiments and may be of a configuration such as shown in FIGS. 11A and 11B. FIG. 11A is a top view showing the configuration of the piezoelectric actuator of the third embodiment, and FIG. 11B is a vertical sectional view of this actuator. In piezoelectric actuator 56 of FIGS. 11A and 11B, piezoelectric element 12 formed in a square shape and circular support member 48 are used, and piezoelectric element 12, vibration film 34, and support member 48 are components for which only the outline shapes of piezoelectric element 10, vibration film 30 and support member 45 of the first embodiment are changed, and the materials and fundamental construction are similar to the first embodiment. For example, this embodiment is identical to the above-described embodiment regarding the point that an upper electrode layer and lower electrode layer are formed on the upper and lower surfaces, respectively, of a piezoelectric plate. The configuration is otherwise identical to that of the first embodiment.

In this way, no particular limitations apply to the outline shapes of the support body as long as the outline shapes of the piezoelectric element and support body are different, and the outline shape of the piezoelectric element may be round or may be rectangular. The outline shape may also be an oval or a polygon. In particular, a square piezoelectric element has high symmetry similar to a round piezoelectric element and therefore has high energy efficiency during the expansion/contraction movement (diameter-enlarging movement) and obtains a greater drive force than a rectangular or oval element. Obtaining greater drive force means higher sound pressure levels can be obtained. In addition, a rectangular piezoelectric element, which includes square, piezoelectric element facilitates the fabrication processes compared to a round piezoelectric element, whereby yield is improved when forming by cutting, a factor that is advantageous regarding fabrication costs.

Fourth Embodiment

Figure 12B:
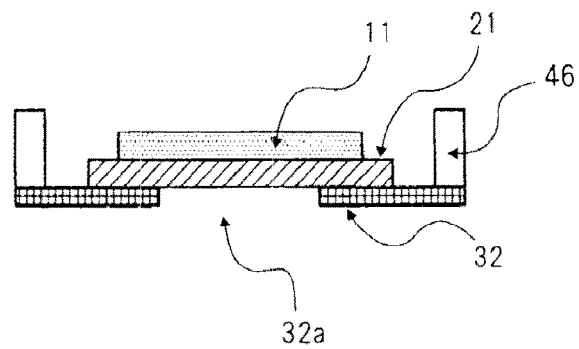
FIG. 12B is a side sectional view showing the configuration of the piezoelectric actuator of the fourth embodiment.

The piezoelectric actuator of the present invention is not limited to the form shown in the above-described embodiments and may be of the configuration shown in FIGS. 12A and 12B. FIG. 12A is an exploded perspective view showing the configuration of the piezoelectric actuator of the fourth embodiment, and FIG. 12B is a vertical sectional view of the actuator.

Piezoelectric actuator 52 of FIGS. 12A and 12B uses vibration film 32 in which aperture 32a is formed in the center. The configuration is otherwise the same as the first embodiment. Aperture 32a is round, and is formed concentric with piezoelectric element 11 and base 21. Due to the formation of aperture 32a, base 21 is supported by vibration film 32 only around the outer circumference of its rear surface (the lower surface in the figure). In other words, the area of the rear surface of base 21 corresponding to aperture 32a is in an exposed state.

Piezoelectric actuator 52 of the present embodiment that is configured as described above also performs vibration movement similar to the above-described embodiments with piezoelectric element 11 as the drive source. Because base 21 is configured to be supported only around its outer circumference in this case, base 21 is not restrained by vibration film 32 at aperture 32a and is therefore more prone to curved deformation, whereby the vibration amplitude of the actuator is increased. In addition, the apparent decrease in rigidity of this vibration plate (referring to the laminated body of the base and vibration film) means that the resonant frequency of the actuator is decreased, and this decrease is preferable because the frequency characteristics of the acoustic element are improved.

In view of the action and effect realized by above-described aperture 32a, base 21 can be said to undergo flexural deformation more easily as the area of aperture 32a increases, whereby the resonant frequency of the actuator also decreases. In addition, the shape of aperture 32a is not limited to a round shape and may be rectangular or polygonal. Still further, the present invention is not limited to a single aperture as in the above-described embodiment and a plurality of apertures may be provided.

Fifth Embodiment

Figure 13:
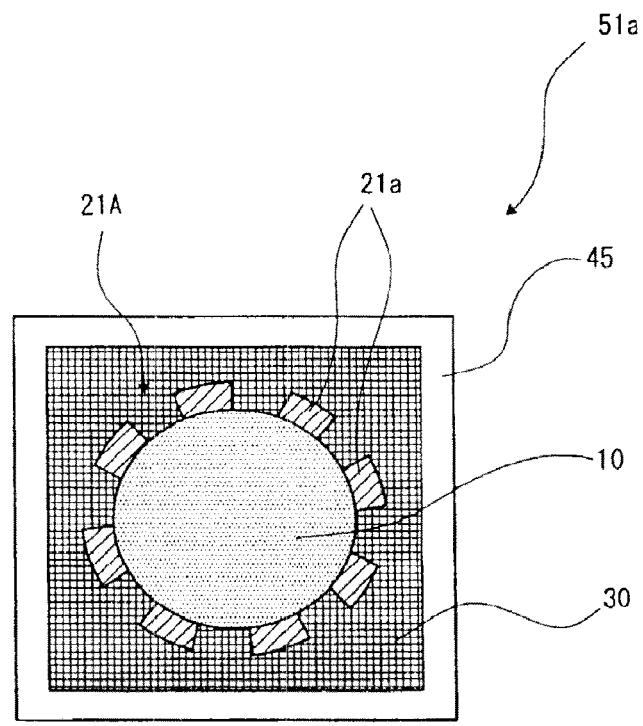
FIG. 13 is a top view showing the configuration of the piezoelectric actuator of the fifth embodiment.
Figure 14:
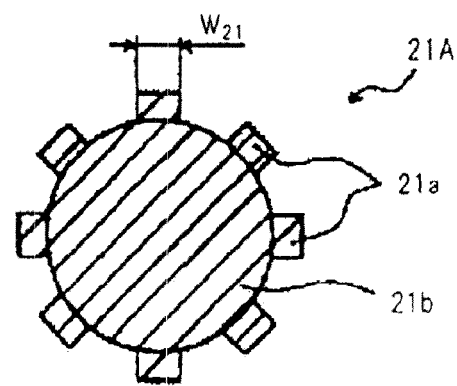
FIG. 14 is a top view separately showing the base that is used in the piezoelectric actuator of FIG. 13.

The piezoelectric actuator of the present invention is not limited to the above-described embodiments and may be of the configuration shown in FIGS. 13 and 14. FIG. 13 is a top view showing the configuration of the piezoelectric actuator of the fifth embodiment, and FIG. 14 is a top view showing the separate base that is used in this actuator.

As shown in FIGS. 13 and 14, in piezoelectric actuator 51a, a plurality of beams 21a are formed on the outer circumference of base 21A. The configuration is otherwise the same as the first embodiment. A plurality of beams 21a are formed on the outer edge of main body 21b having a round outline. Beams 21a are all of the same shape and extend radially from the center of main body 21b and toward the outside in a radial direction.

Base 21A is a single member in which beams 21a and main body 21b are unified, and although omitted in the figure, beams 21a extend directly within the same plane as main body 21b. In other words, a plurality of beams 21a are formed on the outer circumference of base 21A to extend outwardly within a plane that is parallel to the plane in which piezoelectric element 10 is adhered to base 21A.

The material of base 21A is the same as that of the first embodiment, and the outline shape of main body 21b is identical to the outline shape of piezoelectric element 10. The lower electrode layer of piezoelectric element 10 is joined to the upper surface of main body 21b, whereby piezoelectric element 10 is restrained by base 21A.

Figure 15:
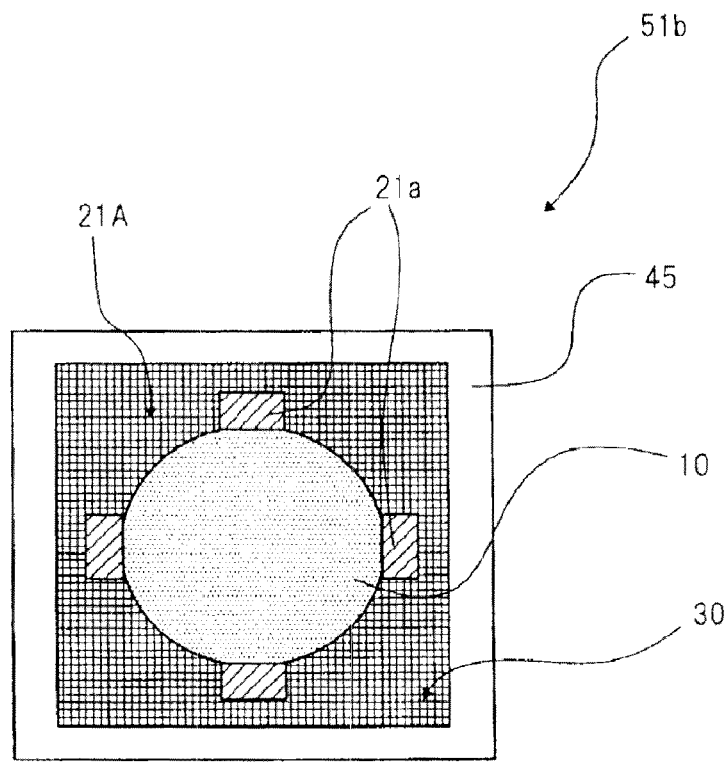
FIG. 15 is a top view showing another example of the configuration of the piezoelectric actuator of the fifth embodiment.
Figure 16:
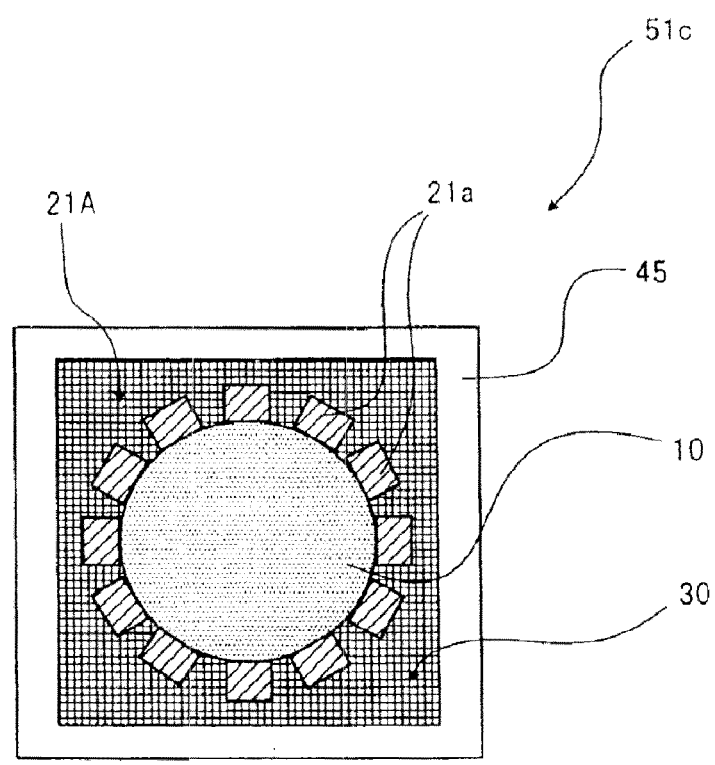
FIG. 16 is a top view showing another example of the configuration of the piezoelectric actuator of the fifth embodiment.

No particular limitations apply to the number of beams 21a. Four beams 21a are formed in piezoelectric actuator 51b of FIG. 15, and twelve beams 21a are formed in actuator 51c of FIG. 16. In any of piezoelectric actuators 51a-51c, beams 21a are formed at equal intervals (meaning that the spacing between the beams is identical with respect to the circumferential direction). In addition, beam width W21 of each beam 21a may be fixed as shown in FIG. 14 or each tab may be a tapered shape in which beam width W21 gradually narrows toward the beam end. Again making reference to FIGS. 13 and 14, base 21A on which beams 21a are formed as described hereinabove is bonded to the surface of vibration film 30 with an adhesive interposed as in the first embodiment. In this state, the ends of beams 21a do not contact the inner circumferential surface of support member 45 (i.e., a predetermined space is provided between the ends of beams 21a and the inner circumferential surface of the support member).

Even in the case of piezoelectric actuators 51a-51c provided with beams 21a as described hereinabove, the principles of operation are identical to the first embodiment. In other words, piezoelectric element 10 performs an expansion/contraction movement when an ac electrical field is applied to the upper electrode layer and lower electrode layer of piezoelectric element 10. The expansion/contraction movement by piezoelectric element 10 is repeated alternately in accordance with the orientation of the electrical field, and vibration is excited by the restraining effect of base 21A. At this time, main body 21b vibrates upward and downward, and this movement is transferred to the plurality of beams 21a. The ends of beams 21a do not directly connect to the support member, but rather, connect in a state with vibration film 30 interposed, and the vibration amplitude effect realized by vibration film 30 can therefore be expected as in the first embodiment.

In particular, the apparent rigidity of base 21A in the areas close to beams 21a is lower than for a base in which beams are not formed and that takes the circle shown by broken line 21b' as its outer diameter. As a result, the base outer circumference is easier to deform and the base can more effectively induce the vibration of the vibration film, resulting in a further increase of the vibration amplitude of the piezoelectric actuator. In the piezoelectric actuator of the present embodiment, deformation of the beams is relatively great and deformation of the piezoelectric support portion is relatively small, whereby the piston-type vibration mode such as in FIG. 8B is more easily obtained in place of the vibration mode shown in FIG. 8A. As a result, the piezoelectric element can be caused to make greater reciprocating movement upwardly and downwardly without causing great deformation or distortion in the piezoelectric body.

In the above-described configuration, beams 21a and main body 21b can also be provided as separate parts, and further, these two parts 21a and 21b may be of the same material or may be of different materials. In addition, when the above-described base 21A is formed from a single sheet-like part, a press process by blanking may be carried out.

Sixth Embodiment

Figure 17:
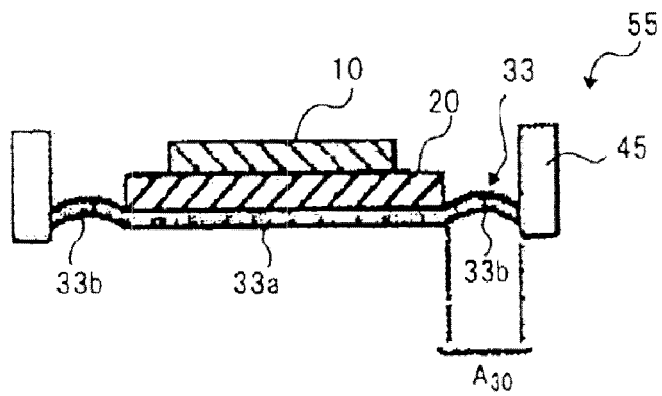
FIG. 17 is a top view showing the configuration of the piezoelectric actuator of the sixth embodiment.

The piezoelectric actuator of the present invention is not limited to the form shown in the above-described embodiments and may be of the configuration shown in FIG. 17. Vibration film 33 provided with curved part 33b is used in piezoelectric actuator 55 of FIG. 17. The configuration is otherwise the same as the first embodiment.

Vibration film 33 includes central part 33a that is flat and that supports the rear surface of base 20, and curved part 33b that is formed on the outer side of central part 33a. Although omitted in the figure, the outline shape of central part 33a as seen from the upper side is round and the outline shape of curved part 33b is a torus shape that is concentric with central part 33a.

Forming curved part 33b in this way lengthens the stroke of the vibration film in connection part area A30 and thus lowers the rigidity of the vibration film. As a result, not only does the vibration film become easier to deform, but also the resonant frequency decreases and greater vibration amplitude can be obtained.

The "curved part" described hereinabove refers to a construction in which a portion of the vibration film is curved three-dimensionally and accordingly includes, in addition to the construction in which curved part 33b has a semicircular profile such as shown in FIG. 14, constructions in which, for example, a wave-shaped profile continues.

Although vibration films 30, 32, and 33 in which an aperture is not formed were used in the above-described first to third and fifth to sixth embodiments, the present invention is not limited to these forms. For example, an aperture may be formed in vibration film 33 (refer to FIG. 17) as described in the fourth embodiment. In addition, the configurations of each embodiment (including the seventh and eight embodiments to be described below) can of course be combined as appropriate.

Seventh Embodiment

Figure 18:
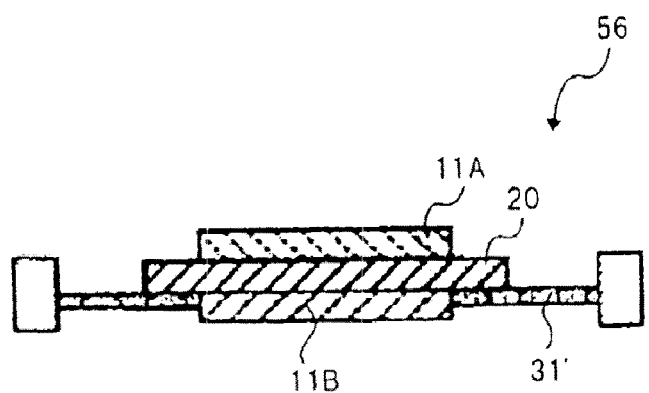
FIG. 18 is a vertical sectional view showing the configuration of the piezoelectric actuator of the seventh embodiment.

Although configurations in which piezoelectric element 10 is secured to one surface of a base have been described by way of example, the piezoelectric actuator of the present invention is not limited to this form. A configuration may also be adopted in which bimorph piezoelectric element 11 is mounted as shown in FIG. 18.

Bimorph piezoelectric element 11 is a form in which piezoelectric element 11A and piezoelectric element 11B are adhered to respective surfaces of the two surfaces of base 20 identical to the first embodiment. Piezoelectric element 11 that is configured in this way performs alternate movement in which one piezoelectric element 11A expands when the other piezoelectric element 11B contracts and one piezoelectric element contracts when the other piezoelectric element 11B expands. By means of this configuration, a greater drive force can be obtained than the above-described single-layer piezoelectric element.

Figure 19:
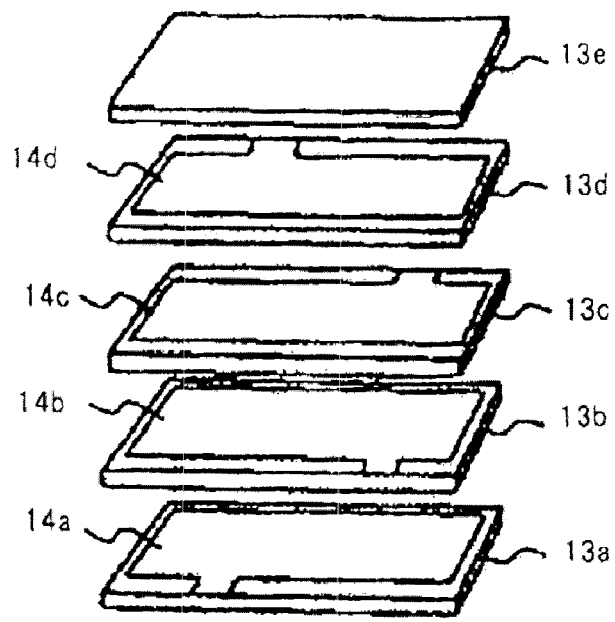
FIG. 19 is an exploded perspective view for explaining the piezoelectric element of multilayer construction that can be used in place of a single-layer piezoelectric element.

In bimorph piezoelectric element 11, no particular limitations apply to the direction of polarity of each piezoelectric element as long as piezoelectric elements 11A and 11B operate such that one expands when the other contracts (essentially, as long as the piezoelectric elements are made up from two elements that carry out mutually reversed operations). For example, the directions of polarity of the two piezoelectric elements may be aligned in the same direction (for example, directed up in the figure). When a bimorph element is used, vibration film 31' in which an aperture is formed may be used as shown in FIG. 18, Alternatively, vibration film 30 lacking an aperture may be used and piezoelectric element 11B may be adhered to the surface opposite piezoelectric element 11A with vibration film interposed (refer to Working Example 10, to be explained hereinbelow). Further, regarding the piezoelectric element, the piezoelectric element itself may be of a laminated construction. Such a construction is described with reference to FIG. 19. Piezoelectric element 12 shown in FIG. 19 is a multilayered construction in which piezoelectric plates 13a-13e composed of a piezoelectric material are stacked in five layers. One of electrode layers (conductive layers) 14a-14d is formed between each pair of the piezoelectric plates. The piezoelectric element is configured such that the direction of polarity of each piezoelectric plate 13a-13e reverses and the orientation of the electrical field is mutually reversed with each layer. Piezoelectric element 12 of this laminated construction exhibits high electrical field strength generated between electrode layers, whereby the drive power of the overall piezoelectric element is improved in proportion to the number of laminations of piezoelectric plates. Piezoelectric element 12 of FIG. 19 can be used in place of, for example, piezoelectric element 10 of FIG. 3.

Eighth Embodiment

Figure 20:
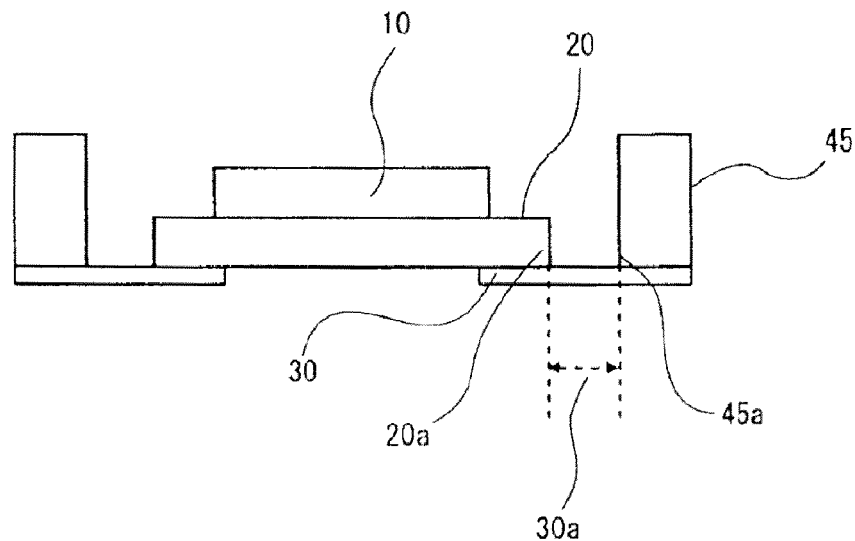
FIG. 20 is a vertical sectional view showing the configuration of the piezoelectric actuator of the eighth embodiment.
Figure 21:
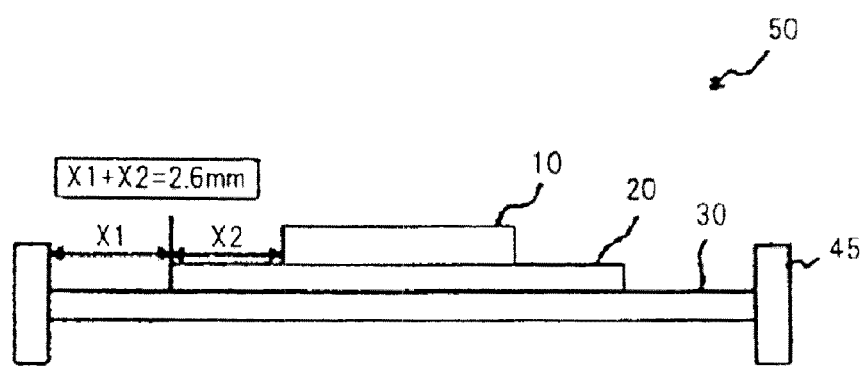
FIG. 21 is a vertical sectional view for explaining vibration film interposed part of the eighth embodiment.
Figure 22:
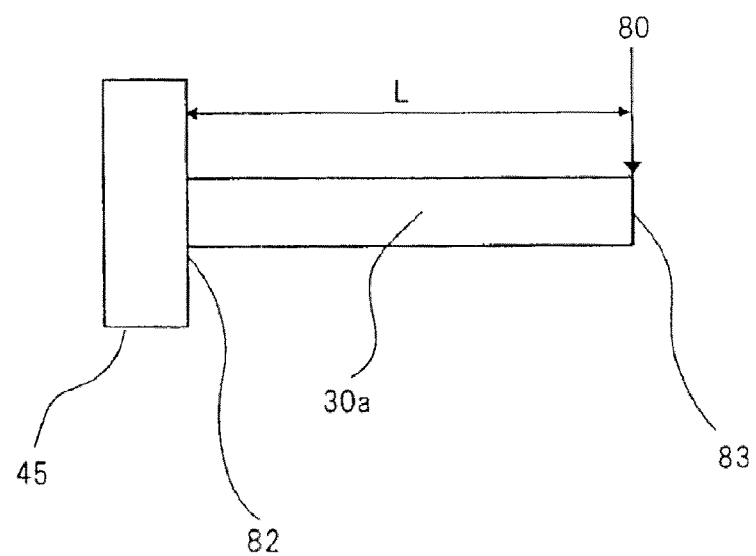
FIG. 22 is a vertical sectional view for explaining the calculation formula of the eighth embodiment.
Figure 23:
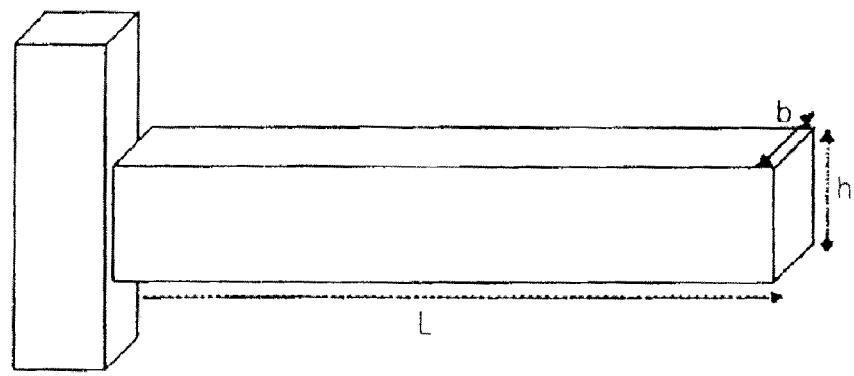
FIG. 23 is a vertical sectional view for explaining the vibration film interposed part length of the eighth embodiment.

In the piezoelectric actuator of the present invention, the amount of deflection δ (m) of vibration film interposed part A between the base outer circumference and the support body can be calculated as shown below. Vibration film interposed part A between the base outer circumference and the inside diameter of the support body and that is indicated by reference number 30a is the interposed region made up by the vibration film that is between outer circumference 20c of base 20 and inner circumference 45a of support member 45 as shown in FIG. 20, and the amount of deflection δ (m) of this vibration film interposed part A is calculated from the following calculation formula (1). The method of calculating the amount of deflection of vibration film interposed part A in the present invention is described below. FIG. 21 is a schematic sectional view of the piezoelectric actuator of the present invention, and FIG. 22 is an enlarged view of the area indicated by X1 in FIG. 21. The following computation formula (1) is a formula in which vibration film interposed part that is shown in FIG. 22 is made to have a cantilever beam construction, and as shown by FIG. 22, this cantilever construction is a construction in which one end of the vibration film interposed part forms fixed end 82 by being linked to the support body and the other end is free end 83. The amount of deflection can be computed by applying load 80 that is prescribed to the end portion of the above-described free end. Further, in computation formula (1), L is the length of the vibration film interposed part with respect to the piezoelectric element radial direction, h is the thickness of the vibration film material, and E is the modulus of direct elasticity of the vibration film material (see FIG. 3). In the present embodiment, computation was carried out with the load amount prescribed as 1 N(N/m$^2$) and the width of the beam prescribed as 0.001 m. The computation of the deflection amount of the vibration film interposed part in the piezoelectric actuator shape of the present invention is carried out by first considering the type of planar torus shape shown in FIG. 3, but because the influence exerted by the planar area in computation formula (1) is small compared to the influence exerted by powers by changes in thickness, the modulus of direct elasticity of the vibration film material, and the length of the interposed part, approximation of the planar shape by a rectangle is possible, and the deflection amount in the present embodiment was therefore computed for a rectangular shape with a width of 0.001 mm.

Computation Formula 1
Deflection amount (δ)

$$\delta = (W \cdot L^3)/(3 \cdot E \cdot I) \quad \text{(deflection amount formula—formula 1)}$$

L: the length from the base outer circumference to the support body (m)
E: the modulus of direct elasticity of the vibration film material (N/m$^2$)
W: load (N)
I: moment of inertia (m$^4$)

$$I = (b \cdot h^3)/12 \quad \text{(moment of inertia formula—formula 2)}$$

b: width 0.001 (m)
h: thickness (m)

Figure 24:
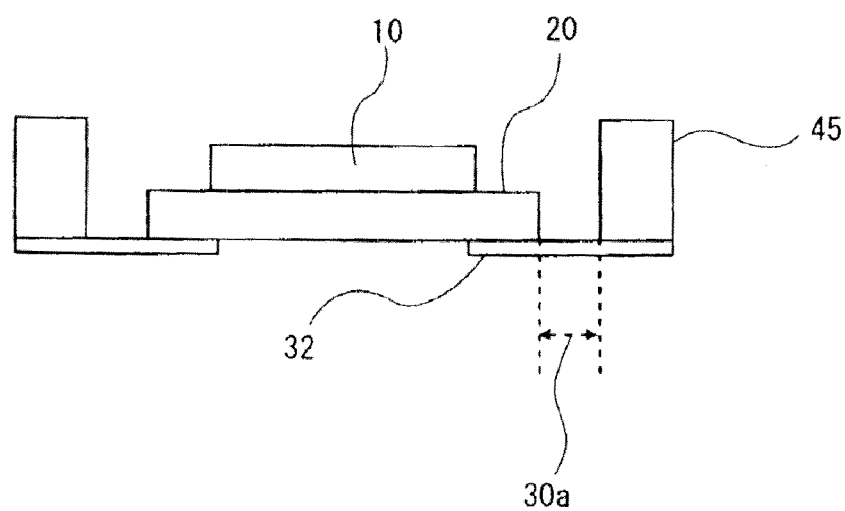
FIG. 24 is a vertical sectional view showing the configuration of the piezoelectric actuator of the eighth embodiment.

The deflection amount in vibration film interposed part of the shape shown in FIG. 24 is next computed as an example. By inserting: L, which is the length of the vibration film interposed part, or 0.001 m (1 mm); the modulus of direct elasticity (material: urethane), which is 4.0×10$^8$ (N/m$^2$); thickness h of the vibration film, which is 8×10$^{-5}$(m) (80 μm); b, which is a prescribed value of 0.001 m (1 mm); and load W, which is a prescribed value of 1 N; deflection amount δ is computed to be 0.0195 m.

In the piezoelectric actuator of the present embodiment, a piston-type vibration mode can be obtained by making a selection such that deflection amount δ (m) is in the range 0.001-5. By making an adjustment such that deflection amount δ of the vibration film interposed part that is the node of vibration falls within a prescribed range, the stress when vibration is generated is concentrated at the junction between the spring outer circumference and the vibration film (20c) or the spring base (20) and becomes the position of the maximum inflection point (see FIG. 9). This formation of the maximum inflection point close to the fixed end promotes the piston-type vibration mode. On the other hand, when deflection amount δ is less than 0.001, stress concentrates in the outer circumference of the supporting body and piezoelectric ceramic central portion, whereby the ceramic central portion becomes the maximum inflection point and the flexural-motion vibration mode is produced. When deflection amount δ is greater than 5, although stress concentrates around the base during generation of vibration, the lower rigidity of the vibration film causes attenuation of the generated amount that is propagated in the vibration film, whereby a sufficient vibration displacement amount cannot be obtained and the vibration mode becomes a free-end flexural movement that produces flexural movement only in the vicinity of the piezoelectric ceramic. As described hereinabove, making adjustments such that the deflection amount of vibration film interposed part A falls within a prescribed range promotes the piston-type movement figure and enables a realization of a piezoelectric actuator for use as an acoustic element that, compared with a piezoelectric actuator of the related art that has a peak-shaped movement figure, has a higher mean vibration amount within the acoustic radiation plane and therefore higher sound pressure levels.

WORKING EXAMPLES

An evaluation of the characteristics of the piezoelectric actuator of the present invention is shown in the following Working Examples and Comparative Examples 1-4 and the effect of the present invention were evaluated. The evaluation items are shown below:

Evaluation 1

Measurement of the fundamental resonant frequency: The fundamental resonant frequency was measured during input of an ac voltage of 1V.

Evaluation 2

Maximum vibration speed amplitude: An ac voltage of 1V was applied and the maximum vibration speed amplitude Vmax during resonance (see FIGS. 8A and 8B) was measured.

Evaluation 3

Figure 25:
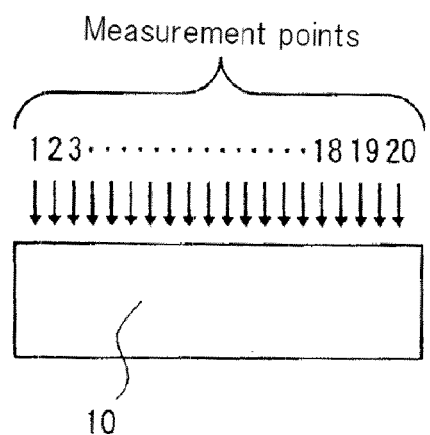
FIG. 25 is a view for explaining the measurement points of the mean vibration speed amplitude.

Mean vibration speed amplitude: The vibration speed amplitude was measured at 20 measurement points established by uniformly dividing the longitudinal direction of the piezoelectric element as shown in FIG. 25 and the mean value of these measurements was computed.

Evaluation 4

Computation of deflection amount of the vibration film interposed part: The deflection amount was computed by means of the following formula. In the following formula, calculation was carried out with the load prescribed as 1 N(N/m$^2$) and width b as 0.001 m (moment of inertia formula) (refer to the eighth embodiment for details regarding the calculation method).

Computation Formula 1
Deflection amount (δ)

$$\delta = (W \cdot L^3)/(3 \cdot E \cdot I) \quad \text{(deflection amount formula—formula 1)}$$

L: the length from the base outer circumference to the support body
E: the modulus of direct elasticity of the vibration film material (N/m$^2$)
W: load (N)
I: moment of inertia (m$^4$)
Moment of inertia (I)

$$I = (b \cdot h^3)/12 \quad \text{(moment of inertia formula—formula 2)}$$

b: width 0.001 (m)
h: thickness (m)

Evaluation 5

Vibration mode: As shown in FIGS. 8A and 8B, the "vibration speed ratio" is defined as: (mean vibration speed amplitude Vm)/(maximum speed amplitude Vmax), and the vibration mode was distinguished based on the value of this vibration speed ratio. In other words, because the flexural movement (peak-shaped movement) such as shown in FIG. 8A is indicated when the vibration speed ratio is low and the reciprocating movement (piston-type movement) such as shown in FIG. 8B is indicated when the vibration speed ratio is high, in the present working example, the threshold value was taken as "vibration speed ratio=0.8" and flexural movement was determined when the vibration speed ratio was less than 0.8 and piston-type movement was determined when the vibration speed ratio was 0.8 or greater.

Evaluation 6

Measurement of sound pressure levels: The sound pressure level during input of an ac voltage of 1V was measured by a microphone arranged at a position separated by a prescribed distance from the element. In addition, this prescribed distance, if not clearly specified, was 10 cm, and the measurement frequencies were 1 kHz, 3 kHz, 5 kHz, and 10 kHz.

Evaluation 7

Test of shocks from falls: A portable telephone that incorporates a piezoelectric actuator is naturally dropped 50 cm five times to test the dropped-shock stability. More specifically, damage such as cracks is visually checked after the drop-shock test and the sound pressure characteristics following the test are measured. The resulting sound pressure level differences (referring to the difference between sound pressure levels before the test and sound pressure levels after the test) were rated "○" for differences within 3 dB and "x" for differences that exceeded 3 dB.

The construction (shape, material, etc.) and evaluation results of the piezoelectric actuators according to each of the Working Examples described hereinbelow are shown in Table 1 to Table 6.

TABLE 1

Evaluation of support member shape:

| | Working Example 1 | Working Example 2 (alteration of vibration film shape) | Working Example 3 (alteration of support member shape) | Working Example 4 (alteration of support member shape) | Working Example 5 (alteration of support member shape) |
|---|---|---|---|---|---|
| Piezoelectric element | square: 16 × 16 mm; thickness: 50 μm | Same as Working Example 1 | Same as Working Example 1 | Same as Working Example 1 | Same as Working Example 1 |
| Base | Square: 18 × 18 mm Thickness: 30 μm Material: phosphor bronze | Same as Working Example 1 | Same as Working Example 1 | Same as Working Example 1 | Same as Working Example 1 |
| Vibration film | Circle: φ21 mm Material: urethane | Square: 21 × 21 mm Hole diameter: φ17 mm Material: urethane | Rectangle: 25 × 21 mm Material: urethane | Oval: 25 × 21 mm Material: urethane | Square: 21 × 21 mm Material: urethane Rounded edges in four corners |
| Support member | Outer diameter: φ21 mm Inner diameter: φ20 mm Material: SUS | Same as Working Example 1 | Rectangle: 25 × 21 mm Inner diameter: 24 × 20 mm Material: SUS | Oval: 25 × 21 mm Inner diameter: 24 × 20 mm Material: SUS | Outer diameter: 21 × 21 mm Inner diameter: 20 × 20 mm Material: SUS Rounded edges in |

TABLE 1-continued

Evaluation of support member shape:

|  | Working Example 1 | Working Example 2 (alteration of vibration film shape) | Working Example 3 (alteration of support member shape) | Working Example 4 (alteration of support member shape) | Working Example 5 (alteration of support member shape) |
| --- | --- | --- | --- | --- | --- |
|  |  |  |  |  | four corners |
| Fundamental resonant frequency (Hz) | 854 | 875 | 815 | 825 | 865 |
| Maximum vibration speed amplitude (mm/s) | 215 | 245 | 205 | 210 | 205 |
| Vibration speed ratio | 0.83 | 0.86 | 0.82 | 0.81 | 0.82 |
| Vibration figure | Piston-type | Piston-type | Piston-type | Piston-type | Piston-type |
| Sound pressure level (1 kHz) | 83 | 84 | 82 | 83 | 83 |
| Sound pressure level (3 kHz) | 88 | 91 | 87 | 89 | 86 |
| Sound pressure level (5 kHz) | 95 | 98 | 105 | 102 | 92 |
| Sound pressure level (10 kHz) | 87 | 93 | 101 | 88 | 88 |
| Stability from shocks when dropped | ◯ | ◯ | ◯ | ◯ | ◯ |

TABLE 2

Evaluation of base and bimorph construction:

|  | Working Example 6 (Square piezoelectric element + round support member) | Working Example 7 (Examination of base shape (beam construction)) | Working Example 8 (Examination of base shape (beam construction)) | Working Example 9 (Bimorph construction) | Working Example 10 (Bimorph construction) |
| --- | --- | --- | --- | --- | --- |
| Piezoelectric element | square: 16 × 16 mm; thickness: 50 μm | Same as Working Example 1 | Same as Working Example 1 | Circle: φ16 mm Thickness: 50 μm Bimorph construction | Same as Working Example 9 |
| Base | Square: 18 × 18 mm Thickness: 30 μm Material: phosphor bronze | Circle: φ18 mm Thickness: 30 μm Material: 8 beams, phosphor bronze | Same as Working Example 2 | Same as Working Example 1 | Same as Working Example 1 |
| Vibration film | Circle: φ21 mm Material: urethane | Same as Working Example 1 | Same as Working Example 7 | Same as Working Example 1 | Same as Working Example 2 |
| Support member | Outer diameter: φ21 mm Inner diameter: φ20 mm Material: SUS | Same as Working Example 1 | Same as Working Example 1 | Same as Working Example 1 | Same as Working Example 1 |
| Fundamental resonant frequency (Hz) | 820 | 825 | 855 | 897 | 915 |

TABLE 2-continued

Evaluation of base and bimorph construction:

|  | Working Example 6 (Square piezoelectric element + round support member) | Working Example 7 (Examination of base shape (beam construction)) | Working Example 8 (Examination of base shape (beam construction)) | Working Example 9 (Bimorph construction) | Working Example 10 (Bimorph construction) |
|---|---|---|---|---|---|
| Maximum vibration speed amplitude (mm/s) | 205 | 275 | 310 | 360 | 405 |
| Vibration speed ratio | 0.83 | 0.84 | 0.86 | 0.83 | 0.83 |
| Vibration figure | Piston-type | Piston-type | Piston-type | Piston-type | Piston-type |
| Sound pressure level (1 kHz) | 86 | 85 | 88 | 91 | 94 |
| Sound pressure level (3 kHz) | 87 | 90 | 95 | 93 | 87 |
| Sound pressure level (5 kHz) | 92 | 97 | 103 | 110 | 108 |
| Sound pressure level (10 kHz) | 86 | 92 | 99 | 107 | 115 |
| Stability from shocks when dropped | ○ | ○ | ○ | ○ | ○ |

TABLE 3

Examination of bimorph construction, vibration film material, and adhesive material:

|  | Working Example 11 (Alteration of thickness of upper and lower piezoelectric elements in a bimorph construction) | Working Example 12 (Alteration of bonding positions of upper and lower piezoelectric elements in a bimorph construction) | Working Example 13 (Alternation of vibration film shape and curved vibration film) | Working Example 14 (Alteration of material of vibration film) | Working Example 15 (Alteration of materials of vibration film and base) | Working Example 16 (Alteration of adhesives) |
|---|---|---|---|---|---|---|
| Piezoelectric element | Piezoelectric element 11A: φ16, 50 μm Piezoelectric element 11B: φ16, 100 μm | Piezoelectric element 11A: φ16, 50 μm Piezoelectric element 11B: φ16, 50 μm | Same as Working Example 1 | Same as Working Example 1 | Same as Working Example 1 | Same as Working Example 1 |
| Base | Same as Working Example 1 | Same as Working Example 1 | Same as Working Example 1 | Same as Working Example 1 | Material: 42 alloy Thickness: 40 μm Otherwise identical to Working Example 1 | Same as Working Example 1 |
| Vibration film | Same as Working Example 2 | Same as Working Example 2 | Square: 22 × 22 mm Aperture diameter: φ17 mm Material: urethane Curved | Material: PET Thickness: 50 μm Otherwise identical to Working Example 1 | Same as Working Example 14 | Same as Working Example 1 |

TABLE 3-continued

Examination of bimorph construction, vibration film material, and adhesive material:

|  | Working Example 11 (Alteration of thickness of upper and lower piezoelectric elements in a bimorph construction) | Working Example 12 (Alteration of bonding positions of upper and lower piezoelectric elements in a bimorph construction) | Working Example 13 (Alternation of vibration film shape and curved vibration film) | Working Example 14 (Alteration of material of vibration film) | Working Example 15 (Alteration of materials of vibration film and base) | Working Example 16 (Alteration of adhesives) |
|---|---|---|---|---|---|---|
|  |  |  | construction (6 mm curvature radius) |  |  |  |
| Support member | Same as Working Example 1 | Same as Working Example 1 | Same as Working Example 1 | Same as Working Example 1 | Same as Working Example 1 | Same as Working Example 1 |
| Adhesive | Epoxy adhesive | Epoxy adhesive | Epoxy adhesive | Epoxy adhesive | Epoxy adhesive | Acrylic adhesive |
| Fundamental resonant frequency (Hz) | 955 | 915 | 775 | 885 | 865 | 841 |
| Maximum vibration speed amplitude (mm/s) | 385 | 220 | 220 | 230 | 220 | 205 |
| Vibration speed ratio | 0.84 | 0.81 | 0.81 | 0.82 | 0.83 | 0.83 |
| Vibration figure | Piston-type | Piston-type | Piston-type | Piston-type | Piston-type | Piston-type |
| Sound pressure level (1 kHz) | 93 | 85 | 81 | 84 | 83 | 82 |
| Sound pressure level (3 kHz) | 87 | 84 | 85 | 86 | 86 | 87 |
| Sound pressure level (5 kHz) | 108 | 105 | 93 | 87 | 86 | 93 |
| Sound pressure level (10 kHz) | 115 | 93 | 84 | 95 | 92 | 88 |
| Stability from shocks when dropped | ◯ | ◯ | ◯ | ◯ | ◯ | ◯ |

TABLE 4

Examination of piezoelectric element material, and laminated construction, and Evaluation of support member material:

|  | Working Example 17 (Alteration of material of support member) | Working Example 18 (Alteration of thickness of support member) | Working Example 19 (Alteration of piezoelectric ceramic material) | Working Example 20 (Alteration of electrode material) | Working Example 21 (Alteration of electrode thickness) | Working Example 22 (Laminated ceramic element) |
|---|---|---|---|---|---|---|
| Piezoelectric element | Same as Working Example 1 | Same as Working Example 1 | Barium titanate ceramics Other than material, identical to Working Example 1 | Silver electrode Other than material of electrodes, identical to Working Example 1 | Electrode thickness: 5 μm Other than thickness of electrodes, identical to Working Example 1 | φ16 mm Three piezoelectric layers: 50 μm Four electrode layers: 3 μm |

TABLE 4-continued

Examination of piezoelectric element material, and laminated construction, and Evaluation of support member material:

| | Working Example 17 (Alteration of material of support member) | Working Example 18 (Alteration of thickness of support member) | Working Example 19 (Alteration of piezoelectric ceramic material) | Working Example 20 (Alteration of electrode material) | Working Example 21 (Alteration of electrode thickness) | Working Example 22 (Laminated ceramic element) |
|---|---|---|---|---|---|---|
| Base | Same as Working Example 1 | Same as Working Example 1 | Same as Working Example 1 | Same as Working Example 1 | Same as Working Example 1 | Same as Working Example 1 |
| Vibration film | Same as Working Example 1 | Same as Working Example 1 | Same as Working Example 1 | Same as Working Example 1 | Same as Working Example 1 | Same as Working Example 1 |
| Support member | Material: Brass Other than material, identical to Working Example 1 | Thickness: 1.0 mm Other than thickness, identical to Working Example 1 | Same as Working Example 1 | Same as Working Example 1 | Same as Working Example 1 | Same as Working Example 1 |
| Fundamental resonant frequency (Hz) | 850 | 848 | 915 | 865 | 845 | 905 |
| Maximum vibration speed amplitude (mm/s) | 215 | 210 | 220 | 210 | 220 | 250 |
| Vibration speed ratio | 0.84 | 0.82 | 0.84 | 0.84 | 0.87 | 0.81 |
| Vibration figure | Piston-type | Piston-type | Piston-type | Piston-type | Piston-type | Piston-type |
| Sound pressure level (1 kHz) | 83 | 82 | 84 | 84 | 83 | 87 |
| Sound pressure level (3 kHz) | 87 | 86 | 87 | 87 | 86 | 88 |
| Sound pressure level (5 kHz) | 89 | 90 | 92 | 94 | 93 | 99 |
| Sound pressure level (10 kHz) | 90 | 89 | 85 | 88 | 89 | 93 |
| Stability from shocks when dropped | ◯ | ◯ | ◯ | ◯ | ◯ | ◯ |

TABLE 5

Evaluation of piezoelectric element arrangement position and base shape:

| | Working Example 23 (Alteration of piezoelectric element arrangement) | Working Example 24 (Alteration of base shape) | Working Example 25 (Alteration of base shape) | Working Example 26 (Alteration of base shape) |
|---|---|---|---|---|
| Piezoelectric element | Arranged position of ceramics: Not concentric with support member Other than position of arrangement identical to Working Example 1 | Same as Working Example 1 | Same as Working Example 1 | Same as Working Example 1 |
| Base | Same as Working Example 1 | Alteration of shape (refer to FIG. 44) Other than shape, identical to Working Example 1 | Alteration of shape (refer to FIG. 45) Other than shape, identical to Working Example 1 | Alteration of shape (refer to FIG. 46) Other than shape, identical to Working Example 1 |
| Vibration film | Same as Working Example 1 | Same as Working Example 1 | Same as Working Example 1 | Same as Working Example 1 |

TABLE 5-continued

Evaluation of piezoelectric element arrangement position and base shape:

| | Working Example 23 (Alteration of piezoelectric element arrangement) | Working Example 24 (Alteration of base shape) | Working Example 25 (Alteration of base shape) | Working Example 26 (Alteration of base shape) |
|---|---|---|---|---|
| Support member | Same as Working Example 1 | Same as Working Example 1 | Same as Working Example 1 | Same as Working Example 1 |
| Fundamental resonant frequency (Hz) | 905 | 945 | 905 | 880 |
| Maximum vibration speed amplitude (mm/s) | 205 | 235 | 215 | 205 |
| Vibration speed ratio | 0.81 | 0.84 | 0.81 | 0.83 |
| Vibration figure | Piston-type | Piston-type | Piston-type | Piston-type |
| Sound pressure level (1 kHz) | 85 | 87 | 83 | 82 |
| Sound pressure level (3 kHz) | 86 | 85 | 84 | 86 |
| Sound pressure level (5 kHz) | 87 | 88 | 87 | 99 |
| Sound pressure level (10 kHz) | 91 | 93 | 88 | 107 |
| Stability from shocks when dropped | ○ | ○ | ○ | ○ |

TABLE 6

Evaluation when incorporated in electronic apparatus:

| | Working Example 27 | Working Example 28 | Working Example 29 | Working Example 30 | Working Example 31 |
|---|---|---|---|---|---|
| Mounting apparatus | Portable telephone | Portable telephone | Portable telephone | Portable telephone | PC |
| Piezoelectric actuator | Working Example 1 | Working Example 2 | Working Example 3 | Working Example 4 | Working Example 1 |
| Fundamental resonant frequency (Hz) | 775 | 795 | 725 | 765 | 815 |
| Sound pressure level (1 kHz) | 85 | 86 | 83 | 84 | 81 |
| Sound pressure level (3 kHz) | 84 | 86 | 85 | 86 | 85 |
| Sound pressure level (5 kHz) | 90 | 92 | 86 | 95 | 89 |
| Sound pressure level (10 kHz) | 86 | 85 | 84 | 87 | 84 |
| Stability from shocks when dropped | ○ | ○ | ○ | ○ | ○ |

Working Example 1

As Working Example 1, piezoelectric actuator 51 of the first embodiment (refer to FIGS. 3 and 4) in which piezoelectric element 11 is adhered to the base upper surface as shown in FIG. 18 was fabricated. Although not a substantial difference, the present working example has a configuration in which vibration film 31 is adhered to the lower surface of support member 46.

The actual configuration of each part is as follows:

Piezoelectric element 11: An upper electrode layer and a lower electrode layer each having a thickness of 8 μm were formed on respective surfaces of the two surfaces of a piezoelectric plate having an outside diameter of φ 16 mm and thickness of 50 μm (0.05 mm).

Base 21: Phosphor bronze having an outer diameter of φ 18 mm and thickness of 30 μm (0.03 mm) was used.

Vibration film 31: A urethane film having an outer dimension of 21×21 mm and thickness of 80 μm was used.

Support member 46: SUS 304 having an outer dimension of 21×21 mm, an inner dimension of 20×20 mm, and thickness of 1.5 mm was used.

Piezoelectric element 11 and base 21 were arranged concentrically. A lead zirconate titanate ceramic was used for the piezoelectric plate, and a silver/palladium alloy (70%:30% by weight) was used for the electrode layers. A green-sheet method was carried out for the fabrication of this piezoelectric element and sintering was carried for two hours at 1100° C. in air, following which the piezoelectric material layer was subjected to a polarizing process. Bonding of piezoelectric element 11 and base 21, bonding of base 21 and vibration film 31, and bonding of support member 46 and vibration film 31 were all carried out using an epoxy adhesive.

Results

| | |
|---|---|
| Fundamental resonant frequency: | 854 Hz |
| Maximum vibration speed amplitude: | 215 mm/s |
| Vibration speed ratio: | 0.83 |
| Vibration figure: | piston-type |
| Sound pressure level (1 kHz): | 83 dB |
| Sound pressure level (3 kHz): | 88 dB |
| Sound pressure level (5 kHz): | 95 dB |
| Sound pressure level (10 kHz): | 87 dB |
| Stability from shocks when dropped: | ○ |

Figure 27:
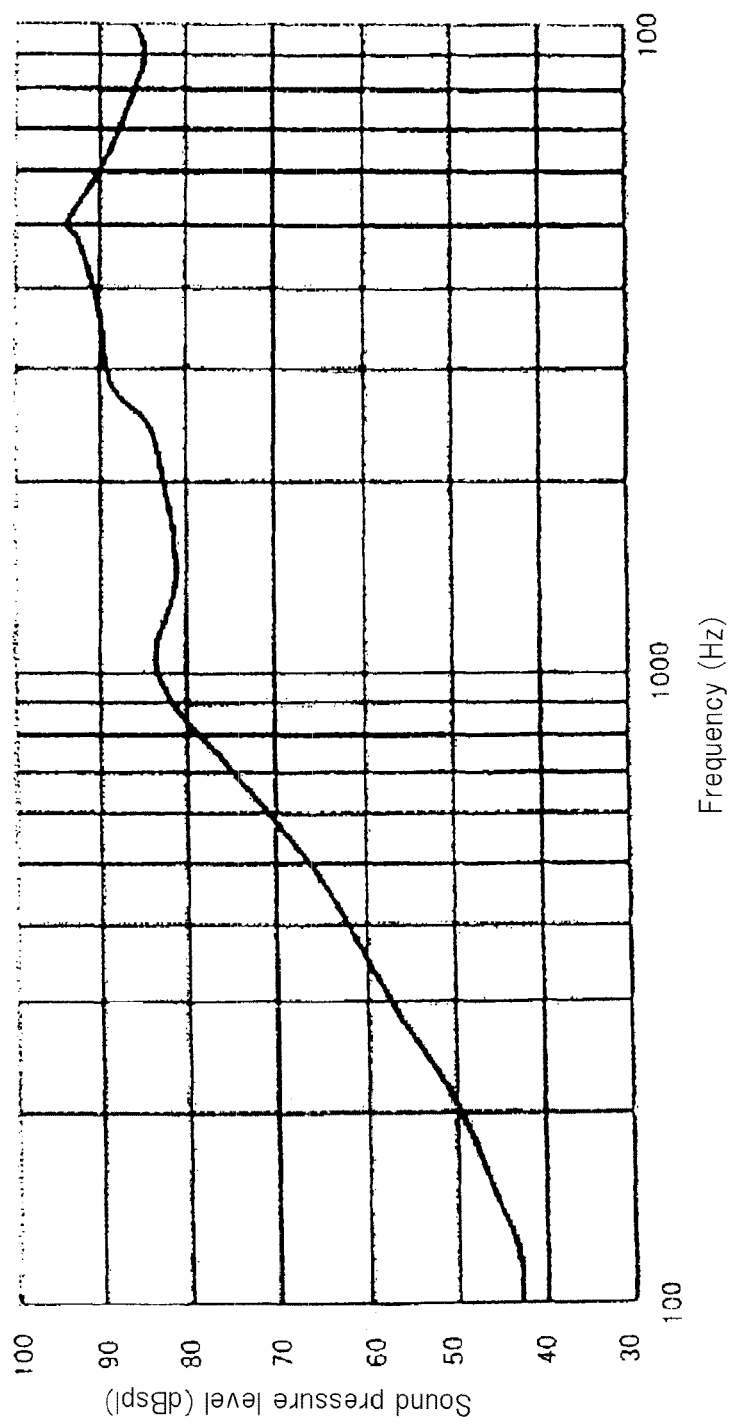
FIG. 27 shows the acoustic characteristics of the piezoelectric actuator of Working Example 1.

As is clear from the results above, the piezoelectric actuator of the present working example is proven to have a fundamental resonant frequency of 1 kHz or less, large vibration amplitude, and a piston-type vibration figure. In addition, this piezoelectric actuator is shown to have a sound pressure level that exceeds 80 dB over a broad frequency band of 1-10 kHz and excellent acoustic characteristics free of dips (refer to the acoustic characteristics chart of Working Example 1 shown in FIG. 27). In addition, the piezoelectric actuator thickness (thickness of support member 46) is 1.5 mm and therefore is sufficiently thin.

Comparative Example 1

Figure 28:
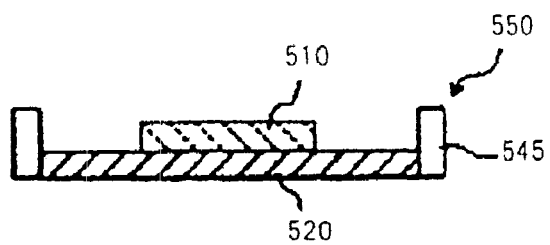
FIG. 28 is a vertical sectional view showing the configuration of the piezoelectric actuator of Comparative Example 1.

As Comparative Example 1, a piezoelectric actuator relating to the present invention was fabricated in which the base outer circumference is directly joined to the support member as shown in FIG. 28. This piezoelectric actuator 550 has the same configuration as the actuator shown in FIG. 1. In addition, piezoelectric element 510, base 520, and support member 545 are composed of the same materials as piezoelectric element 11, base 21, and support member 46 of the above-described Working Example 1.

The actual configuration of each part is as shown below:

Piezoelectric element 510: Identical to piezoelectric element 11 of Working Example 1.

Base 520: Outer diameter of φ 21 mm (The thickness and material are identical to base 21 of Working Example 1).

Support member 545: Identical to support member 45 of Working Example 1.

Piezoelectric element 510, base 520, and support member 530 are arranged concentrically.

Results

| | |
|---|---|
| Fundamental resonant frequency: | 1418 Hz |
| Maximum vibration speed amplitude: | 47 mm/s |
| Vibration speed ratio: | 0.31 |
| Vibration figure: | flexural-motion |
| Stability from shocks when dropped: | X |

Working Example 2

Figure 29A:
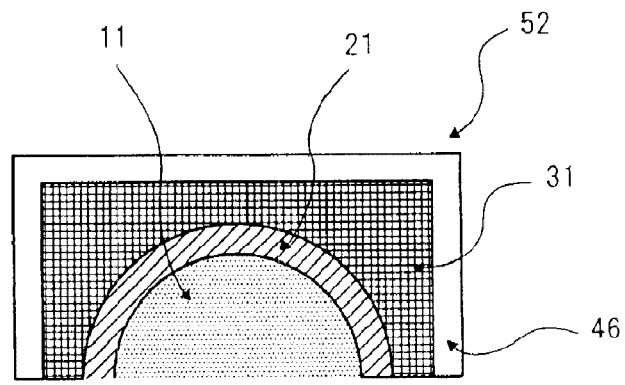
FIG. 29A is a top view showing the configuration of the piezoelectric actuator of Working Example 2.
Figure 29B:
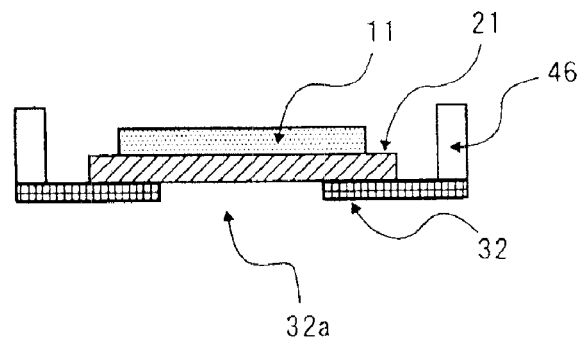
FIG. 29B is a vertical sectional view showing the configuration of the piezoelectric actuator of Working Example 2.

As Working Example 2, piezoelectric actuator 52 of the fourth embodiment (see also FIG. 12) was fabricated as shown in FIGS. 29A and 29B. In piezoelectric actuator 52 of the present working example, aperture 32a is formed in vibration film 32.

The actual configuration of each part is as follow:

Piezoelectric element 11: Identical to Working Example 1
Base 21: Identical to Working Example 1
Vibration film 32: Outer dimensions=21×21 mm, inner diameter (aperture diameter)=φ 17 mm (The thickness and material are identical to vibration film 30 of Working Example 1)
Support member 46: Identical to Working Example 1
Aperture 32a was formed in the center of vibration film 32.

Results

| | |
|---|---|
| Fundamental resonant frequency: | 875 Hz |
| Maximum vibration speed amplitude: | 245 mm/s |
| Vibration speed ratio: | 0.86 |
| Vibration figure: | piston-type |
| Sound pressure level (1 kHz): | 84 dB |
| Sound pressure level (3 kHz): | 91 dB |
| Sound pressure level (5 kHz): | 98 dB |
| Sound pressure level (10 kHz): | 93 dB |
| Stability from shocks when dropped: | ○ |

As is clear from the above-described results, the piezoelectric actuator of the present working example was proven to have greater vibration amplitude at the fundamental resonant frequency and higher sound pressure levels in the range of 1-10 kHz than Working Example 1.

Working Example 2a

Figure 30A:
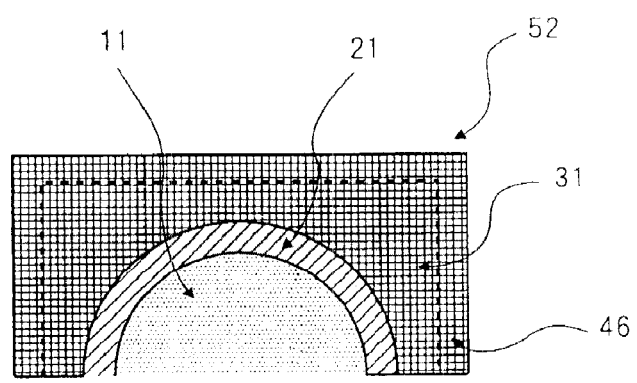
Figure 30B:
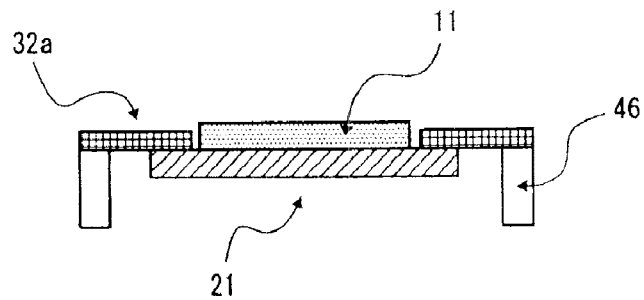

The following piezoelectric actuator was fabricated as Working Example 2a. The piezoelectric actuator of the present working example is identical to the first Working Example with the exception of the junction position of the vibration film provided in Working Example 2 as shown in FIGS. 30A and 30B.

Results

| | |
|---|---|
| Fundamental resonant frequency: | 870 Hz |
| Maximum vibration speed amplitude: | 240 mm/s |
| Vibration speed ratio: | 0.87 |
| Vibration figure: | piston-type |
| Sound pressure level (1 kHz): | 84 dB |
| Sound pressure level (3 kHz): | 90 dB |
| Sound pressure level (5 kHz): | 97 dB |
| Sound pressure level (10 kHz): | 93 dB |
| Stability from shocks when dropped: | ○ |

As is clear from the results above, the piezoelectric actuator of the present working example was proven to have characteristics equivalent to those of Working Example 2 and can realize sound pressure levels in the range of 1-10 kHz regardless of whether the junction position of the vibration film is on the upper or lower part of the base.

Working Example 3

Figure 31A:
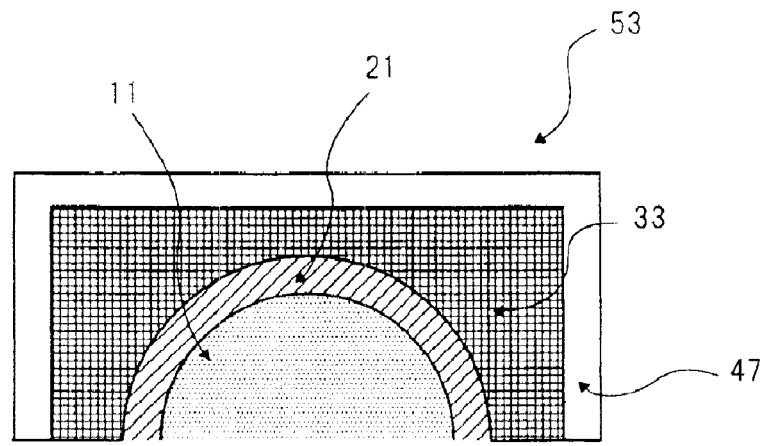
FIG. 31A is a top view showing the configuration of the piezoelectric actuator of Working Example 3.
Figure 31B:
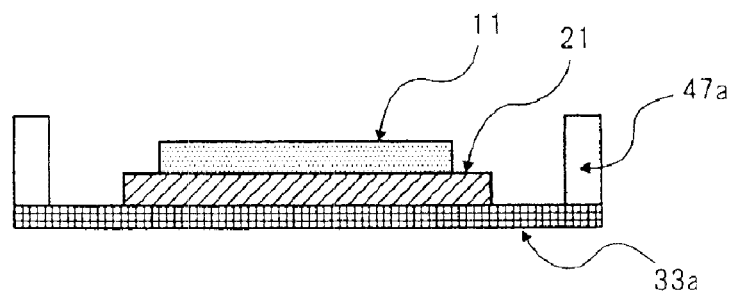
FIG. 31B is a vertical sectional view showing the configuration of the piezoelectric actuator of Working Example 3.

A piezoelectric actuator such as shown in FIGS. 31A and 31B was fabricated as Working Example 3. Piezoelectric actuator 53 of the present working example is provided with rectangular vibration film 33a and support member 47a but the configuration is otherwise identical to the first working example.

The actual configuration of each part is as follows:

Piezoelectric element 11: Identical to Working Example 1 (Identical to Working Example 3)
Base 21: Identical to Working Example 3
Vibration film 33a: A film made of urethane and having an outer dimension of 21×25 mm and a thickness of 80 μm was used.
Support member 47a: SUS 304 having outer dimensions of 21×25 mm, open inner frame dimensions of 20×24 mm and a thickness of 1.5 mm was used.

Results

| | |
|---|---|
| Fundamental resonant frequency: | 815 Hz |
| Maximum vibration speed amplitude: | 205 mm/s |
| Vibration speed ratio: | 0.82 |
| Vibration figure: | piston-type |
| Sound pressure level (1 kHz): | 82 dB |
| Sound pressure level (3 kHz): | 87 dB |
| Sound pressure level (5 kHz): | 105 dB |
| Sound pressure level (10 kHz): | 101 dB |
| Stability from shocks when dropped: | ○ |

As is clear from the results above, the piezoelectric actuator of the present working example was proven to realize a further reduction of the fundamental resonant frequency over Working Example 1 and to have higher sound pressure levels over a frequency band from 5 kHz and above.

Working Example 4

Figure 32A:
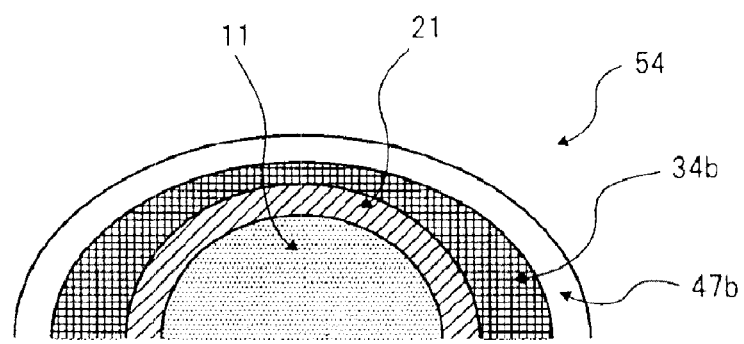
FIG. 32A is a top view showing the configuration of the piezoelectric actuator of Working Example 4.
Figure 32B:
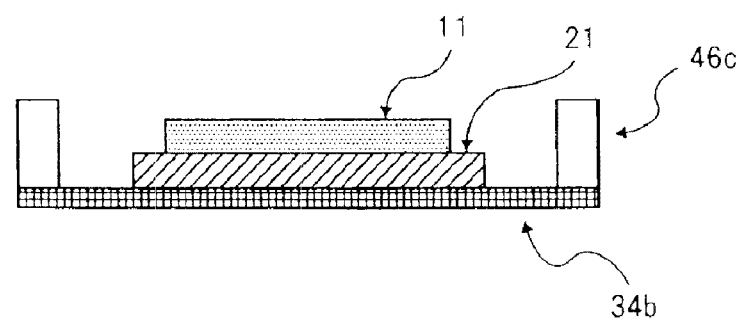
FIG. 32B is a vertical sectional view showing the configuration of the piezoelectric actuator of Working Example 4.

A piezoelectric actuator as shown in FIGS. 32A and 32B was fabricated as Working Example 4. Piezoelectric actuator 54 of the present working example is provided with oval vibration film 34b and support member 47b and has a rectangular shape, the configuration otherwise being identical to the first working example.

The actual configuration of each part is as follows:

Piezoelectric element 11: Identical to Working Example 1 (identical to Working Example 3)

Base 21: Identical to Working Example 1

Vibration film 33b: A film made from urethane having outer dimensions of 21 mm (minor axis)×25 mm (major axis) and a thickness of 80 μm was used.

Support member 47b: SUS 304 having outer dimensions of 21 mm (minor axis)×25 mm (major axis), open frame inner dimensions of 20 mm (minor axis)×24 mm (major axis), and thickness of 1.5 mm was used.

Results

| | |
|---|---|
| Fundamental resonant frequency: | 825 Hz |
| Maximum vibration speed amplitude: | 210 mm/s |
| Vibration speed ratio: | 0.81 |
| Vibration figure: | piston-type |
| Sound pressure level (1 kHz): | 83 dB |
| Sound pressure level (3 kHz): | 89 dB |
| Sound pressure level (5 kHz): | 102 dB |
| Sound pressure level (10 kHz): | 97 dB |
| Stability from shocks when dropped: | ○ |

As is clear from the above results, the piezoelectric actuator of the present working example was proven to provide a greater reduction of the fundamental resonant frequency than Working Example 1, and further, to have higher sound pressure levels in the range of 1-10 kHz.

Working Example 5

Figure 33A:
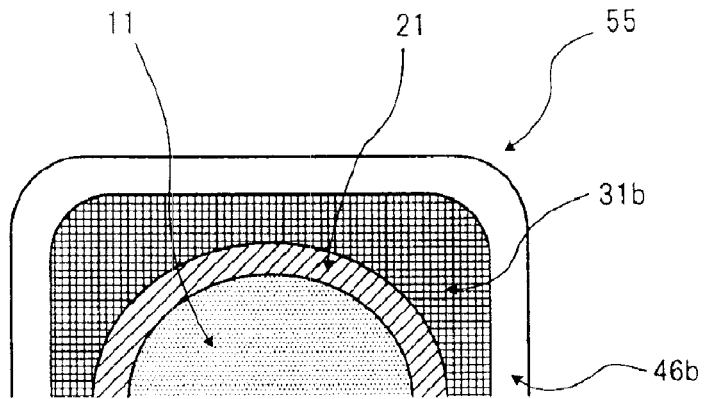
FIG. 33A is a top view showing the configuration of the piezoelectric actuator of Working Example 5.
Figure 33B:
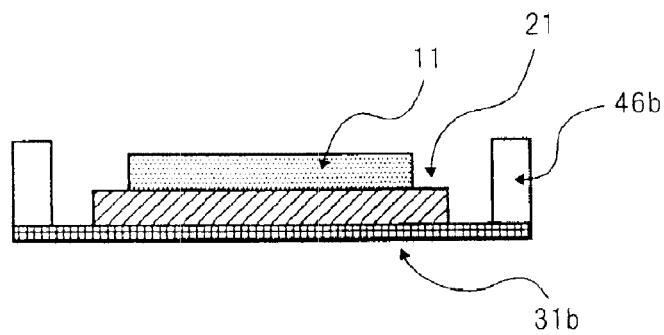
FIG. 33B is a vertical sectional view showing the configuration of the piezoelectric actuator of Working Example 5.

A piezoelectric actuator such as shown in FIGS. 33A and 33B was fabricated as Working Example 5. Piezoelectric actuator 55 of the present working example has a form in which the shapes of vibration film and support member of Working Example 1 are altered, but the configuration is otherwise the same as the first working example.

The actual configuration of each part is as follows:

Piezoelectric element 11: Identical to Working Example 1 (identical to Working Example 3)

Base 21: Identical to Working Example 1

Vibration film 31b: A film made of urethane and formed in a square having outer dimensions of 21×21 mm with rounded edges at the four corners and a thickness of 80 μm was used.

Support member 46b: A film made of urethane and formed in a square shape having outer dimensions of 21×21 mm with rounded edges in the four corners, having a square inner opening with dimensions of 20×20 mm with rounded corners, and a thickness of 80 μm was used.

Results

| | |
|---|---|
| Fundamental resonant frequency: | 865 Hz |
| Maximum vibration speed amplitude: | 205 mm/s |
| Vibration speed ratio: | 0.82 |
| Vibration figure: | piston-type |
| Sound pressure level (1 kHz): | 83 dB |
| Sound pressure level (3 kHz): | 86 dB |
| Sound pressure level (5 kHz): | 92 dB |
| Sound pressure level (10 kHz): | 88 dB |
| Stability from shocks when dropped: | ○ |

As is clear from the above results, the piezoelectric actuator of the present working example was proved to have a fundamental resonant frequency and vibration amplitude equivalent to Working Example 1 and have high sound pressure levels in the range of 1-10 kHz.

Working Example 6

Figure 34A:
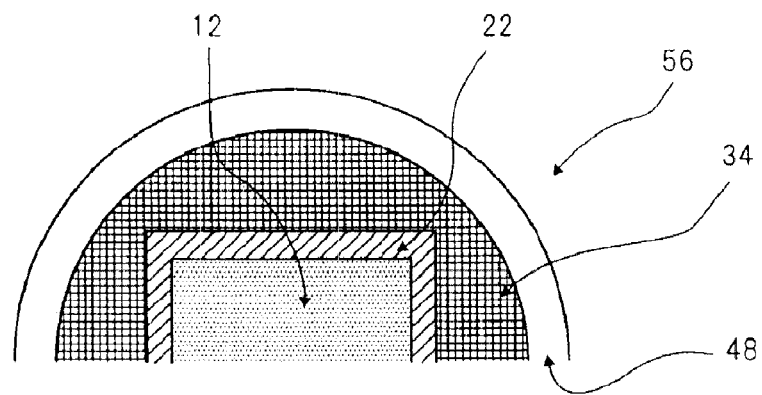
FIG. 34A is a top view showing the configuration of the piezoelectric actuator of Working Example 6.
Figure 34B:
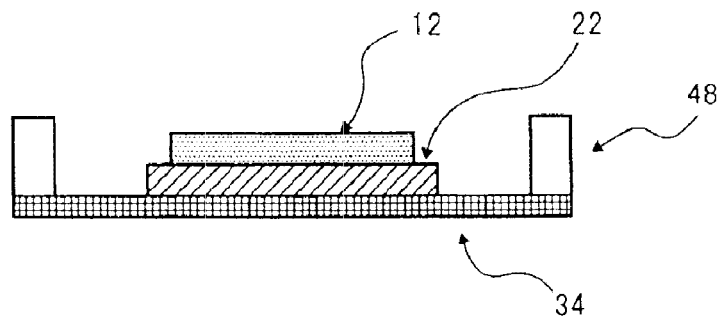
FIG. 34B is a vertical sectional view showing the configuration of the piezoelectric actuator of Working Example 6.

A piezoelectric actuator as shown in FIGS. 34A and 34B was fabricated as Working Example 6. Piezoelectric actuator 56 of this working example is provided with square piezoelectric element 12, square base 22, round vibration film 34, and round support member 48, the actual configuration of each part being as follows:

piezoelectric element 12: An upper electrode layer and a lower electrode layer each having a thickness of 8 μm were formed on the two sides of a piezoelectric plate having outer dimensions of 16×16 mm and a thickness of 50 μm (0.05 mm).

Base 22: Phosphor bronze with outside dimensions of 18×18 mm and a thickness of 30 μm (0.03 mm) was used.

Vibration film 34: A film made of urethane and having an outer diameter of φ 21 mm and a thickness of 80 μm was used.

Support member 48: SUS 304 having an outer diameter of φ 21 mm, an open inner diameter of φ 20 mm, and a thickness of 1.5 mm was used.

Results

| | |
|---|---|
| Fundamental resonant frequency: | 820 Hz |
| Maximum vibration speed amplitude: | 205 mm/s |
| Vibration speed ratio: | 0.83 |
| Vibration figure: | piston-type |
| Sound pressure level (1 kHz): | 86 dB |
| Sound pressure level (3 kHz): | 87 dB |
| Sound pressure level (5 kHz): | 92 dB |
| Sound pressure level (10 kHz): | 86 dB |
| Stability from shocks when dropped: | ○ |

As is clear from the above results, the piezoelectric actuator of the present working example was proved to have a resonant frequency lower than Working Example 1, and further, to enable realization of high sound pressure levels that exceed 80 dB in the 1-10 kHz band.

Working Example 7

Figure 35A:
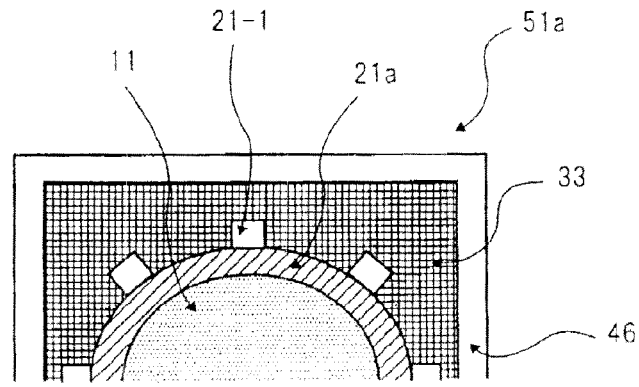
FIG. 35A is a top view showing the configuration of the piezoelectric actuator of Working Example 7.
Figure 35B:
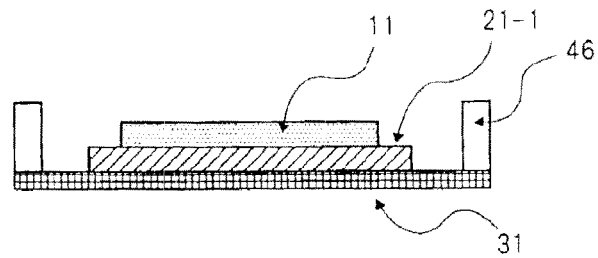
FIG. 35B is a vertical sectional view showing the configuration of the piezoelectric actuator of Working Example 7.

The piezoelectric actuator of the fifth embodiment (see also FIG. 13) was fabricated as Working Example 7 as shown in FIGS. 35A and 35B. Piezoelectric actuator 51a of the present working example was provided with eight beams 21-1 on base 21.

The actual configuration of each part is as follows:

Piezoelectric element 11: Identical to Working Example 1

Base 21a: The thickness and material were identical to base 20 of Working Example 1.

Beams 21-1: Eight beams 21-1, each having a beam width of 2 mm (uniform width) and a length of 1 mm, were formed radially and at equal intervals.

Main body 21-2: Outer diameter φ 18 mm

Vibration film 31: Identical to Working Example 1

Support member 46: Identical to Working Example 1

Results

| | |
|---|---|
| Fundamental resonant frequency: | 825 Hz |
| Maximum vibration speed amplitude: | 275 mm/s |
| Vibration speed ratio: | 0.84 |
| Vibration figure: | piston-type |
| Sound pressure level (1 kHz): | 85 dB |
| Sound pressure level (3 kHz): | 90 dB |
| Sound pressure level (5 kHz): | 97 dB |
| Sound pressure level (10 kHz): | 92 dB |
| Stability from shocks when dropped: | ○ |

As is clear from the above results, the piezoelectric actuator of the present working example was proven to provide a greater reduction of the fundamental resonant frequency than Working Example 1, and further, to have higher sound pressure levels in the range of 1-10 kHz.

Working Example 8

Figure 36A:
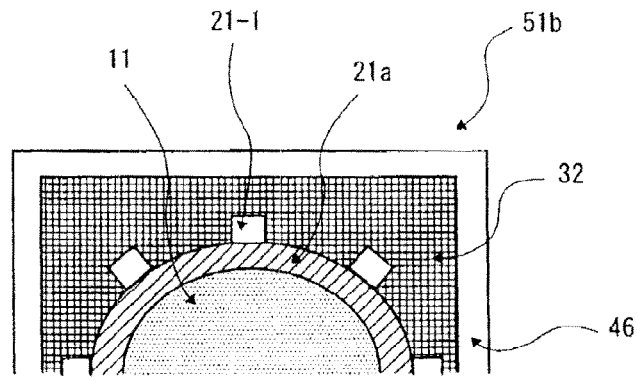
FIG. 36A is a top view showing the configuration of the piezoelectric actuator of Working Example 8.
Figure 36B:
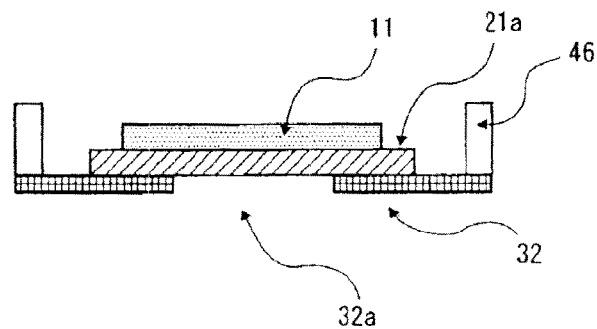
FIG. 36B is a vertical sectional view showing the configuration of the piezoelectric actuator of Working Example 8.

A piezoelectric actuator such as shown in FIGS. 36A and 36B was fabricated as Working Example 8. Piezoelectric actuator 51b of the present working example is configured as a modification of the above-described Working Example 7, and in place of vibration film 31, is provided with vibration film 32 in which aperture 32a is formed. The configuration is otherwise the same as Working Example 7.

The actual configuration of each part is as follows:
Piezoelectric element 11: Identical to Working Example 1
Base 21a: Identical to Working Example 7
Vibration film 32: Outer diameter=φ 22 mm; inner diameter (aperture diameter)=φ 17 mm (Thickness and material are identical to vibration film 31 of Working Example 9)
Support member 46: Identical to Working Example 1
Aperture 32a is formed in the center of vibration film 32.
Results

| | |
|---|---|
| Fundamental resonant frequency: | 855 Hz |
| Maximum vibration speed amplitude: | 310 mm/s |
| Vibration speed ratio: | 0.86 |
| Vibration figure: | piston-type |
| Sound pressure level (1 kHz): | 88 dB |
| Sound pressure level (3 kHz): | 95 dB |
| Sound pressure level (5 kHz): | 103 dB |
| Sound pressure level (10 kHz): | 99 dB |
| Stability from shocks when dropped: | ○ |

As is clear from the above results, the piezoelectric actuator of the present working example was proven to realize a greater reduction of the fundamental resonant frequency than Working Example 1, and further, to have higher sound pressure levels in the range of 1-10 kHz.

Working Example 9

Figure 26A:
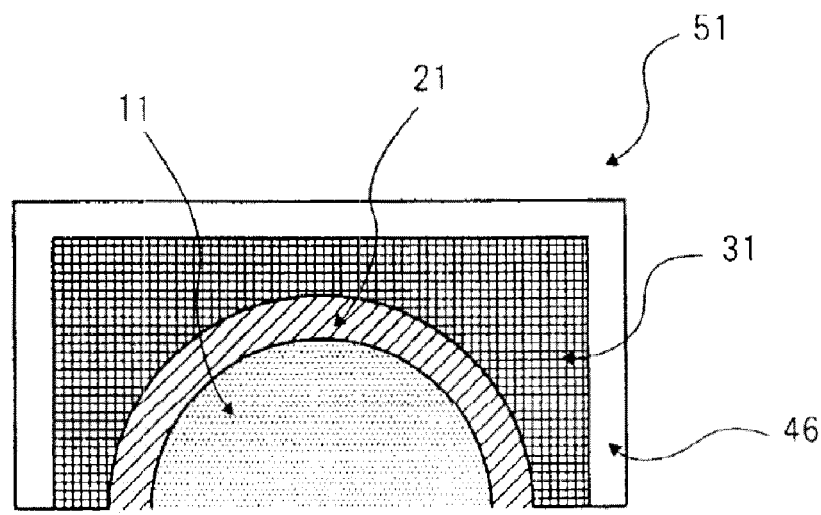
FIG. 26A is a top view showing the configuration of the piezoelectric actuator of Working Example 1.
Figure 26B:
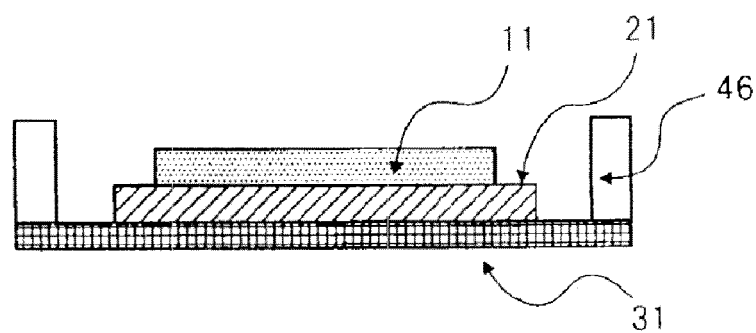
FIG. 26B is a vertical sectional view showing the configuration of the piezoelectric actuator of Working Example 1.
Figure 37:
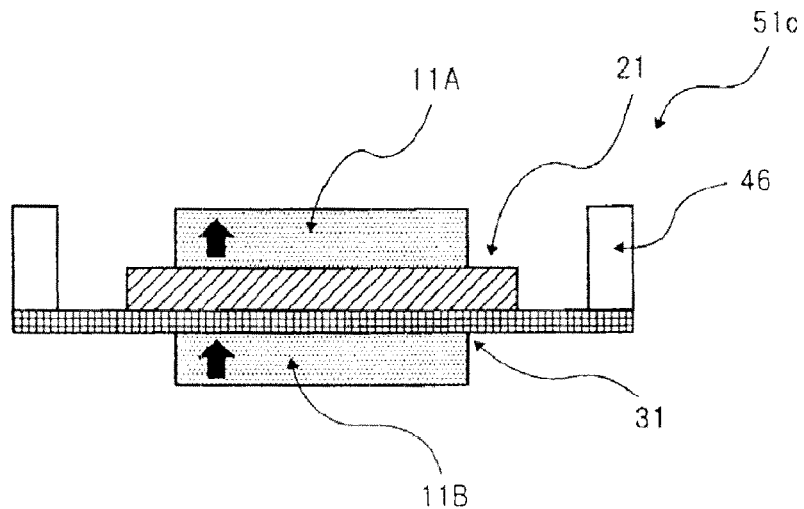
FIG. 37 is a vertical sectional view showing the configuration of the piezoelectric actuator of Working Example 9.

Bimorph piezoelectric actuator 51c as shown in FIG. 37 was fabricated as Working Example 9. Piezoelectric actuator 51c of the present working example was made to function as a bimorph actuator by additionally arranging piezoelectric element 11B on the rear surface of vibration film 31 of piezoelectric actuator 51 of Working Example 1 (see FIGS. 26A and 26B). Essentially, piezoelectric element 11b is attached to the lower surface side of base 21 with vibration film 31 interposed as shown in the figure.

The actual configuration of each part is as follows:
Piezoelectric element 11A: Identical to piezoelectric element 10 of Working Example 1.
Piezoelectric element 11B: The configuration is fundamentally identical to piezoelectric element 11 (however, piezoelectric element 11B is configured to perform the opposite operation of piezoelectric element 11A).
Base 21: Identical to Working Example 1
Vibration film 31: Identical to Working Example 1
Support member 46: Identical to Working Example 1
Results

| | |
|---|---|
| Fundamental resonant frequency: | 897 Hz |
| Maximum vibration speed amplitude: | 360 mm/s |
| Vibration speed ratio: | 0.83 |
| Vibration figure: | piston-type |
| Sound pressure level (1 kHz): | 91 dB |
| Sound pressure level (3 kHz): | 93 dB |
| Sound pressure level (5 kHz): | 110 dB |
| Sound pressure level (10 kHz): | 107 dB |
| Stability from shocks when dropped: | ○ |

As is clear from the above results, the piezoelectric actuator of the present working example was proven to have higher sound pressure levels at 1-10 kHHz than Working Example 1.

Working Example 10

Figure 38:
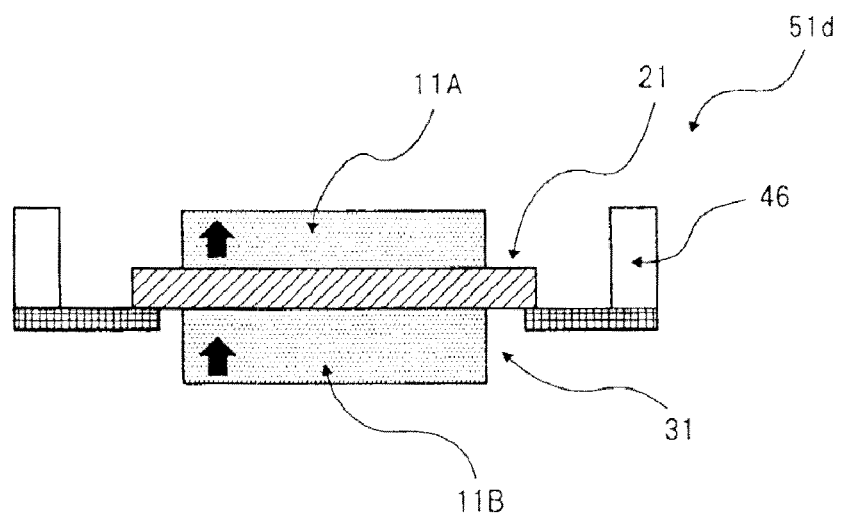
FIG. 38 is a vertical sectional view showing the configuration of the piezoelectric actuator of Working Example 10.

The piezoelectric actuator of the seventh embodiment (see also FIG. 18) was fabricated as shown in FIG. 38 as Working Example 10. In piezoelectric actuator 51d of the present working example, an aperture is formed in the vibration film and piezoelectric elements 11A and 11B are directly adhered to both surfaces of base 21.

The actual configuration of each part is as follows:
Piezoelectric element 11A: Identical to piezoelectric element 11 of Working Example 1
Piezoelectric element 11B: The configuration is fundamentally identical to piezoelectric element 11 (however, piezoelectric element 11B is configured to perform the opposite operation of piezoelectric element 11A).
Base 21: Identical to Working Example 1
Vibration film 32: Identical to Working Example 2 (An aperture is formed.)
Support member 46: Identical to Working Example 1
Results

| | |
|---|---|
| Fundamental resonant frequency: | 915 Hz |
| Maximum vibration speed amplitude: | 405 mm/s |
| Vibration speed ratio: | 0.83 |
| Vibration figure: | piston-type |
| Sound pressure level (1 kHz): | 94 dB |
| Sound pressure level (3 kHz): | 87 dB |
| Sound pressure level (5 kHz): | 108 dB |
| Sound pressure level (10 kHz): | 115 dB |
| Stability from shocks when dropped: | ○ |

As is clear from the results above, the piezoelectric actuator of the present working example was proven to have higher sound pressure levels in the range of 1-10 kHz than Working Example 1.

Working Example 11

A piezoelectric actuator was fabricated, as next described, as Working Example 11 (not shown in the figures). This piezoelectric actuator is an actuator in which the thickness of piezoelectric element 11B that was used in Working Example 10 has been altered and is thus a configuration in which the thicknesses of piezoelectric element 11A and piezoelectric element 11B are different. The configuration is otherwise identical to the piezoelectric actuator of Working Example 10.

The actual configuration of each part is as follows:

Piezoelectric element 11A: Identical to piezoelectric element 11 of Working Example 1

Piezoelectric element 11B: Upper electrode layer and lower electrode layer, each having a thickness of 8 μm, were formed on the two surfaces of a piezoelectric plate having outer diameter of φ 16 mm and a thickness of 100 μm (0.01 mm). (However, this piezoelectric element 11B is configured to perform an operation that is the reverse of piezoelectric element 11A.)

Base 21: Identical to Working Example 1

Vibration film 32: Identical to Working Example 2 (An aperture is formed)

Support member 46: Identical to Working Example 1

Results

| | |
|---|---|
| Fundamental resonant frequency: | 955 Hz |
| Maximum vibration speed amplitude: | 385 mm/s |
| Vibration speed ratio: | 0.84 |
| Vibration figure: | piston-type |
| Sound pressure level (1 kHz): | 93 dB |
| Sound pressure level (3 kHz): | 87 dB |
| Sound pressure level (5 kHz): | 108 dB |
| Sound pressure level (10 kHz): | 115 dB |
| Stability from shocks when dropped: | ○ |

As is clear from the results above, the piezoelectric actuator of the present working example was proven to have higher sound pressure levels in the range of 1-10 kHz than Working Example 1.

Working Example 12

Figure 39:
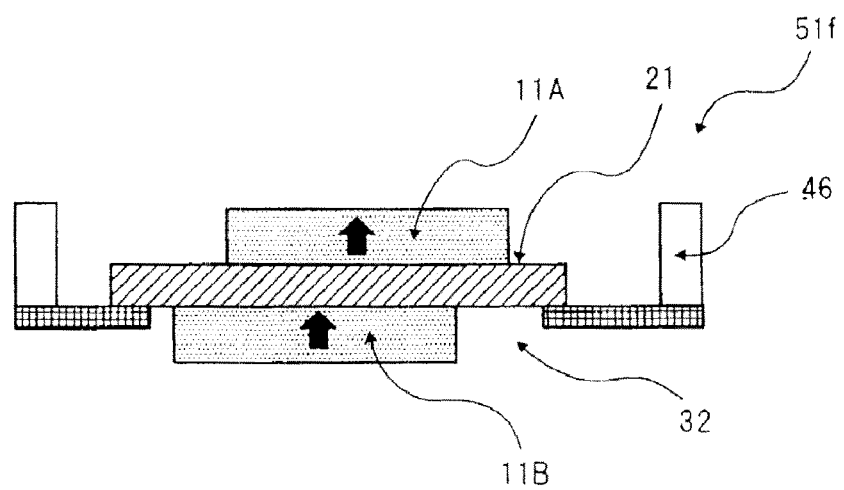
FIG. 39 is a vertical sectional view showing the configuration of the piezoelectric actuator of Working Example 12.

Piezoelectric actuator 51f as shown in FIG. 39 was fabricated as Working Example 12. This piezoelectric actuator has a configuration in which the position of joining with piezoelectric element 11B of Working Example 10 is altered, whereby piezoelectric element 11A and piezoelectric element 11B are not arranged concentrically and the symmetry is disrupted. The configuration is otherwise identical to the piezoelectric actuator of Working Example 10.

Results

| | |
|---|---|
| Fundamental resonant frequency: | 915 Hz |
| Maximum vibration speed amplitude: | 220 mm/s |
| Vibration speed ratio: | 0.81 |
| Vibration figure: | piston-type |
| Sound pressure level (1 kHz): | 85 dB |
| Sound pressure level (3 kHz): | 84 dB |
| Sound pressure level (5 kHz): | 105 dB |
| Sound pressure level (10 kHz): | 93 dB |
| Stability from shocks when dropped: | ○ |

As is clear from the results above, the piezoelectric actuator of the present working example is proven to enable realization of high sound pressure levels that exceed 80 dB in the range of 1-10 kHz.

Working Example 13

Figure 40:
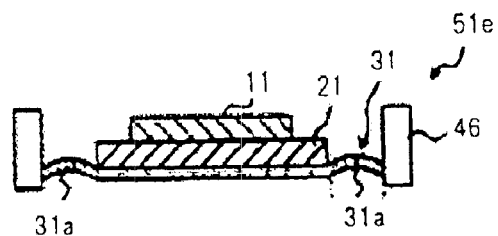
FIG. 40 is a vertical sectional view showing the configuration of the piezoelectric actuator of Working Example 13.

The piezoelectric actuator of the sixth embodiment (see also FIG. 17) as shown in FIG. 40 was fabricated as Working Example 13. Piezoelectric actuator 51e of the present working example has a configuration in which the vibration film shape of the piezoelectric actuator of Working Example 1 was altered. In other words, this piezoelectric actuator is provided with curved part 31a in the space between the base outer circumference and the support member inner circumference. The configuration is otherwise identical to that of the piezoelectric actuator of Working Example 1.

The actual configuration of each part is as follows:

Piezoelectric element 11: Identical to Working Example 1

Base 21: Identical to Working Example 1

Vibration film 31: Outer diameter=φ 21 mm, and inner diameter of vacant portion of frame=φ 17 mm (The thickness and material are identical to film 31 of Working Example 1.)

Curved part 31a: Radius of curvature=6 mm

Support member 46: Identical to Working Example 1

Results

| | |
|---|---|
| Fundamental resonant frequency: | 775 Hz |
| Maximum vibration speed amplitude: | 220 mm/s |
| Vibration speed ratio: | 0.81 |
| Vibration figure: | piston-type |
| Sound pressure level (1 kHz): | 81 dB |
| Sound pressure level (3 kHz): | 85 dB |
| Sound pressure level (5 kHz): | 93 dB |
| Sound pressure level (10 kHz): | 84 dB |
| Stability from shocks when dropped: | ○ |

As is clear from the above results, the piezoelectric actuator of the present working example was proven to enable lower resonant frequency than Working Example 1 and to enable high sound pressure levels that exceed 80 dB in the range of 1-10 kHz.

Working Example 14

A piezoelectric actuator was fabricated as next described (not shown in the figures), as Working Example 14. This piezoelectric actuator has a configuration in which the material of vibration film 31 of piezoelectric actuator 51 of Working Example 1 was altered (urethane→PET). The configuration is otherwise identical to that of the piezoelectric actuator of Working Example 1.

The actual configuration of each part is as follows:

Piezoelectric element 11: Identical to Working Example 1

Base 21: Identical to Working Example 1

Vibration film 31: The shape is identical to Working Example 1. PET with a thickness of 50 μm was used.

Support member 46: Identical to Working Example 1

Results

| | |
|---|---|
| Fundamental resonant frequency: | 885 Hz |
| Maximum vibration speed amplitude: | 230 mm/s |
| Vibration speed ratio: | 0.82 |
| Vibration figure: | piston-type |
| Sound pressure level (1 kHz): | 84 dB |
| Sound pressure level (3 kHz): | 86 dB |
| Sound pressure level (5 kHz): | 87 dB |
| Sound pressure level (10 kHz): | 95 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 15

A piezoelectric actuator, as next described (not shown in figures), was fabricated as Working Example 15. This piezoelectric actuator has a configuration that alters the material of base 21 of piezoelectric actuator 51 of Working Example 1 and that uses a PET film for vibration film 31. The configuration is otherwise identical to the piezoelectric actuator of Working Example 1.

The actual configuration of each part is as follows:
Piezoelectric element 11: Identical to Working Example 1
Base 21: The shape is identical to Working Example 1. A 42 alloy having thickness of 40 μm was used.
Vibration film 31: PET with a thickness of 50 μm was used.
Support member 46: Identical to Working Example 1
Results

| | |
|---|---|
| Fundamental resonant frequency: | 865 Hz |
| Maximum vibration speed amplitude: | 220 mm/s |
| Vibration speed ratio: | 0.83 |
| Vibration figure: | piston-type |
| Sound pressure level (1 kHz): | 83 dB |
| Sound pressure level (3 kHz): | 86 dB |
| Sound pressure level (5 kHz): | 86 dB |
| Sound pressure level (10 kHz): | 92 dB |
| Stability from shocks when dropped: | ○ |

As is clear from the above results, the piezoelectric actuator of the present working example was proven to enable high sound pressure levels exceeding 80 dB in the range of 1-10 kHz.

Working Example 16

A piezoelectric actuator was fabricated, as next described (not shown in figures), as Working Example 16. This piezoelectric actuator has a configuration in which the material of the adhesive used in Working Example 1 was altered to an acrylic adhesive. The configuration is otherwise identical to Working Example 1.
Results

| | |
|---|---|
| Fundamental resonant frequency: | 841 Hz |
| Maximum vibration speed amplitude: | 205 mm/s |
| Vibration speed ratio: | 0.83 |
| Vibration figure: | piston-type |
| Sound pressure level (1 kHz): | 82 dB |
| Sound pressure level (3 kHz): | 87 dB |
| Sound pressure level (5 kHz): | 93 dB |
| Sound pressure level (10 kHz): | 88 dB |
| Stability from shocks when dropped: | ○ |

As is clear from the results above, the piezoelectric actuator of this working example was proven to enable high sound pressure levels that exceed 80 dB in the range of 1-10 kHz.

Working Example 17

A piezoelectric actuator was fabricated, as next described (not shown in the figures), as Working Example 17. This piezoelectric actuator has a configuration in which the material of support member 46 used in Working Example 1 was altered to brass. The configuration is otherwise identical to the piezoelectric actuator of Working Example 1.
Results

| | |
|---|---|
| Fundamental resonant frequency: | 850 Hz |
| Maximum vibration speed amplitude: | 215 mm/s |
| Vibration speed ratio: | 0.84 |
| Vibration figure: | piston-type |
| Sound pressure level (1 kHz): | 83 dB |
| Sound pressure level (3 kHz): | 87 dB |
| Sound pressure level (5 kHz): | 89 dB |
| Sound pressure level (10 kHz): | 90 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 18

A piezoelectric actuator was fabricated, as next described (not shown in the figures), as Working Example 18. This piezoelectric actuator has a configuration in which the thickness of support member 46 used in Working Example 1 was altered to 1 mm. The configuration is otherwise identical to the piezoelectric actuator of Working Example 1.
Results

| | |
|---|---|
| Fundamental resonant frequency: | 848 Hz |
| Maximum vibration speed amplitude: | 210 mm/s |
| Vibration speed ratio: | 0.82 |
| Vibration figure: | piston-type |
| Sound pressure level (1 kHz): | 82 dB |
| Sound pressure level (3 kHz): | 86 dB |
| Sound pressure level (5 kHz): | 90 dB |
| Sound pressure level (10 kHz): | 89 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 19

A piezoelectric actuator was fabricated, as next described (not shown in the figures), as Working Example 19. This piezoelectric actuator has a configuration in which piezoelectric plate 11 that was used in Working Example 1 was altered to a barium titanate ceramic. The configuration is otherwise identical to the piezoelectric actuator of Working Example 1.
Results

| | |
|---|---|
| Fundamental resonant frequency: | 915 Hz |
| Maximum vibration speed amplitude: | 220 mm/s |
| Vibration speed ratio: | 0.84 |
| Vibration figure: | piston-type |
| Sound pressure level (1 kHz): | 84 dB |
| Sound pressure level (3 kHz): | 87 dB |
| Sound pressure level (5 kHz): | 92 dB |
| Sound pressure level (10 kHz): | 85 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 20

A piezoelectric actuator was fabricated, as next described (not shown in the figures), as Working Example 20. This piezoelectric actuator has a configuration in which the electrode material used in the piezoelectric plate of Working Example 1 was altered to silver. The configuration is otherwise identical to the piezoelectric actuator of Working Example 1.
Results

| | |
|---|---|
| Fundamental resonant frequency: | 865 Hz |
| Maximum vibration speed amplitude: | 210 mm/s |
| Vibration speed ratio: | 0.84 |
| Vibration figure: | piston-type |
| Sound pressure level (1 kHz): | 84 dB |
| Sound pressure level (3 kHz): | 87 dB |
| Sound pressure level (5 kHz): | 94 dB |
| Sound pressure level (10 kHz): | 88 dB |
| Stability from shocks when dropped: | ○ |

As is clear from the results above, the piezoelectric actuator of the present working example was proven to enable high sound pressure levels that exceed 80 dB at 1-10 kHz.

Working Example 21

A piezoelectric actuator was fabricated, as next described (not shown in the figures), as Working Example 21. This piezoelectric actuator has a configuration in which the electrode thickness on piezoelectric plate that was used in Working Example 1 was altered to 5 μm. The configuration is otherwise identical to the piezoelectric actuator of Working Example 1.
Results

| | |
|---|---|
| Fundamental resonant frequency: | 845 Hz |
| Maximum vibration speed amplitude: | 220 mm/s |
| Vibration speed ratio: | 0.87 |
| Vibration figure: | piston-type |
| Sound pressure level (1 kHz): | 83 dB |
| Sound pressure level (3 kHz): | 86 dB |
| Sound pressure level (5 kHz): | 93 dB |
| Sound pressure level (10 kHz): | 89 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 22

Figure 41:
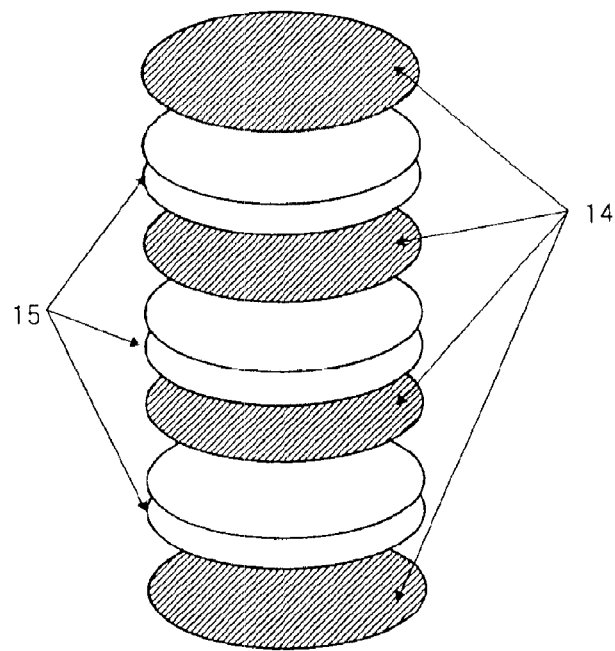
FIG. 41 is an exploded perspective view showing the piezoelectric element that is used in Working Example 22.
Figure 42:
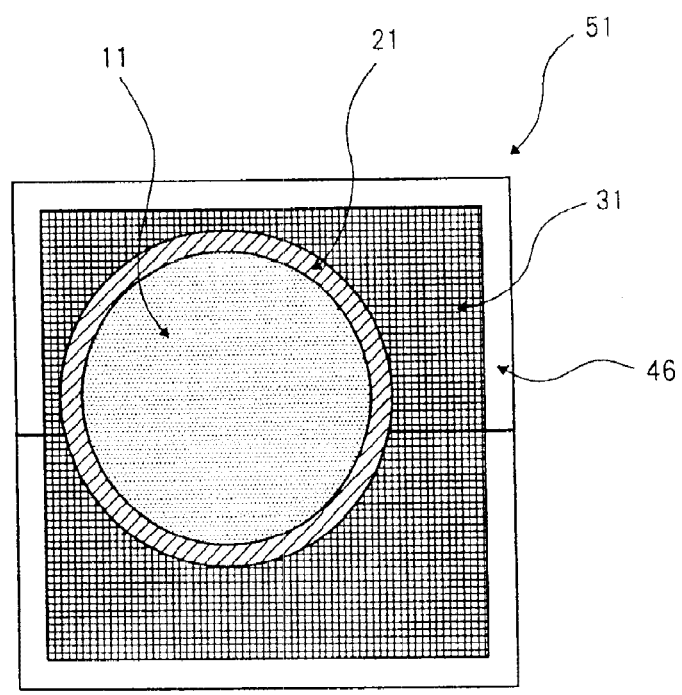
FIG. 42 shows the configuration of the piezoelectric actuator of Working Example 23.

A piezoelectric actuator was fabricated, as next described (not shown in the figures), as Working Example 22. This piezoelectric actuator has a configuration in which the piezoelectric plate used in Working Example 1 was altered to a laminated ceramic element. The configuration is otherwise identical to the piezoelectric actuator of Working Example 1. In addition, the laminated ceramic element in Working Example 22 is an element in which piezoelectric layers and electrode layers are alternately stacked as shown in FIG. 41, and has a configuration in which three piezoelectric layers having a thickness of 50 μm and four electrode layers having a thickness of 3 μm are alternately stacked. A lead titanate zirconate ceramic was used as the piezoelectric layer material, and a silver-palladium alloy (70%:30% weight ratio) was used as the electrode material.
Results

| | |
|---|---|
| Fundamental resonant frequency: | 905 Hz |
| Maximum vibration speed amplitude: | 250 mm/s |
| Vibration speed ratio: | 0.81 |
| Vibration figure: | piston-type |
| Sound pressure level (1 kHz): | 87 dB |
| Sound pressure level (3 kHz): | 88 dB |
| Sound pressure level (5 kHz): | 99 dB |
| Sound pressure level (10 kHz): | 93 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 23

A piezoelectric actuator was fabricated, as next described, as Working Example 23. This piezoelectric actuator has a configuration in which the position of arranging the piezoelectric plate used in Working Example 1 was altered, and in which symmetry is altered by making the center positions of the support member and the piezoelectric element other than concentric. The configuration is otherwise identical to the piezoelectric actuator of Working Example 1.
Results

| | |
|---|---|
| Fundamental resonant frequency: | 905 Hz |
| Maximum vibration speed amplitude: | 205 mm/s |
| Vibration speed ratio: | 0.81 |
| Vibration figure: | piston-type |
| Sound pressure level (1 kHz): | 85 dB |
| Sound pressure level (3 kHz): | 86 dB |
| Sound pressure level (5 kHz): | 87 dB |
| Sound pressure level (10 kHz): | 91 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 24

Figure 43:
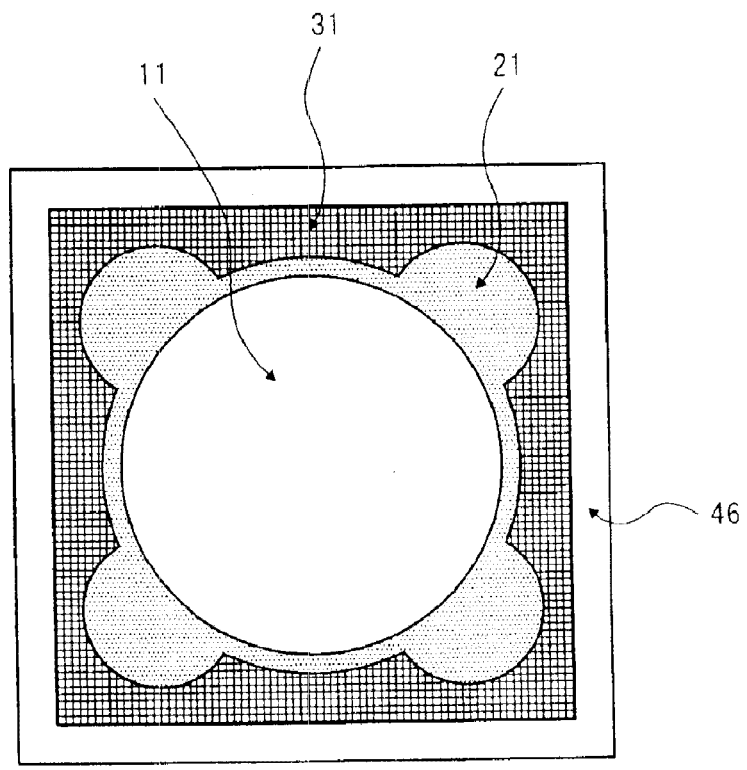
FIG. 43 is a vertical sectional view showing the configuration of the piezoelectric actuator of Working Example 24.

A piezoelectric actuator was fabricated, as next described, as Working Example 24. This piezoelectric actuator has a configuration as shown in FIG. 43 in which the base shape used in Working Example 1 was altered, and in which the symmetry was altered by changing the base shape. The configuration is otherwise identical to the piezoelectric actuator of Working Example 1.
Results

| | |
|---|---|
| Fundamental resonant frequency: | 945 Hz |
| Maximum vibration speed amplitude: | 235 mm/s |

-continued

| | |
|---|---|
| Vibration speed ratio: | 0.84 |
| Vibration figure: | piston-type |
| Sound pressure level (1 kHz): | 87 dB |
| Sound pressure level (3 kHz): | 85 dB |
| Sound pressure level (5 kHz): | 88 dB |
| Sound pressure level (10 kHz): | 93 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 25

Figure 44:
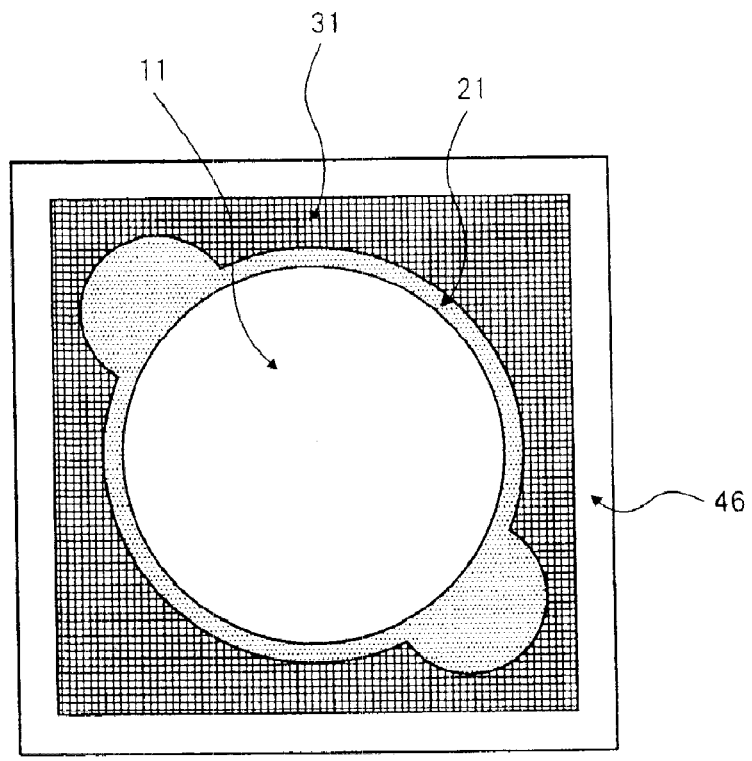
FIG. 44 is a vertical sectional view showing the configuration of the piezoelectric actuator of Working Example 25.

A piezoelectric actuator was fabricated, as next described, as Working Example 25. This piezoelectric actuator has a configuration as shown in FIG. 44 in which the base shape used in Working Example 1 was altered, and in which the symmetry was altered by changing the base shape. The configuration is otherwise identical to the piezoelectric actuator of Working Example 1.
Results

| | |
|---|---|
| Fundamental resonant frequency: | 905 Hz |
| Maximum vibration speed amplitude: | 215 mm/s |
| Vibration speed ratio: | 0.81 |
| Vibration figure: | piston-type |
| Sound pressure level (1 kHz): | 83 dB |
| Sound pressure level (3 kHz): | 84 dB |
| Sound pressure level (5 kHz): | 87 dB |
| Sound pressure level (10 kHz): | 88 dB |
| Stability from shocks when dropped: | ○ |

As is clear from the results above, the piezoelectric actuator of the present working example was proven to enable high sound pressure levels that exceed 80 dB in the range of 1-10 kHz.

Working Example 26

Figure 45:
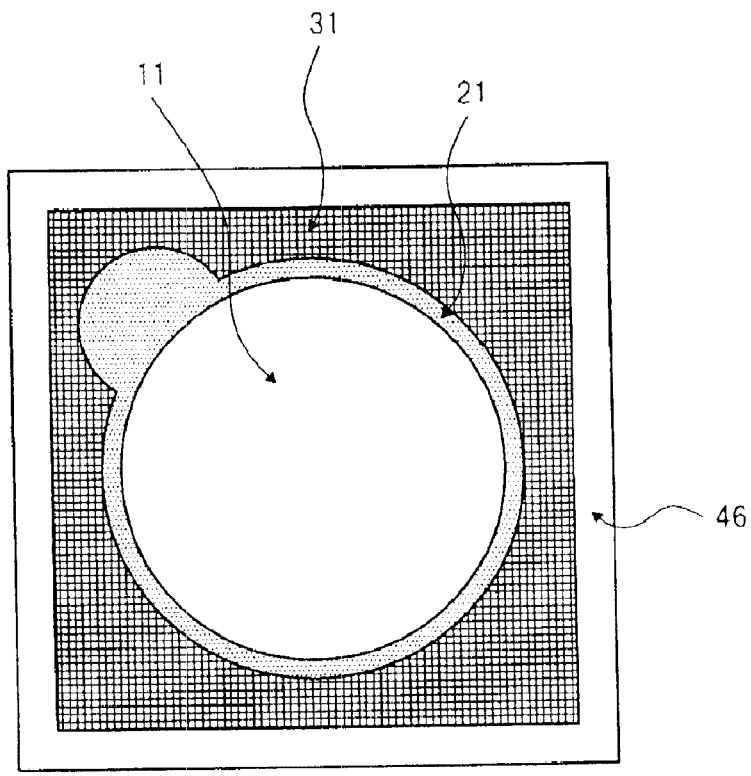
FIG. 45 is a vertical sectional view showing the configuration of the piezoelectric actuator of Working Example 26.

A piezoelectric actuator was fabricated, as next described, as Working Example 26. This piezoelectric actuator has a configuration as shown in FIG. 45 in which the base shape used in Working Example 1 was altered, and in which the symmetry was altered by changing the base shape. The configuration is otherwise identical to the piezoelectric actuator of Working Example 1.
Results

| | |
|---|---|
| Fundamental resonant frequency: | 880 Hz |
| Maximum vibration speed amplitude: | 205 mm/s |
| Vibration speed ratio: | 0.83 |
| Vibration figure: | piston-type |
| Sound pressure level (1 kHz): | 82 dB |
| Sound pressure level (3 kHz): | 86 dB |
| Sound pressure level (5 kHz): | 99 dB |
| Sound pressure level (10 kHz): | 107 dB |
| Stability from shocks when dropped: | ○ |

As is clear from the results above, the piezoelectric actuator of the present working example was proven to enable high sound pressure levels that exceed 80 dB in the range of 1-10 kHz.

Comparative Example 2

Figure 46:
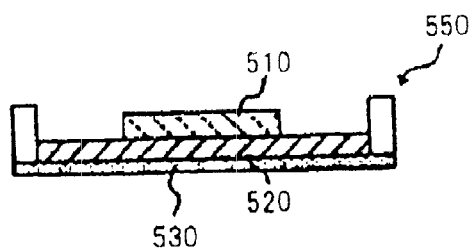
FIG. 46 is a vertical sectional view showing the configuration of the piezoelectric actuator of Comparative Example 2.

Piezoelectric actuator 550' as shown in FIG. 46 was fabricated as Comparative Example 2. This piezoelectric actuator has a configuration in which vibration film 530 (identical to film 31 of Working Example 1) was adhered to the rear surface of base 520 of the actuator of Comparative Example 1 (see FIG. 28). As a result, the configuration is identical to Comparative Example 1 with the exception of vibration film 530.
Results

| | |
|---|---|
| Resonant frequency: | 1498 Hz |
| Sound pressure level: | 69 dB |

Explanation next regards examples in which an acoustic element is incorporated in a portable telephone with reference to Working Examples 14-17 and Comparative Example 4.

Working Example 27

Portable Telephone 1

Figure 47:
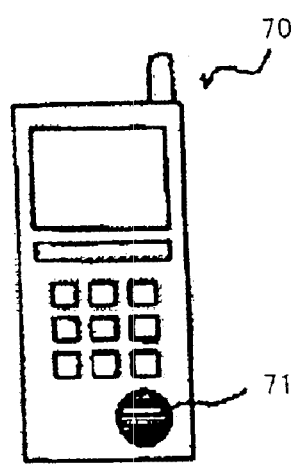
FIG. 47 is an elevation view showing an example of a portable telephone in which the piezoelectric actuator according to the present invention is incorporated.

Portable telephone 70 as shown in FIG. 47 was prepared as Working Example 27, and piezoelectric actuator 51 of Working Example 1 (see FIGS. 26A and 26B) was incorporated inside the case. More specifically, a configuration was adopted in which piezoelectric actuator 51 was adhered to the side surface inside the case of speaker 71 of the portable telephone.
Evaluation The sound pressure level and frequency characteristics were measured by means of a microphone placed at a position 10 cm from the element. In addition, an experiment was further conducted regarding shocks when dropped.
Results

| | |
|---|---|
| Resonant frequency: | 775 Hz |
| Sound pressure level (1 kHz): | 85 dB |
| Sound pressure level (3 kHz): | 84 dB |
| Sound pressure level (5 kHz): | 90 dB |
| Sound pressure level (10 kHz): | 86 dB |
| Test of shocks when dropped: | Even after being dropped 5 times, cracking was not observed in the piezoelectric element, and the sound pressure level (1 kHz) that was measured following the experiment was 84 dB. |

Working Example 28

Portable Telephone 2

As in the above-described embodiment, piezoelectric actuator 52 of Working Example 2 (see FIG. 20) was incorporated in portable telephone 70 as Working Example 28. The evaluation was the same as in the above-described embodiment.
Results

| | |
|---|---|
| Resonant frequency: | 795 Hz |
| Sound pressure level (1 kHz): | 86 dB |

-continued

| | |
|---|---|
| Sound pressure level (3 kHz): | 86 dB |
| Sound pressure level (5 kHz): | 92 dB |
| Sound pressure level (10 kHz): | 85 dB |
| Test of shocks when dropped: | Even after being dropped 5 times, cracking was not observed in the piezoelectric element, and the sound pressure level (1 kHz) that was measured following the experiment was 86 dB. |

Working Example 29

Portable Telephone 3

As in the above-described embodiment, piezoelectric actuator 53 of Working Example 3 (see FIGS. 31A and 31B) was incorporated in portable telephone 70 as Working Example 29. The evaluation was the same as in the above-described embodiment.
Results

| | |
|---|---|
| Resonant frequency: | 725 Hz |
| Sound pressure level (1 kHz): | 83 dB |
| Sound pressure level (3 kHz): | 85 dB |
| Sound pressure level (5 kHz): | 86 dB |
| Sound pressure level (10 kHz): | 84 dB |
| Test of shocks when dropped: | Even after dropping 5 times, cracking was not observed in the piezoelectric element, and the sound pressure level (1 kHz) measured following the experiment was 82 dB. |

Working Example 30

Portable Telephone 4

As in the above-described embodiment, piezoelectric actuator 54 of Working Example 3 (see FIGS. 32A and 32B) was incorporated in portable telephone 70 as Working Example 30. The evaluation was the same as in the above-described embodiment.
Results

| | |
|---|---|
| Resonant frequency: | 765 Hz |
| Sound pressure level (1 kHz): | 84 dB |
| Sound pressure level (3 kHz): | 86 dB |
| Sound pressure level (5 kHz): | 95 dB |
| Sound pressure level (10 kHz): | 87 dB |
| Test of shocks when dropped: | Even after dropping 5 times, cracking was not observed in the piezoelectric element, and the sound pressure level (1 kHz) measured following the experiment was 83 dB. |

Comparative Example 3

Portable Telephone 5

As in the above-described embodiment, piezoelectric actuator 550' of Comparative Example 2 (see FIG. 46) was incorporated in portable telephone 70 as Comparative Example 3.
Evaluation:
The sound pressure level and frequency characteristics were measured by means of a microphone placed at a position 10 cm from the element. In addition, an experiment was further conducted regarding shocks when dropped.
Results

| | |
|---|---|
| Resonant frequency: | 1520 Hz |
| Sound pressure level: | 66 dB |
| Frequency characteristics: | Exhibits extremely uneven characteristics. |
| Test of shocks when dropped: | After being dropped 2 times, cracking was observed in the piezoelectric element, and measurement of the sound pressure level at this time showed 50 dB or less. |

Comparative Example 4

Electromagnetic Actuator

Figure 48:
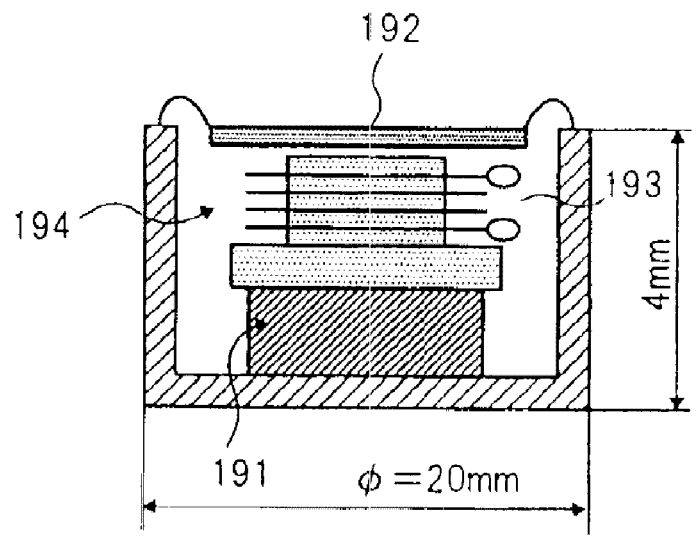
FIG. 48 is a sectional view showing the configuration of a conventional acoustic element that was prepared as Comparative Example 4.

An electromagnetic acoustic element as shown in FIG. 48 was fabricated as Comparative Example 4. The acoustic element shown in FIG. 48 includes permanent magnet 191, voice coil 193, and vibration plate 192; electromagnetic force being generated by current that flows by way of electric terminal 194 to the voice coil, the generated electromagnetic force causing repeated attraction and repulsion of vibration plate 192 to generate sound. The external shape of this acoustic element is as follows: External shape: a circle of diameter φ 20 mm with thickness of 4.0 mm.
Evaluation:
The sound pressure level and frequency characteristics for the acoustic element configured in this way were measured by means of a microphone placed at a position 30 cm from the element.
Results

| | |
|---|---|
| Resonant frequency: | 810 Hz |
| Sound pressure level (1 kHz): | 83 dB |
| Sound pressure level (3 kHz): | 85 dB |
| Sound pressure level (5 kHz): | 84 dB |
| Sound pressure level (10 kHz): | 81 dB |

Working Example 31

PC

A notebook personal computer (not shown) that incorporates the piezoelectric actuator of Working Example 1 was fabricated as Working Example 31. More specifically, piezoelectric actuator 51 was adhered to the side surface in the case of the personal computer, similar to cases of a portable telephone.
Evaluation:
The sound pressure level and frequency characteristics were measured by means of a microphone placed at a position 30 cm from the element. In addition, an experiment was further conducted regarding shocks when dropped.
Results

| | |
|---|---|
| Resonant frequency: | 815 Hz |
| Sound pressure level (1 kHz): | 81 dB |

-continued

| | |
|---|---|
| Sound pressure level (3 kHz): | 85 dB |
| Sound pressure level (5 kHz): | 89 dB |
| Sound pressure level (10 kHz): | 84 dB |
| Test of shocks when dropped: | Even after being dropped 5 times, cracking was not observed in the piezoelectric element, and the sound pressure level (1 kHz) measured following the experiment was 80 dB. |

Working Example 32

A piezoelectric actuator as next described was fabricated as Working Example 32. This piezoelectric actuator is a miniaturized form of piezoelectric actuator 51 of Working Example 1.

The actual configuration of each part is as follows:

Piezoelectric element 14: The outer diameter is φ 12 mm (a 4-mm reduction) but the thickness and material are identical to Working Example 1.

Base 24: The outer diameter is φ 14 mm (a 4-mm reduction) but the thickness and material are identical to Working Example 1.

Vibration film 24: The outer diameter is φ 18 mm (a 4-mm reduction) but the thickness and material are identical to Working Example 1.

Support member 49: The outer diameter is φ 18 mm (a 4-mm reduction) but the inner diameter of φ 16 mm, the thickness and the material are identical to Working Example 1.

Results

| | |
|---|---|
| Fundamental resonant frequency: | 920 Hz |
| Maximum vibration speed amplitude: | 205 mm/s |
| Vibration speed ratio: | 0.81 |
| Vibration figure: | piston-type |
| Sound pressure level (1 kHz): | 81 dB |
| Sound pressure level (3 kHz): | 82 dB |
| Sound pressure level (5 kHz): | 85 dB |
| Sound pressure level (10 kHz): | 81 dB |
| Stability from shocks when dropped: | ○ |

As is clear from the above results, the piezoelectric actuator of the present working example was proven to enable high sound pressure levels that exceed 80 db in the range of 1-10 kHz.

Working Example 33

Inspection and Testing of Support Body Outline Shape

Figure 49A:
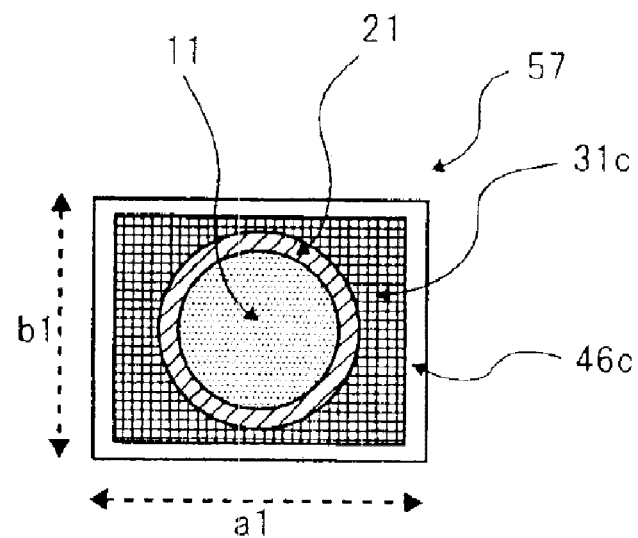
FIG. 49A is a top view showing the configuration of the piezoelectric actuator of Working Example 33.
Figure 49A:
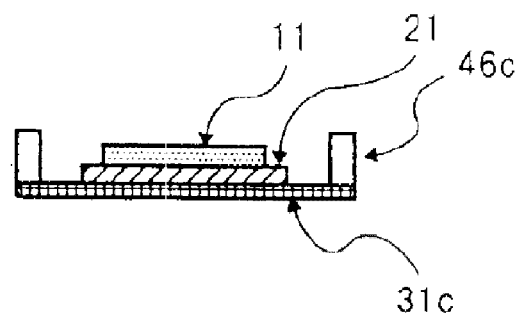
Figure 49B:
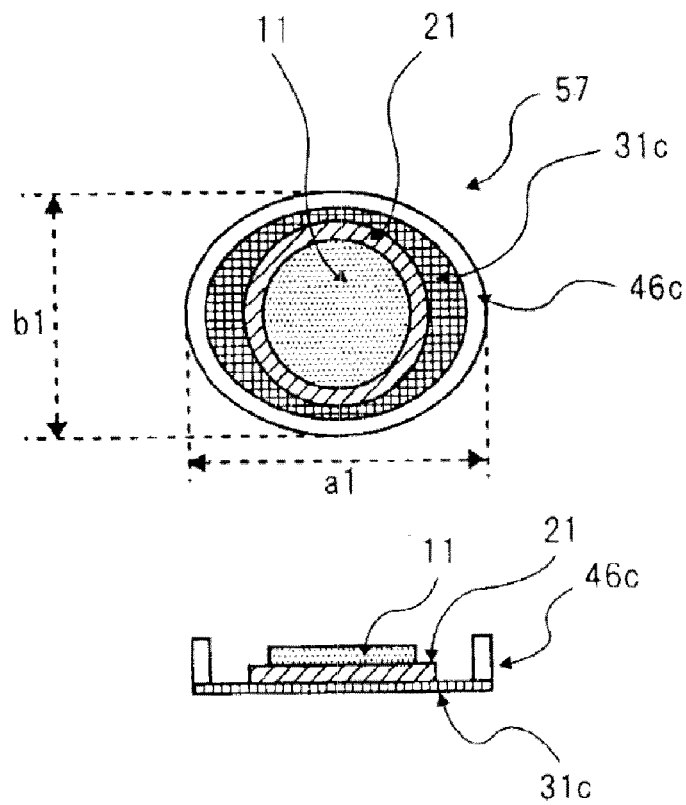
FIG. 49B is a vertical sectional view showing the configuration of the piezoelectric actuator of Working Example 33.

The action and effect realized by the present invention was inspected by altering the shape, material, and position of arrangement of each part in Working Example 1 to Working Example 26, but from this point, explanation regards the results of stepwise alteration of only the shape of one or two parts from among piezoelectric element 11, base 21, vibration film 31, support member 46. Investigation will first focus on the relation of the support body outline shape and acoustic characteristics in Working Example 33. Piezoelectric actuator 57 of this working example that is shown in FIG. 49A and FIG. 49B has a configuration in which the shapes of the piezoelectric element and base remain fixed and the outline shapes of the support member and vibration film are altered, and the configuration is otherwise identical to Working Example 1.

The actual configuration of each part is as follows:

Piezoelectric element 11: Identical to Working Example 1 (outer diameter=φ 16 mm)

Base 21: Identical to Working Example 1 (outside diameter=φ 18 mm)

Vibration film 31c: A film was used that is made of urethane having a rectangular or oval shape having outer dimensions of major axis length a1+1 (mm) and minor axis length b1+1 (mm) and thickness of 80 μm. (For details regarding the shape refer to the table.)

Support member 46c: SUS304 was used that has a rectangular or oval shape having outer dimensions of major axis length a1+1 (mm) and minor axis length b1+1 (mm), inner dimensions of major axis length a1 (mm) and minor axis length b1 (mm) and a thickness of 1.5 mm.

The fundamental resonant frequency and sound pressure levels resulting from alteration of the outline shape of the support body are shown in Table 7 below:

TABLE 7

| No. | Major axis length a1 (mm) | Minor axis length b1 (mm) | b1/a1 | Shape | Fundamental resonant frequency (Hz) | Sound pressure level (1 kHz) (dB) | Sound pressure level (3 kHz) (dB) | Sound pressure level (5 kHz) (dB) | Sound pressure level (10 kHz) (dB) |
|---|---|---|---|---|---|---|---|---|---|
| 20-1 | 45 | 21 | 0.47 | Rectangle | 655 | 86 | 84 | 75 | 73 |
| 20-2 | 42 | 21 | 0.5 | | 700 | 86 | 89 | 84 | 80 |
| 20-3 | 35 | 21 | 0.6 | | 735 | 85 | 90 | 88 | 82 |
| 20-4 | 30 | 21 | 0.7 | | 760 | 83 | 95 | 91 | 83 |
| 20-5 | 27 | 21 | 0.78 | | 795 | 84 | 93 | 93 | 84 |
| 20-6 | 25 | 21 | 0.84 | | 815 | 83 | 85 | 96 | 85 |
| 20-7 | 21 | 19 | 0.90 | | 895 | 81 | 86 | 95 | 86 |
| 20-8 | 21 | 20 | 0.95 | | 875 | 82 | 86 | 94 | 86 |
| 20-9 | 21 | 21 | 1.0 | Square | 854 | 83 | 88 | 95 | 87 |
| 20-11 | 45 | 21 | 0.47 | Oval | 675 | 86 | 84 | 77 | 76 |
| 20-12 | 42 | 21 | 0.5 | | 710 | 85 | 85 | 84 | 80 |
| 20-13 | 35 | 21 | 0.6 | | 740 | 84 | 84 | 86 | 84 |
| 20-14 | 30 | 21 | 0.7 | | 770 | 85 | 86 | 89 | 86 |
| 20-15 | 27 | 21 | 0.78 | | 810 | 83 | 86 | 92 | 86 |
| 20-16 | 25 | 21 | 0.84 | | 820 | 84 | 85 | 95 | 83 |
| 20-17 | 21 | 19 | 0.90 | | 910 | 82 | 87 | 94 | 85 |
| 20-18 | 21 | 20 | 0.95 | | 895 | 82 | 86 | 93 | 85 |

As can be seen from the results of Table 7, to achieve sound pressure levels of at least 80 dB in the band of 1-10 kHz, the ratio b1/a1 of the lengths of the major axis and minor axis of both rectangles and ovals should be adjusted to 0.5 or greater. Further, when the reproduction of sound pressure levels of low areas of 1 kHz or lower is a priority, the conditions shown in No. 20-2-No. 20-4, No. 20-11-No. 20-14 should be used. For example, when the reproduction of sound pressure at 3 kHz is a priority, the conditions shown in No. 20-3 to No. 20-5 should be used. As described hereinabove, in a piezoelectric actuator according to the present invention, adjusting the combination of the outline shapes in the piezoelectric element and support body enables reproduction of high sound pressure over a broad frequency band.

Working Example 34

Inspection and Testing of Piezoelectric Element Outline Shapes

Figure 50A:
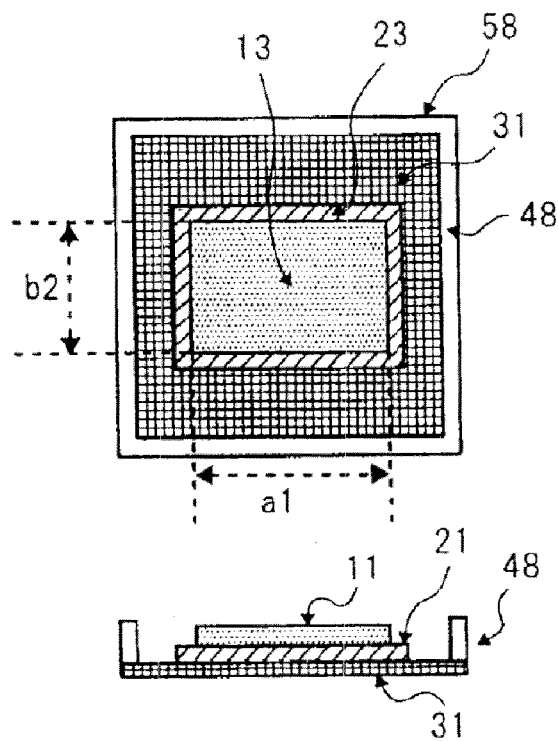
FIG. 50A is a top view showing the configuration of the piezoelectric actuator of Working Example 34.
Figure 50B:
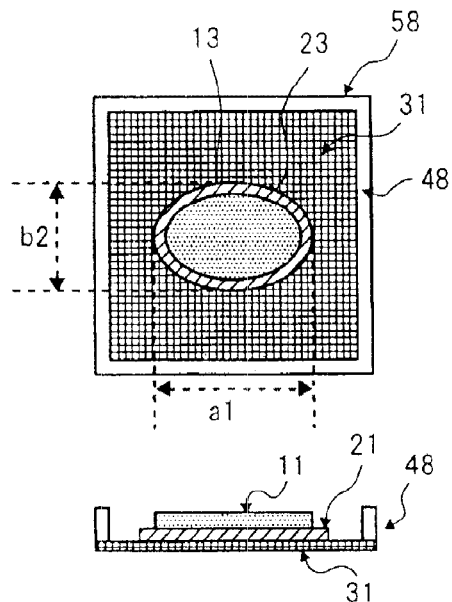
FIG. 50B is a vertical sectional view showing the configuration of the piezoelectric actuator of Working Example 34.

In Working Example 34, the relation between the piezoelectric element shape and the acoustic characteristics was inspected. Piezoelectric actuator 58 of the present working example that is shown in FIGS. 50A and 50B has a configuration in which the shapes of the support member and vibration film are fixed, and in which the outline shapes of the piezoelectric element and base are altered. The configuration is otherwise identical to that of Working Example 1 (see FIGS. 26A and 26B).

The actual configuration of each part is as follows:

Piezoelectric element 13: An upper electrode layer and a lower electrode layer, each having a thickness of 8 μm, were formed on a respective surfaces of the two surfaces of a piezoelectric plate having a rectangular or oval shape having outer dimensions with a major axis length of a2 (mm) and a minor axis length of b2 (mm) and a thickness of 50 μm (0.05 mm).

Base 23: Phosphor bronze was used having a thickness of 30 μm (0.03 mm) in a rectangular or oval shape having external dimensions with a major axis length of a2+2 (mm) and a minor axis length of b2+2 (mm).

Vibration film 31: A film made of urethane with outer dimensions of 21×21 mm and a thickness of 80 μm was used.

Support member 46: SUS 304 having outer dimensions of 21×21 mm and a square opening with inner dimensions of 20×20 mm and a thickness of 1.5 mm was used.

The fundamental resonant frequency F0 and sound pressure levels resulting from alteration of the outline shape of the piezoelectric element are shown in Table 8 below:

TABLE 8

| No. | Major axis length a1 (mm) | Minor axis length b1 (mm) | b1/a1 | Shape | Fundamental resonant frequency (Hz) | Sound pressure level (1 kHz) (dB) | Sound pressure level (3 kHz) (dB) | Sound pressure level (5 kHz) (dB) | Sound pressure level (10 kHz) (dB) |
|---|---|---|---|---|---|---|---|---|---|
| 21-1 | 16 | 6 | 0.38 | Rectangle | 720 | 80 | 76 | 69 | 79 |
| 21-2 | 16 | 8 | 0.5 | | 770 | 81 | 78 | 75 | 80 |
| 22-3 | 16 | 10 | 0.63 | | 805 | 81 | 81 | 84 | 82 |
| 22-4 | 16 | 12 | 0.75 | | 815 | 82 | 86 | 88 | 87 |
| 22-5 | 16 | 14 | 0.88 | | 840 | 83 | 87 | 93 | 84 |
| 22-6 | 17 | 16 | 0.94 | | 895 | 84 | 88 | 93 | 87 |
| 22-7 | 18 | 16 | 0.89 | | 910 | 86 | 89 | 93 | 86 |
| 22-8 | 16 | 6 | 0.38 | Oval | 715 | 76 | 74 | 77 | 77 |
| 22-9 | 16 | 8 | 0.5 | | 755 | 77 | 75 | 76 | 79 |
| 22-10 | 16 | 10 | 0.63 | | 795 | 81 | 80 | 82 | 86 |
| 22-11 | 16 | 12 | 0.75 | | 810 | 81 | 84 | 84 | 87 |
| 22-12 | 16 | 14 | 0.88 | | 830 | 82 | 85 | 86 | 87 |
| 22-13 | 17 | 16 | 0.94 | | 875 | 82 | 85 | 89 | 87 |
| 22-14 | 18 | 16 | 0.89 | | 890 | 83 | 87 | 93 | 86 |
| 22-15 | 16 | 16 | 1 | Circle | 854 | 83 | 88 | 95 | 87 |

As can be seen from the results of Table 8, to achieve sound pressure levels of at least 80 dB in the 1-10 kHz band, the ratio b1/a1 of the lengths of the major axis and minor axis should be adjusted to 0.6 or more for both rectangles and ovals. In addition, a shape having a high level of uniformity such as a circle or square is preferable because the sound pressure levels in the range of 1 kHz-10 kHz increase as b1/a1 approaches 1. As described hereinabove, in a piezoelectric actuator according to the present invention, adjusting the outline shape of the piezoelectric element enables reproduction of high sound pressure over a broad frequency band, and improvement of the acoustic characteristics is possible even under conditions in which the external size and shape are limited.

Working Example 35

Figure 51A:
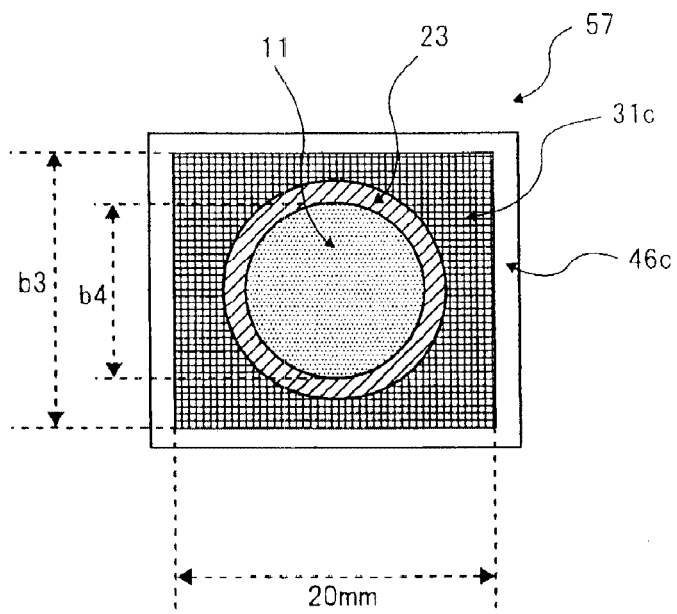
FIG. 51A is a top view showing the configuration of the piezoelectric actuator of Working Example 35.
Figure 51B:
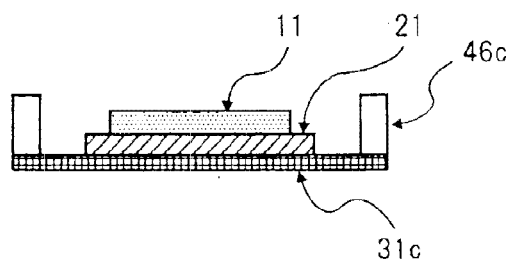
FIG. 51B is a vertical sectional view showing the configuration of the piezoelectric actuator of Working Example 35.

Inspection and Testing of the Relation of the Piezoelectric Element Outline Shape and Support Body Outline Shape In Working Example 35, the combination of the piezoelectric element shape and support member outline shape is altered to investigate the relation with the acoustic characteristics. The piezoelectric actuator of the present working example that is shown in FIGS. 51A and 51B has a configuration in which the shapes of the support member, base, vibration film, and piezoelectric element are altered, the configuration otherwise being identical to Working Example 1 (see FIGS. 26A and 26B).

The actual configuration of each part is as follows:

Piezoelectric element 13: An upper electrode layer and a lower electrode layer, each having a thickness of 8 μm, were formed on respective surfaces of a piezoelectric plate having a circular shape with a diameter of a4 (mm) and a thickness of 50 μm (0.05 mm).

Base 23: Phosphor bronze was used in a circular shape having a diameter of a4+2 (mm) and a thickness of 30 μm (0.03 mm).

Vibration film 31c: A film was used made of urethane having a rectangular shape with external dimensions of a5+1 (mm)×20 (mm) and a thickness of 80 μm. (Refer to the Table for Details of Shapes)

Support member 46c: SUS 304 was used having a rectangular shape with external dimensions of a5+1 (mm)×20 (mm), internal dimensions of a5 (mm)×20 (mm) and a thickness of 1.5 mm.

The results of the fundamental resonant frequency F0 and the sound pressure levels when altering the outline shape of the piezoelectric element and support member are shown in Table 9 below:

TABLE 9

| No. | Piezoelectric element diameter a4 | Support member diameter a5 | b4/a5 | Fundamental resonant frequency (Hz) | Sound pressure level (1 kHz) | Sound pressure level (3 kHz) | Sound pressure level (5 kHz) | Sound pressure level (10 kHz) |
|---|---|---|---|---|---|---|---|---|
| 23-1 | 16 | 20 | 0.8 | 1020 | 89 | 85 | 89 | 91 |
| 23-2 | 14 | 20 | 0.7 | 950 | 87 | 84 | 93 | 90 |
| 23-3 | 12 | 20 | 0.6 | 910 | 88 | 84 | 88 | 86 |
| 23-4 | 10 | 20 | 0.5 | 810 | 86 | 84 | 85 | 90 |
| 23-5 | 8 | 20 | 0.4 | 780 | 79 | 77 | 81 | 79 |
| 23-6 | 6 | 20 | 0.3 | 730 | 76 | 75 | 75 | 79 |
| 23-7 | 4 | 20 | 0.2 | 680 | 69 | 70 | 69 | 79 |
| 23-8 | 12 | 15 | 0.8 | 975 | 86 | 85 | 97 | 91 |
| 23-9 | 10 | 15 | 0.67 | 910 | 85 | 88 | 87 | 86 |
| 23-10 | 8 | 15 | 0.53 | 870 | 83 | 84 | 88 | 90 |
| 23-11 | 6 | 15 | 0.4 | 780 | 79 | 76 | 85 | 79 |
| 23-12 | 4 | 15 | 0.27 | 620 | 67 | 65 | 76 | 75 |
| 23-13 | 8 | 10 | 0.8 | 1120 | 84 | 88 | 86 | 90 |
| 23-14 | 6 | 10 | 0.6 | 990 | 85 | 88 | 87 | 91 |
| 23-15 | 4 | 10 | 0.4 | 750 | 77 | 76 | 67 | 81 |

As can be seen from the results of Table 9, to achieve sound pressure levels of 80 dB or more in the 1-10 kHz band, the ratio a4/a5 of the piezoelectric element diameter a4 and the support member diameter a5 should be adjusted to 0.5 or more. In addition, the sound pressure levels in the range of 1 kHz-10 kHz become higher as a4/a5 approaches 1. In the piezoelectric actuator according to the present invention as described above, adjusting the outline shapes of the piezoelectric element and support member enables reproduction of high sound pressure over a broad frequency band and enables improvement of the acoustic characteristics even under conditions in which the external size and shape are limited.

Working Example 36

Inspection and Testing of Vibration Film Deflection Amount

As Working Example 36, the relation between the deflection amount of vibration film interposed part A and acoustic characteristics was inspected. In the following Working Examples 36a-36c, only the vibration film material, the length of vibration film interposed part A, and the vibration film thickness were altered and the relation between the deflection amount of the vibration film interposed part A and the movement figure was inspected.

Working Example 36a

Working Example 36a is a configuration in which only the vibration film material is altered, and otherwise is identical to Working Example 2, the evaluation conditions also being identical to Working Example 2.

The actual configuration of each part is as follows:
Piezoelectric element 11: Identical to Working Example 2
Base 21: Identical to Working Example 2
Vibration film 32: Altered to a material having a Young's modulus in the range of $4.0 \times 10^8$-$13.0 \times 10^{10}$ (N/m$^2$). The vibration film shape is identical to Working Example 2.
Support member 46: Identical to Working Example 2
The results of the relation between the deflection amount and the vibration figure when altering the vibration film material, the resonant frequency F0, and sound pressure levels are shown in Table 10 below.

Working Example 36b

Working Example 22b is a configuration in which the external dimensions of support body 46 and round base 21 were altered and in which the length of vibration film interposed part A was altered. The present working example has a configuration in which the length of the vibration interposed part was altered, and other than the configuration of base 21 and vibration 32, is identical to Working Example 2. The evaluation conditions are also identical to Working Example 2. As shown in FIG. 24, the distance X2 between the outer circumference of piezoelectric element 11 and the outer circumference of base 21 was adjusted, and the length of vibration film interposed part A was altered.

The actual configuration of each part is as follows:
Piezoelectric element 11: Identical to Working Example 2 (outer diameter=+16 mm)
Base 21: The outer diameter was altered such that vibration film interposed part A becomes 0.05 mm-2.0 mm.
Vibration film 31: The length of vibration film interposed part A was altered to 0.05 mm-2.0 mm.
Support member 46: Identical to Working Example 2
The results of the deflection amount and vibration figure, resonant frequency F0, and sound pressure levels when the length of vibration film interposed part A was altered are shown in Table 11.

Working Example 36c

In Working Example 36c, only the thickness of the vibration film was altered. In the present working example, only the thickness of the vibration film was altered, and configuration elements other than the vibration film are identical to Working Example 2. The evaluation conditions are also identical to Working Example 2.

The actual configuration of each part is as follows:

Piezoelectric element 11: Identical to Working Example 2 (outer diameter=+16 mm)

Base 21: Identical to Working Example 2

Vibration film 32: The thickness of the vibration film was altered such that the thickness was 5 μm-1 mm. Otherwise, identical to Working Example 2 (outer diameter=φ 21 mm)

Support member 46: Identical to Working Example 2

The results of the deflection amount and vibration figure, the resonant frequency f0, and the sound pressure levels when the vibration film thickness was altered are shown in Table 12.

shown in Nos. C-1-C-3 of the table should be used when configuring an actuator in which the resonant frequency is approximately 1 kHz (that includes 1001 Hz) or less with priority given to reproduction in the low sound area. (b) Alternatively, the conditions shown in No. C-1-C-7 in the table should be used when giving priority to sound pressure levels to configure an actuator of 80 dB or more. As described hereinabove, in the piezoelectric actuator according to the present invention, adjusting the deflection amount of the vibration film part enables adjustment of the movement figure

TABLE 10

| No. | Vibration film material | Young's Modulus of vibration film material (N/m$^2$) | Distance X2 (m) | Vibration film thickness (m) | Maximum deflection amount (m) | F0 (Hz) | Sound pressure level (dB) | Vibration figure |
| --- | --- | --- | --- | --- | --- | --- | --- | --- |
| C-1 | Urethane | $4 \times 10^8$ | 0.0015 | $8.0 \times 10^{-5}$ | 0.066 | 827 | 84 | Piston movement |
| C-2 | PET | $9.1 \times 10^8$ | 0.0015 | $8.0 \times 10^{-5}$ | 0.029 | 950 | 86 | Piston movement |
| C-3 | Polyethylene | $1 \times 10^9$ | 0.0015 | $8.0 \times 10^{-5}$ | 0.026 | 970 | 88 | Piston movement |
| C-4 | Polypropylene | $1.8 \times 10^9$ | 0.0015 | $8.0 \times 10^{-5}$ | 0.014 | 1025 | 84 | Piston movement |
| C-5 | Nylon | $2.5 \times 10^9$ | 0.0015 | $8.0 \times 10^{-5}$ | 0.011 | 1080 | 86 | Piston movement |
| C-6 | Polyester | $4.6 \times 10^9$ | 0.0015 | $8.0 \times 10^{-5}$ | 0.0057 | 1250 | 83 | Piston movement |
| C-7 | Lead (Pb) | $1.6 \times 10^{10}$ | 0.0015 | $8.0 \times 10^{-5}$ | 0.0016 | 1350 | 81 | Piston movement |
| C-8 | Magnesium alloy | $4.0 \times 10^{10}$ | 0.0015 | $8.0 \times 10^{-5}$ | 0.00064 | 1590 | 77 | Flexural movement |
| C-9 | Aluminum | $7.0 \times 10^{10}$ | 0.0015 | $8.0 \times 10^{-5}$ | 0.00034 | 1700 | 75 | Flexural movement |
| C-10 | Titanium | $11.6 \times 10^{10}$ | 0.0015 | $8.0 \times 10^{-5}$ | 0.00024 | 1750 | 72 | Flexural movement |
| C-11 | Phosphor bronze | $12.0 \times 10^{10}$ | 0.0015 | $8.0 \times 10^{-5}$ | 0.00022 | 1830 | 68 | Flexural movement |
| C-12 | Copper | $13.0 \times 10^{10}$ | 0.0015 | $8.0 \times 10^{-5}$ | 0.00020 | 1930 | 66 | Flexural movement |

As can be seen from Table 10, to achieve piston movement in the vibration figure of a piezoelectric actuator, the deflection amount of the vibration film component should be adjusted to 0.0016 or less. For example, (a) the conditions to the piston form and thus enables realization of good acoustic characteristics. Adjustment of the deflection amount further enables adjustment of the resonant frequency and sound pressure levels to desired values.

TABLE 11

| No. | Distance X2 (m) | Vibration film material | Vibration film thickness (m) | Maximum deflection amount δ (m) | F0 (Hz) | Sound pressure level (dB) | Vibration figure |
| --- | --- | --- | --- | --- | --- | --- | --- |
| D-1 | 0.00005 | Urethane | $8.0 \times 10^{-5}$ | 0.0000024 | 2700 | 57 | Flexural movement |
| D-2 | 0.0001 | Urethane | $8.0 \times 10^{-5}$ | 0.00002 | 2400 | 72 | Flexural movement |
| D-3 | 0.0005 | Urethane | $8.0 \times 10^{-5}$ | 0.0025 | 100 | 85 | Piston movement |
| D-4 | 0.001 | Urethane | $8.0 \times 10^{-5}$ | 0.022 | 950 | 87 | Piston movement |
| D-5 | 0.0015 | Urethane | $8.0 \times 10^{-5}$ | 0.066 | 820 | 85 | Piston movement |
| D-6 | 0.002 | Urethane | $8.0 \times 10^{-5}$ | 0.16 | 750 | 83 | Piston movement |

As can be seen from the results of Table 11, to achieve piston movement in the vibration figure of the piezoelectric actuator, the deflection amount of the vibration film part should be adjusted to 0.0025 or less. For example, (a) the conditions shown in Nos. D-5-D-6 in the Table should be used when configuring an actuator in which the resonant frequency is approximately 1 kHz (including 1001 Hz) or less with priority given to the reproduction of the low sound area. (b) Alternatively, the conditions shown in D-3-D-6 in the Table should be used when a piezoelectric actuator of 80 dB or more with priority given to sound pressure levels is to be configured.

TABLE 12

| No. | Vibration film thickness (m) | Vibration film material | Maximum deflection amount δ (m) | F0 (Hz) | Sound pressure level | Vibration figure |
|---|---|---|---|---|---|---|
| E-1 | $5 \times 10^{-6}$ | Urethane | 270 | 520 | 75 | Flexural movement |
| E-2 | $1 \times 10^{-5}$ | Urethane | 33.8 | 600 | 77 | Flexural movement |
| E-3 | $2 \times 10^{-5}$ | Urethane | 4.28 | 680 | 82 | Piston movement |
| E-4 | $3 \times 10^{-5}$ | Urethane | 1.25 | 750 | 82 | Piston movement |
| E-5 | $5 \times 10^{-5}$ | Urethane | 0.27 | 800 | 82 | Piston movement |
| E-6 | $8 \times 10^{-5}$ | Urethane | 0.066 | 820 | 84 | Piston movement |
| E-7 | $1 \times 10^{-4}$ | Urethane | 0.034 | 910 | 86 | Piston movement |
| E-8 | $1.5 \times 10^{-4}$ | Urethane | 0.001 | 1180 | 83 | Piston movement |
| E-9 | $2 \times 10^{-4}$ | Urethane | 0.0042 | 1440 | 82 | Piston movement |
| E-10 | $5 \times 10^{-4}$ | Urethane | 0.00027 | 1600 | 73 | Flexural movement |
| E-11 | $1 \times 10^{-3}$ | Urethane | 0.000034 | 2050 | 66 | Flexural movement |
| E-12 | $2 \times 10^{-3}$ | Urethane | 0.0000042 | 2230 | 54 | Flexural movement |

As can be seen from the results of Table 12, when an actuator in which the resonant frequency is approximately 1 kHz (including 1001 Hz) or less is to be configured with priority given to reproduction of low sound region, the conditions shown in Nos. E-3-E-7 in the table should be used. (b) Alternatively, when an actuator of 80 dB or more is to be configured with priority given to sound pressure levels, the conditions shown in E-3-B-9 in the table should be used.

Summarizing the results of the above Tables 11-13, by adjusting the deflection amount of the vibration film interposed part to a range of predetermined values 0.001-5, the vibration figure can be set to the piston form and good acoustic characteristics with high sound pressure levels can be obtained. In addition, the adjustment of the deflection amount enables adjustment of the resonant frequency. This control of the deflection amount by means of the vibration film thickness, the vibration film interposed length, and the vibration film material enables adjustment of resonant frequency and sound pressure characteristics and means that the acoustic design can be facilitated and that the utility value is high.

Working Example 37

Inspection and Testing of the Electrical Connection Method

The relation between the electrical connection method and acoustic characteristics was investigated as Working Example 37. In the following Working Examples 37a-37d, the method of electrically connecting the upper and lower electrode surfaces of the piezoelectric element was altered and the resulting influence on the sound pressure levels, reliability, and vibration interference was inspected.

Working Example 37a

Figure 52A:
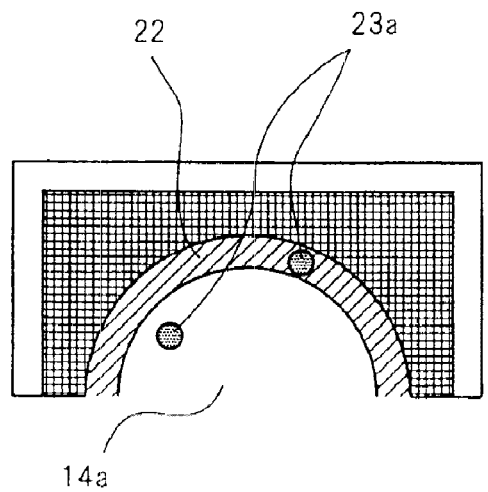
FIG. 52A is a top view showing the configuration of the piezoelectric actuator of Working Example 36.
Figure 52B:
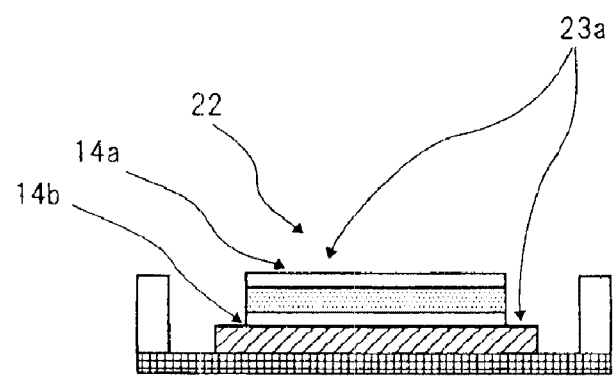
FIG. 52B is a vertical sectional view showing the configuration of the piezoelectric actuator of Working Example 36.

A piezoelectric actuator as shown in FIGS. 52A and 52B was fabricated as Working Example 37a. This piezoelectric actuator has a configuration in which electrical terminal lead lines 23a were used as the electrical connection method of Working Example 1. The configuration is otherwise identical to the piezoelectric actuator of Working Example 1. According to this configuration, electrical terminal lead line 23a is joined to piezoelectric element upper electrode 14a and the base (piezoelectric element lower electrode 14b and base (phosphor bronze) 21 are in electrical contact) by way of solder part 22 having diameter φ 0.5 mm and height 0.3 mm. In addition, copper-nickel lines covered by polyurethane were used for the electrical leads.

Results

| | |
|---|---|
| Fundamental resonant frequency: | 855 Hz |
| Maximum vibration speed amplitude: | 225 mm/s |
| Vibration speed ratio: | 0.84 |
| Vibration figure: | piston-type |
| Sound pressure level (1 kHz): | 83 dB |
| Sound pressure level (3 kHz): | 92 dB |
| Sound pressure level (5 kHz): | 97 dB |
| Sound pressure level (10 kHz): | 95 dB |
| Stability from shocks when dropped: | ◯ |

As is clear from the above results, the piezoelectric actuator of the present working example was proven to have a large vibration amplitude at the fundamental resonant frequency and high sound pressure levels in the range of 1-10 kHz and thus not to be adversely affected by vibration interference due to the electrical terminal lead lines.

Working Example 37b

Figure 53:
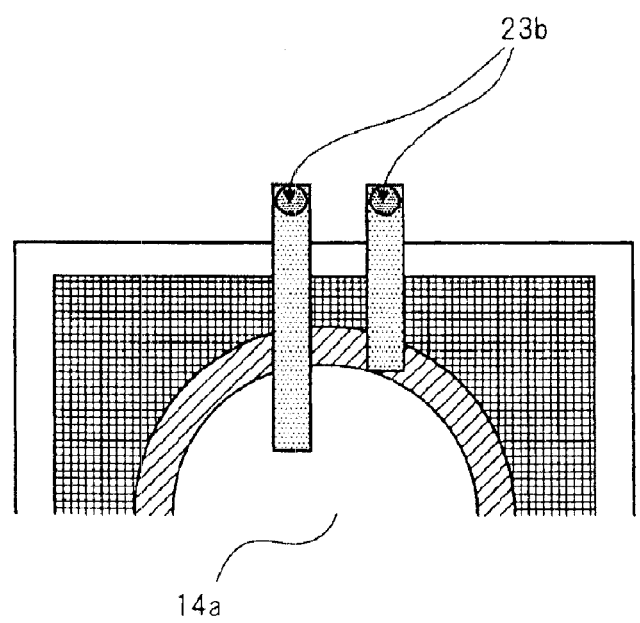
FIG. 53 is a top view showing the configuration of the piezoelectric actuator of Working Example 37b.

A piezoelectric actuator as shown in FIG. 53 was fabricated as Working Example 36b. This piezoelectric actuator has a configuration in which copper foil 23b was used as the electrical connection method of Working Example 1, copper foil having dimensions of 1 mm×3 mm and a thickness of 0.2 mm being joined to piezoelectric element upper electrode 14a and the base by way of an epoxy adhesive. The configuration is otherwise identical to the piezoelectric actuator of Working Example 1.

Results

| | |
|---|---|
| Fundamental resonant frequency: | 835 Hz |
| Maximum vibration speed amplitude: | 225 mm/s |
| Vibration speed ratio: | 0.83 |
| Vibration figure: | piston-type |
| Sound pressure level (1 kHz): | 84 dB |
| Sound pressure level (3 kHz): | 93 dB |
| Sound pressure level (5 kHz): | 96 dB |
| Sound pressure level (10 kHz): | 89 dB |
| Stability from shocks when dropped: | ○ |

As is clear from the results above, the piezoelectric actuator of the present working example was proven to have large vibration amplitude at the fundamental resonant frequency and high sound pressure levels in the range of 1-10 kHz, and is not adversely affected by vibration interference due to the copper foil.

Working Example 37c

Figure 54:
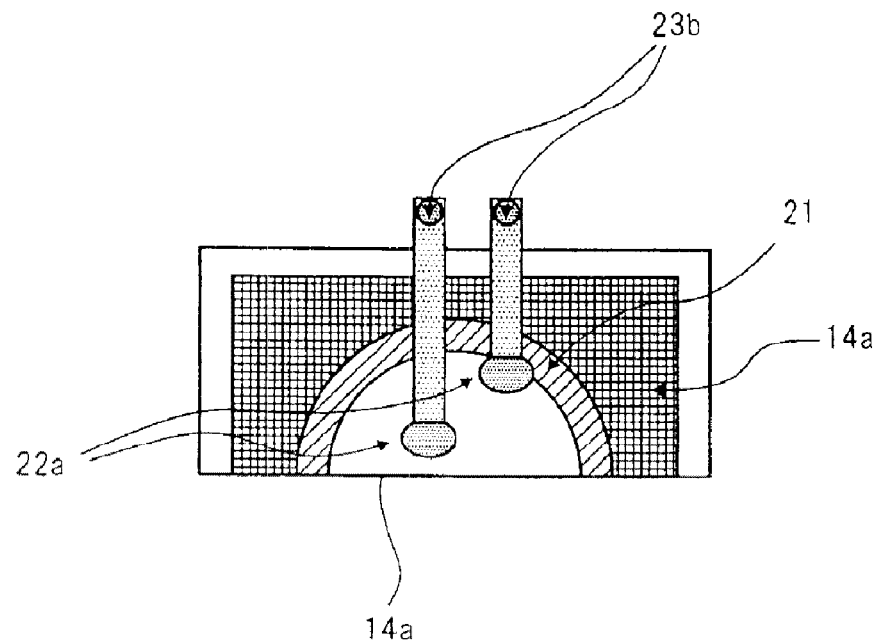
FIG. 54 is a top view showing the configuration of the piezoelectric actuator of Working Example 37c.

A piezoelectric actuator as shown in FIG. 54 was fabricated as Working Example 37c. This piezoelectric actuator uses a polyimide substrate as the electrical connection method of Working Example 1 and has a configuration in which polyimide substrate 23c having dimensions of 1 mm×3 mm and a thickness of 0.2 mm is joined to piezoelectric element upper electrode 14a and the base by way of solder part 22. An electrode pattern is formed by a plated film on this polyimide film. The configuration is otherwise identical to that of the piezoelectric actuator of Working Example 1.

Results

| | |
|---|---|
| Fundamental resonant frequency: | 845 Hz |
| Maximum vibration speed amplitude: | 245 mm/s |
| Vibration speed ratio: | 0.82 |
| Vibration figure: | piston-type |
| Sound pressure level (1 kHz): | 85 dB |
| Sound pressure level (3 kHz): | 94 dB |
| Sound pressure level (5 kHz): | 98 dB |
| Sound pressure level (10 kHz): | 95 dB |
| Stability from shocks when dropped: | ○ |

As is clear from the above results, the piezoelectric actuator of the present working example has a large vibration amplitude at the fundamental resonant frequency and high sound pressure levels at 1-10 kHz. The use of the polyimide substrate for electrical connection was shown to block vibration interference, and the actuator was shown to have high stability against falls.

Working Example 37d

Figure 55A:
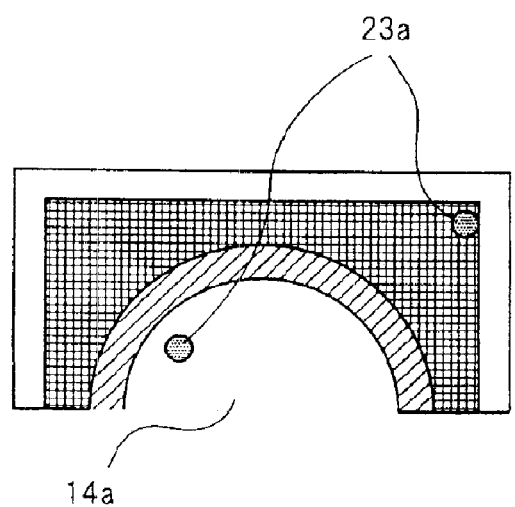
FIG. 55A is a top view showing the configuration of the piezoelectric actuator of Working Example 37d.
Figure 55B:
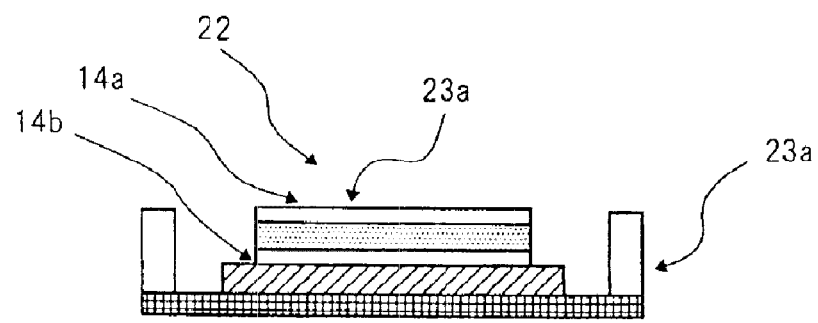
FIG. 55B is a vertical sectional view showing the configuration of the piezoelectric actuator of Working Example 37d.

A piezoelectric actuator as shown in FIGS. 55A and 55B was fabricated as Working Example 37b. This piezoelectric actuator uses a polyimide substrate for base 21 and vibration film 31 that is used in Working Example 1. This configuration features the formation of an electrode pattern on the polyimide substrate that is the base and vibration film, but otherwise is identical to the piezoelectric actuator of Working Example 1.

Results

| | |
|---|---|
| Fundamental resonant frequency: | 795 Hz |
| Maximum vibration speed amplitude: | 215 mm/s |
| Vibration speed ratio: | 0.82 |
| Vibration figure: | piston-type |
| Sound pressure level (1 kHz): | 82 dB |
| Sound pressure level (3 kHz): | 95 dB |
| Sound pressure level (5 kHz): | 97 dB |
| Sound pressure level (10 kHz): | 90 dB |
| Stability from shocks when dropped: | ○ |

As is clear from the above results, the piezoelectric actuator of the present working example has a large vibration amplitude at the fundamental resonant frequency and high sound pressure levels at 1-10 kHz. In addition, it was shown that the monolithic construction by which the base and vibration film are formed by the polyimide substrate raises the stability against falls, and further, the formation of the electrode pattern within the substrate facilitates electrical connections.

SUMMARY

The piezoelectric actuators of Working Examples 1-26 exhibit frequency characteristics that approach the frequency characteristics of Comparative Example 3 (electromagnetic actuator) and feature high sound pressure levels over a broad frequency band of 1-10 kHz. On the other hand, in the piezoelectric actuator of the related art of Comparative Example 4, the graph of frequency characteristics revealed severe unevenness. On this point as well, the present invention was proven to improve the frequency characteristics of an acoustic element. In particular, the resonant frequency f0 in all of the working examples was shown to be lower than the resonant frequency f0 of the comparative examples, whereby the frequency band of an acoustic element according to the present invention is broadened. In addition, Working Examples 27, 28, and 29 that were incorporated in a portable telephone achieved a lower resonant frequency and an improvement in the sound pressure levels over Comparative Example 4.

What is claimed is:
1. A piezoelectric actuator comprising:
   a piezoelectric element that performs an expansion and contraction movement in accordance with the state of an electrical field,
   a base having said piezoelectric element adhered to at least one surface thereof, and
   a support member that supports said piezoelectric element and said base;
   wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element, wherein, when a1 is the length in the minor-axis direction and b1 is the length in the major-axis direction in the outline shape of said piezoelectric element, a1/b1 is in the range from 0.6 to 1.

2. A piezoelectric actuator comprising:
a piezoelectric element that performs an expansion and contraction movement in accordance with the state of an electrical field,
a base having said piezoelectric element adhered to at least one surface thereof, and
a support member that supports said piezoelectric element and said base;
wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element,
wherein, when a2 is the length of the short sides and b2 is the length of the long sides of the inside dimensions of said support member, a2/b2 is within the range from 0.5 to 1.0.

3. A piezoelectric actuator comprising:
a piezoelectric element that performs an expansion and contraction movement in accordance with the state of an electrical field,
a base having said piezoelectric element adhered to at least one surface thereof, and
a support member that supports said piezoelectric element and said base;
wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element,
wherein, on the outer circumference of said base, a plurality of beams are formed, said beams extending toward the outside within a plane that is parallel to the surface on which said piezoelectric element is adhered to said base.

4. The piezoelectric actuator according to claim 3, wherein said plurality of beams are arranged with equal spacing between said beams.

5. A piezoelectric actuator comprising;
a piezoelectric element that performs an expansion and contraction movement in accordance with the state of an electrical field,
a base having said piezoelectric element adhered to at least one surface thereof, and
a support member that supports said piezoelectric element and said base;
wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element,
wherein a curved portion, in which said vibration film is curved three-dimensionally in the direction of thickness, is formed around the circumference of the area of said vibration film in which said base is arranged.

6. A piezoelectric actuator comprising:
a piezoelectric element that performs an expansion and contraction movement in accordance with the state of an electrical field,
a base having said piezoelectric element adhered to at least one surface thereof, and
a support member that supports said piezoelectric element and said base;
wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element,
wherein the piezoelectric actuator further comprises a piezoelectric element separate from said piezoelectric element that forms a bimorph element.

7. A piezoelectric actuator comprising:
a piezoelectric element that performs an expansion and contraction movement in accordance with the state of an electrical field,
a base having said piezoelectric element adhered to at least one surface thereof, and
a support member that supports said piezoelectric element and said base;
wherein said base is connected to said support member by way of a vibration film, the outline shapes of said piezoelectric element and said support member differ from each other in that said piezoelectric element has a different size than said support member and that said piezoelectric element has a different shape than said support member, and said piezoelectric element and said base vibrate in the direction of thickness of said piezoelectric element in accordance with said movement of said piezoelectric element,
wherein said piezoelectric element has a laminated construction in which layers of piezoelectric material and electrode layers are stacked alternately.

* * * * *